(12) United States Patent
Yamazaki et al.

(10) Patent No.: US 10,503,040 B2
(45) Date of Patent: Dec. 10, 2019

(54) DISPLAY DEVICE, INPUT/OUTPUT DEVICE, AND SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/658,447

(22) Filed: Jul. 25, 2017

(65) Prior Publication Data

US 2018/0031943 A1 Feb. 1, 2018

(30) Foreign Application Priority Data

Jul. 29, 2016 (JP) ................................. 2016-149291

(51) Int. Cl.
*G02F 1/167* (2019.01)
*G02F 1/1335* (2006.01)
(Continued)

(52) U.S. Cl.
CPC ............ *G02F 1/167* (2013.01); *G02B 26/04* (2013.01); *G02F 1/1333* (2013.01);
(Continued)

(58) Field of Classification Search
CPC .. G02F 1/167; G02F 1/133553; G02F 1/1333; G02F 1/133514; G02F 2203/02;
(Continued)

(56) References Cited

U.S. PATENT DOCUMENTS 6,774,884 B2 8/2004 Shimoda et al.
6,882,461 B1 * 4/2005 Tsai ..................... G02B 26/001
359/290
(Continued)

FOREIGN PATENT DOCUMENTS

CN 001534367 A 10/2004
CN 101128765 A 2/2008
(Continued)

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Andrew Sasinowski
(74) *Attorney, Agent, or Firm* — Nixon Peabody LLP; Jeffrey L. Costellia

(57) ABSTRACT

A display device with high visibility or low power consumption is provided. The display device includes a pixel. The pixel includes a self-luminous display element and a reflective display element. The self-luminous display element is provided closer to the display surface than the reflective display element. The reflective display element includes a unit for adjusting the amount of light which changes its arrangement on the basis of electric power supplied from an electrode and blocks light with the unit for adjusting the amount of light to change the intensity of reflected light. Electrophoretic particles, a shutter, a film which reflects part of light, a film which reflects light, or the like can be used as the unit for adjusting the amount of light.

25 Claims, 33 Drawing Sheets

(51) Int. Cl.
*H01L 27/32* (2006.01)
*G02B 26/04* (2006.01)
*G02F 1/1333* (2006.01)
*G02F 1/1681* (2019.01)
*G02F 1/1675* (2019.01)

(52) U.S. Cl.
CPC .. *G02F 1/133514* (2013.01); *G02F 1/133553* (2013.01); *G02F 1/1681* (2019.01); *G02F 2001/1678* (2013.01); *G02F 2201/44* (2013.01); *G02F 2203/02* (2013.01); *H01L 27/3232* (2013.01)

(58) Field of Classification Search
CPC ..... G02F 2001/1678; G02F 2001/1672; G02F 2201/44; H01L 27/3232; G02B 26/04
See application file for complete search history.

(56) References Cited

U.S. PATENT DOCUMENTS

| | | | |
|---|---|---|---|
| 8,730,561 B2 * | 5/2014 | Kim | G02F 1/167 359/296 |
| 8,866,233 B2 | 10/2014 | Yamazaki | |
| 8,902,205 B2 | 12/2014 | Miyazawa et al. | |
| 9,235,047 B2 | 1/2016 | Miyamoto et al. | |
| 2002/0145687 A1 | 10/2002 | Mitsui et al. | |
| 2003/0034950 A1 | 2/2003 | Liang et al. | |
| 2004/0252076 A1 | 12/2004 | Kodama | |
| 2006/0187190 A1 * | 8/2006 | Hagood | G02B 26/04 345/109 |
| 2007/0096300 A1 | 5/2007 | Wang et al. | |
| 2007/0279378 A1 * | 12/2007 | Takeuchi | B82Y 20/00 345/107 |
| 2011/0043435 A1 | 2/2011 | Hebenstreit et al. | |
| 2012/0236391 A1 * | 9/2012 | Miyamoto | G02F 1/167 359/296 |
| 2013/0314633 A1 | 11/2013 | Koo et al. | |
| 2015/0146273 A1 * | 5/2015 | Whitehead | G02F 1/167 359/222.1 |
| 2015/0356930 A1 | 12/2015 | Kuranaga et al. | |
| 2016/0014880 A1 * | 1/2016 | Lee | H05K 1/028 361/752 |

FOREIGN PATENT DOCUMENTS

| | | |
|---|---|---|
| CN | 101305308 A | 11/2008 |
| EP | 1423750 A | 6/2004 |
| EP | 1859310 A | 11/2007 |
| EP | 1941316 A | 7/2008 |
| EP | 2467844 A | 6/2012 |
| JP | 2002-169190 A | 6/2002 |
| JP | 2002-328630 A | 11/2002 |
| JP | 2004-302321 A | 10/2004 |
| JP | 2005-500571 | 1/2005 |
| JP | 2005-234515 A | 9/2005 |
| JP | 2006-276089 A | 10/2006 |
| JP | 2008-197668 A | 8/2008 |
| JP | 2009-513372 | 4/2009 |
| JP | 2011-166130 A | 8/2011 |
| JP | 2013-502616 | 1/2013 |
| JP | 2013-254162 A | 12/2013 |
| JP | 2014-142405 A | 8/2014 |
| JP | 2014-522509 | 9/2014 |
| JP | 2014-523659 | 9/2014 |
| KR | 2004-0036719 A | 4/2004 |
| KR | 2005-0082410 A | 8/2005 |
| KR | 2008-0037072 A | 4/2008 |
| KR | 2008-0072872 A | 8/2008 |
| KR | 2012-0043004 A | 5/2012 |
| KR | 2013-0130610 A | 12/2013 |
| TW | 550529 | 9/2003 |
| TW | 200421909 | 10/2004 |
| TW | 200528388 | 9/2005 |
| TW | 200720183 | 6/2007 |
| WO | WO-2003/016993 | 2/2003 |
| WO | WO-2006/091738 | 8/2006 |
| WO | WO-2007/053308 | 5/2007 |
| WO | WO-2011/022546 | 2/2011 |
| WO | WO-2013/115043 | 8/2013 |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

International Search Report (Application No. PCT/IB2017/052784) dated Aug. 1, 2017.

Written Opinion (Application No. PCT/IB2017/052784) dated Aug. 1, 2017.

* cited by examiner

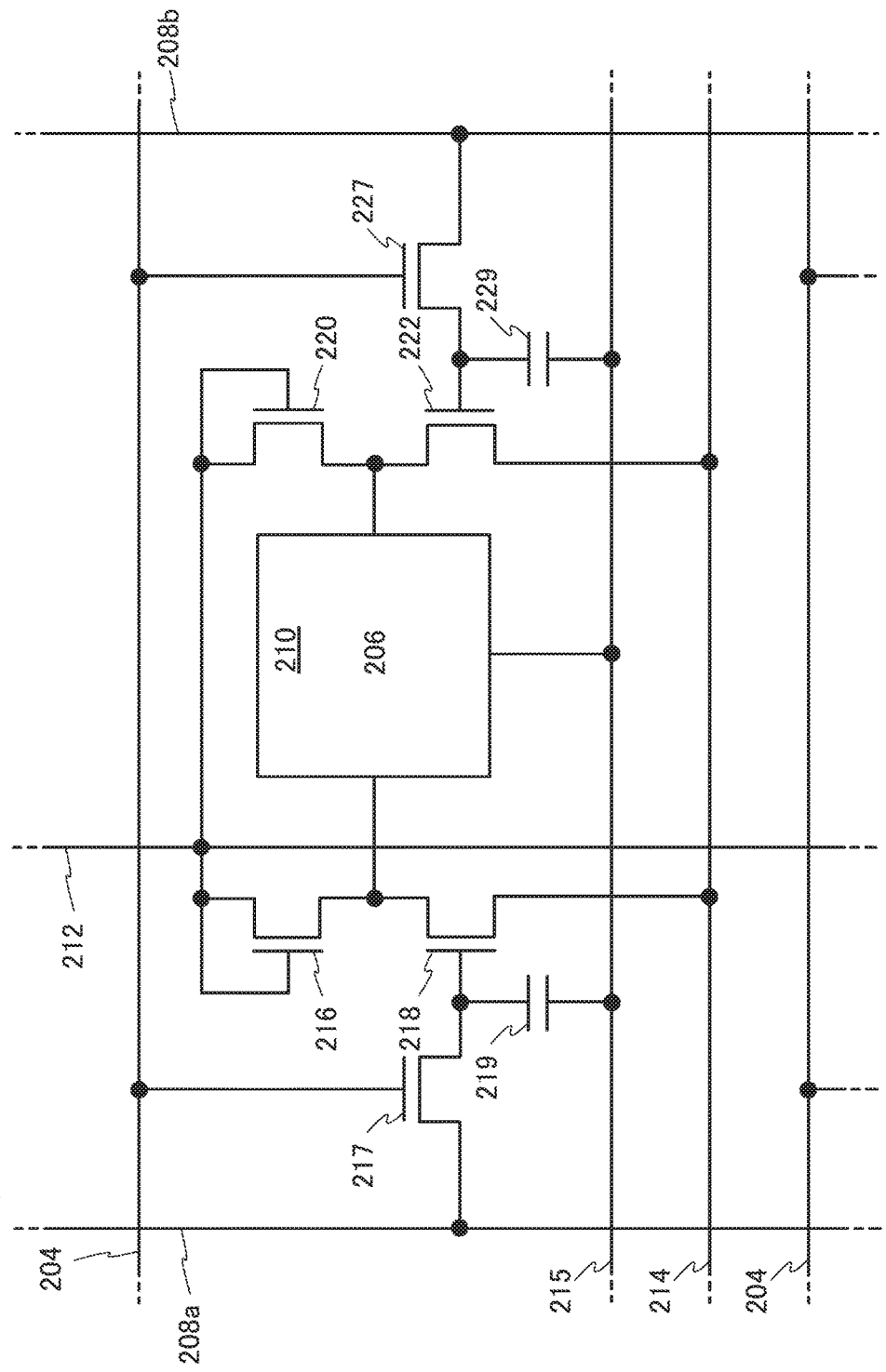

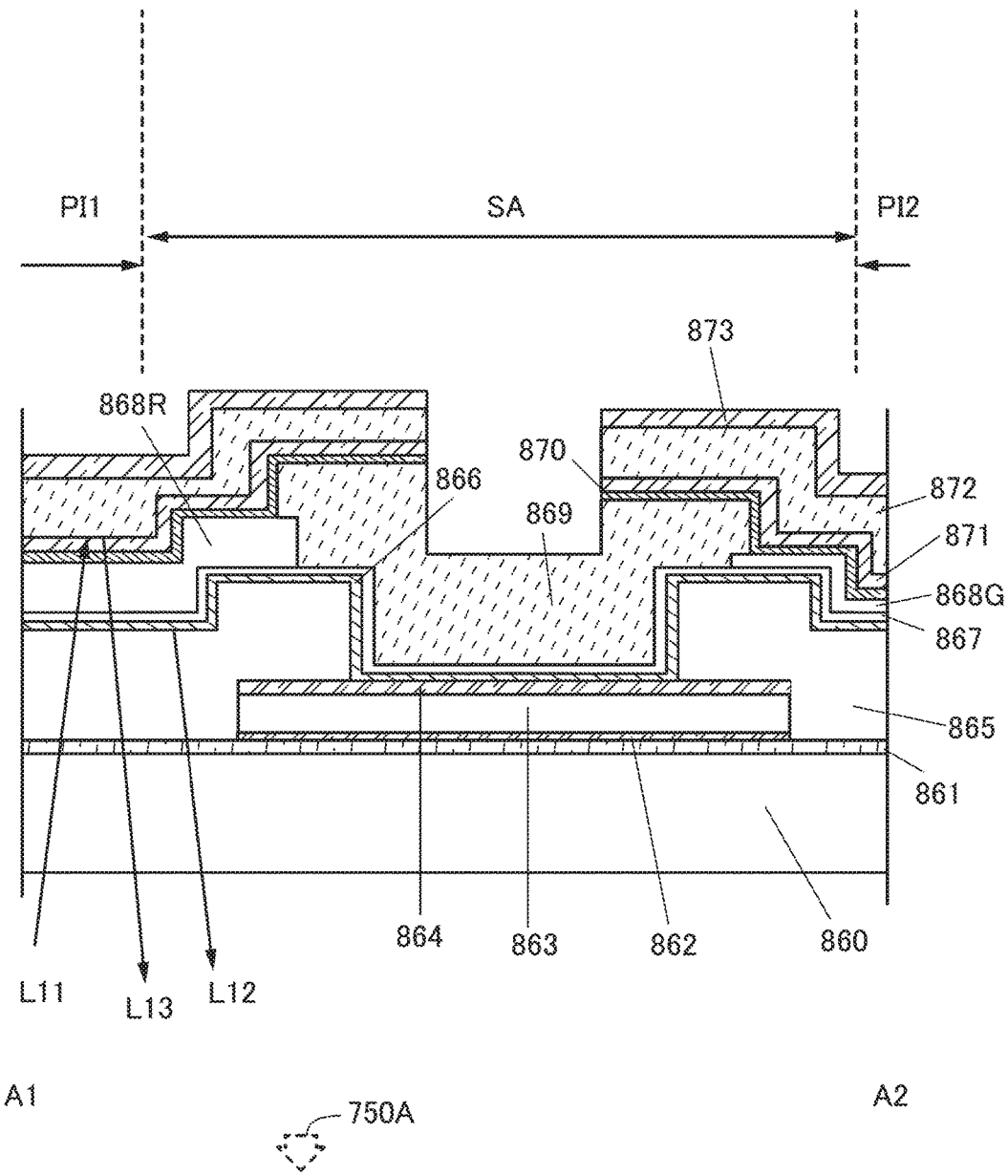

DISPLAY DEVICE, INPUT/OUTPUT DEVICE, AND SEMICONDUCTOR DEVICE

TECHNICAL FIELD

The present invention relates to an object, a method, or a manufacturing method. The present invention relates to a process, a machine, manufacture, or a composition of matter. In particular, one embodiment of the present invention relates to a display device, an input/output device, a semiconductor device, a light-emitting device, an electronic device, a lighting device, a driving method thereof, or a manufacturing method thereof. In particular, one embodiment of the present invention relates to a display device (display panel). One embodiment of the present invention relates to an input/output device, a semiconductor device, an electronic device, a light-emitting device, or a lighting device that includes a display device, or a manufacturing method thereof.

In this specification and the like, a semiconductor device generally means a device that can function by utilizing semiconductor characteristics. A transistor, a semiconductor circuit, an arithmetic device, a memory device, and the like are each an embodiment of a semiconductor device. In addition, a light-emitting device, a display device, an electronic device, and a lighting device may each include a semiconductor device.

BACKGROUND ART

In recent years, as one of display devices capable of being driven at low power, electronic paper has attracted attention. The electronic paper has the advantage that it consumes low power and it can hold images even after being turned off; therefore, it has been expected to be applied to e-book readers or posters.

Various kinds of electronic paper using various methods have been proposed. Like liquid crystal display devices and the like, active matrix electronic paper including a transistor as a switching element of a pixel has been proposed (for example, see Patent Document 1).

In addition, display devices including display elements using micro electro mechanical systems (MEMS) have been developed. Patent Documents 2 to 4 each disclose a pixel circuit including a display element using MEMS.

REFERENCE

Patent Document

[Patent Document 1] Japanese Published Patent Application No. 2002-169190
[Patent Document 2] Japanese Published Patent Application No. 2014-142405
[Patent Document 3] Japanese Translation of PCT International Application No. 2014-522509
[Patent Document 4] Japanese Translation of PCT International Application No. 2014-523659

The power consumption of display devices using electronic paper or MEMS can be low, when the light environment is bright. Meanwhile, when the light environment is dark, display devices including high-contrast organic EL elements may have higher visibility than the display devices using electronic paper or MEMS. In the case where organic EL elements are used, a decrease in power consumption of display devices is required particularly in devices using batteries as power sources, because the display devices consume a significant amount of power.

Portable electronic devices need to include display devices whose power consumption is low and which can perform display with high visibility, regardless of whether they are used indoors or outdoors.

An object of one embodiment of the present invention is to provide a display device with high visibility. Another object is to provide a display device capable of a variety of display. Another object is to provide a display device with low power consumption. Another object is to provide a novel display device. Another object is to provide a semiconductor device including the display device (display panel). Another object is to provide a novel semiconductor device.

Note that the description of these objects does not disturb the existence of other objects. In one embodiment of the present invention, there is no need to achieve all the objects. Objects other than the above objects will be apparent from and can be derived from the description of the specification and the like.

A display device of one embodiment of the present invention includes a pixel. The pixel includes a self-luminous display element and a reflective display element. The self-luminous display element is provided closer to the display surface than the reflective display element. The reflective display element includes a unit for adjusting the amount of light which changes its arrangement on the basis of power supplied from an electrode. The reflective display element blocks light with the unit for adjusting the amount of light and thus changes the intensity of reflected light.

It is preferable that the above structure include electrophoretic particles which are used as the unit for adjusting the amount of light and the electrophoretic particles be included in a microcapsule.

In the above structures, it is preferable that the display device include a plurality of pixels and the plurality of pixels include a first pixel, a second pixel, and a third pixel. It is preferable that the first pixel include an electrophoretic particle colored in a first color, the second pixel include an electrophoretic particle colored in a second color, the third pixel include an electrophoretic particle colored in a third color, the electrophoretic particle colored in the second color have a color different from a color of the electrophoretic particle colored in the first color, and the electrophoretic particle colored in the third color have a color different from the color of the electrophoretic particle colored in the first color and the color of the electrophoretic particle colored in the second color.

In the above structure, it is preferable that the first pixel include a solution colored in a first color, the second pixel include a solution colored in a second color, the third pixel include a solution colored in a third color, the solution colored in the second color have a color different from a color of the solution colored in the first color, and the solution colored in the third color have a color different from the color of the solution colored in the first color and the color of the solution colored in the second color.

It is preferable that the above structure include a semi-transmissive layer and a light-reflective layer which are used as the unit for adjusting the amount of light, the distance between the semi-transmissive layer and the light-reflective layer be changed by an electrical or magnetic effect, and the semi-transmissive layer include a region between the light-reflective layer and the self-luminous display element.

In the above structures, it is preferable that the self-luminous display element transmit visible light and the reflective display element reflect light that has passed through the self-luminous display element.

It is preferable that the above structure include a shutter which is used as the unit for adjusting the amount of light. It is preferable that the above structure include a light-reflective layer, the self-luminous display element transmit visible light, and the light-reflective layer reflect light that has passed through the self-luminous display element.

It is preferable that each of the above structures include at least one coloring film. It is preferable that the coloring film include at least a region between the reflective display element and the self-luminous display element. Alternatively, it is preferable that the self-luminous display element include at least a region between the coloring film and the reflective display element.

In the display device having any of the above structures, an image displayed by the self-luminous display element and an image displayed by the reflective display element can both be perceived.

The self-luminous display element and the reflective display element overlap with each other in the thickness direction. In this structure, display is performed by the reflective display element in an environment where external light illuminance is high, whereas display is performed by the self-luminous display element in an environment where external light illuminance is low. Accordingly, a variety of display can be performed, and an improvement in visibility and a decrease in power consumption can be achieved. Electronic paper which is one of reflective display elements can reflect light but, to transmit light, encounters a difficulty owing to a limitation in layout, for example, as in the case of optical interference type MEMS display elements.

In the display device of one embodiment of the present invention, the reflective display element is formed in a lower layer, and the self-luminous display element, such as an organic EL element, is formed in an upper layer, thereby achieving an improvement in visibility and a decrease in power consumption. Here, the reflective display element includes electrophoretic particles or MEMS.

A semiconductor device of one embodiment of the present invention includes at least one of a keyboard, a hardware button, a pointing device, a touch sensor, an illuminance sensor, an imaging device, an audio input device, a viewpoint input device, and a pose detection device, and the display device having any of the above structures.

A display device with high visibility can be provided. A display device capable of a variety of display can be provided. A display device with low power consumption can be provided. A novel display device can be provided. A semiconductor device including the display device (display panel) can be provided. A novel semiconductor device can be provided.

BRIEF DESCRIPTION OF DRAWINGS

FIG. 26 illustrates a control circuit including a light-blocking unit of an embodiment.

FIG. 28 is a cross-sectional view illustrating an optical interference type MEMS display element of an embodiment.

BEST MODE FOR CARRYING OUT THE INVENTION

Figure 1A:
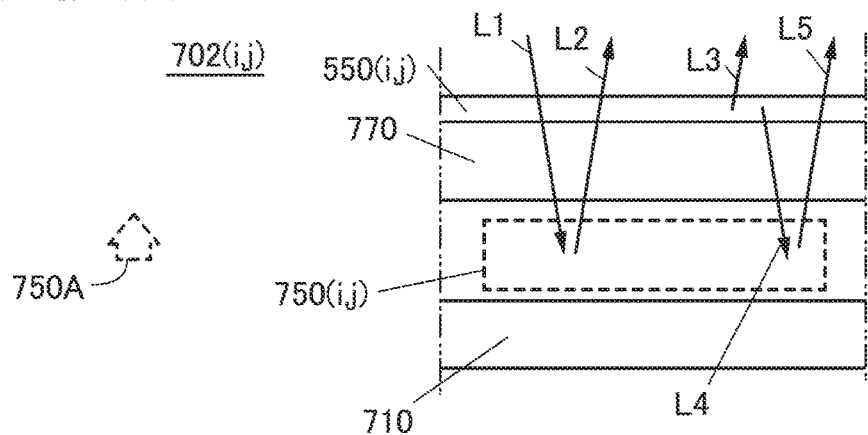
FIGS. 1A to 1C are each a simplified diagram illustrating a pixel of a display device of one embodiment of the present invention.

Embodiments will be described in detail with reference to the drawings. Note that embodiments of the present invention are not limited to the following description, and it will be readily appreciated by those skilled in the art that modes and details thereof can be modified in various ways without departing from the spirit and the scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated. In addition, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers, such as "first" and "second", are used in order to avoid confusion among components and do not limit the number of the components.

Embodiment 1

In this embodiment, a display device of one embodiment of the present invention will be described with reference to FIGS. 1A to 1C.

The display device of one embodiment of the present invention includes a display panel. The display device of one embodiment of the present invention includes two or more substrates. The display panel described in this embodiment includes a pixel 702(i, j). Note that i and j are each an independent variable and an integer greater than or equal to 1. FIG. 1A is a simplified diagram illustrating the structure and a light path of the pixel 702(i, j) of the display device of one embodiment of the present invention.

The pixel 702(i, j) includes a first display element 750(i, j) that is a reflective display element. The first display element 750(i, j) includes electrophoretic particles or a MEMS element.

The first display element 750(i, j) of one embodiment of the present invention, which is a reflective display element, blocks light with a unit for adjusting the amount of light to change the intensity of reflected light; the unit changes its arrangement by electric power supplied from an electrode. Examples of the unit for adjusting the amount of light include electrophoretic particles, a shutter, a film which reflects part of light, and a film which reflects light. In contrast, a reflective display device including a liquid crystal material controls the polarization of light with the liquid crystal material whose orientation is changed by electric power supplied from an electrode and blocks light having a particular polarization component with a polarization plate fixed in the display device, thereby changing the intensity of reflected light.

In the case where a reflective display element is provided with a polarization plate, the transmittance of the polarization plate with respect to light that does not have a particular polarization component is low, so that display gets dark. Since the first display element 750(i, j) in the display device of one embodiment of the present invention does not include a layer containing liquid crystal, a polarization plate is not necessarily provided in the display device.

Electrophoretic particles of one embodiment of the present invention can migrate by an electric field in a layer including electrophoretic particles. That is, the electrophoretic particles are charged particles, and a charged object can be used as the electrophoretic particles. When the first display element 750(i, j) of one embodiment of the present invention includes a layer including electrophoretic particles, the particles in the layer including electrophoretic particles can migrate by an electric field.

The pixel 702(i, j) further includes a second display element 550(i, j) that is a self-luminous display element. The second display element 550(i, j) transmits visible light. The second display element 550(i, j) is positioned closer to the display surface than the first display element 750(i, j).

The pixel 702(i, j) may further include a coloring film CF. However, in the case where the second display element 550(i, j) can perform color display and light from the second display element 550(i, j) is reflected by the first display element 750(i, j), color display can also be performed without the coloring film CF.

An example of light perceived as an image on the display surface of the display device of one embodiment of the present invention is light L2 obtained in such a manner that light L1 that is external light is selectively reflected by the first display element 750(i, j) in the direction indicated by an arrow 750A.

Another example of light perceived as an image on the display surface of the display device of one embodiment of the present invention is light L3 that is emitted from the second display element 550(i, j) in the direction indicated by the arrow 750A.

Another example of light perceived as an image on the display surface of the display device of one embodiment of the present invention is light L5 obtained in such a manner that light L4 that is emitted from the second display element 550(i, j) is reflected by the first display element 750(i, j) in the direction indicated by the arrow 750A.

In the structure illustrated in FIG. 1A, the light L3 can be perceived without through the first display element 750(i, j). That is, the loss of luminance is reduced and the visibility is improved at the time of display.

In the structure illustrated in FIG. 1A, the first display element 750(i, j) is formed between a substrate 710 and a substrate 770.

Figure 1B:
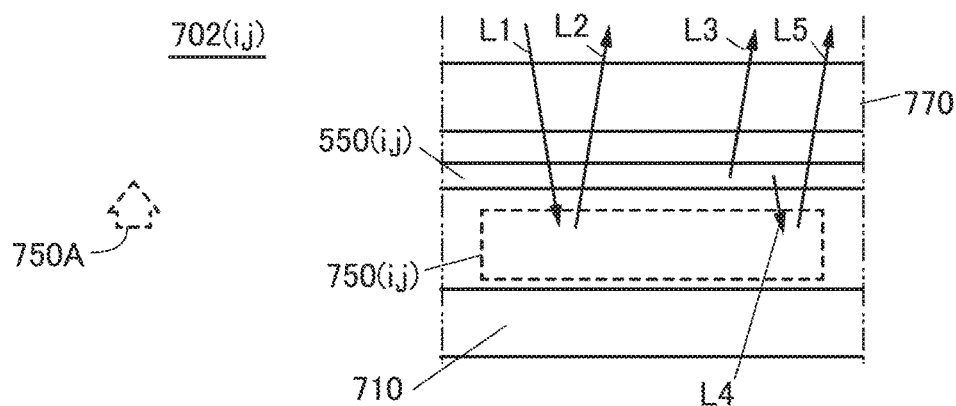

As illustrated in FIG. 1B, the first display element 750(i, j) and the second display element 550(i, j) may be provided between the substrate 710 and the substrate 770. In that case, parallax at the time of display between the light L2, the light L3, and the light L5 can be reduced.

Figure 1C:
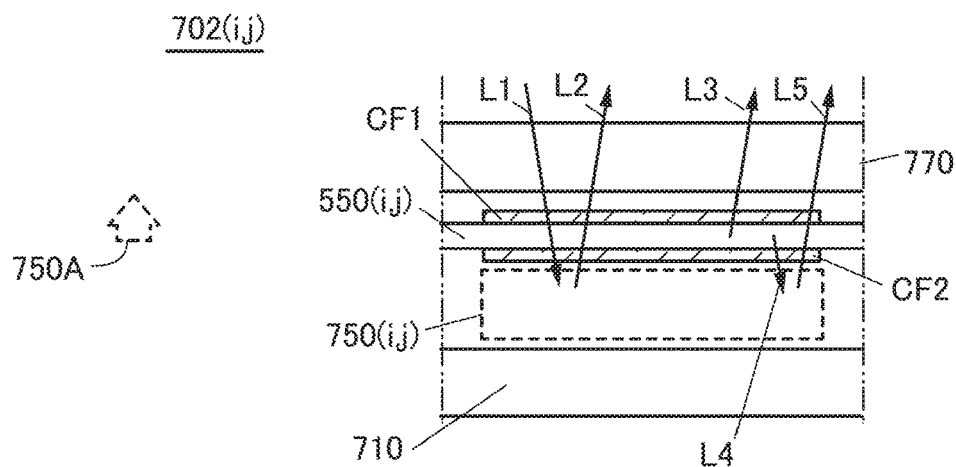

Alternatively, a coloring film may be provided as illustrated in FIG. 1C. In that case, at least one of a coloring film CF1 and a coloring film CF2 is provided. In addition, color display can also be performed by using the light L3 and the light L4 which are emitted from the second display element 550(i, j) as white light. By providing a plurality of coloring films, the color purity of desired light can be improved.

The features of the structures illustrated in FIGS. 1A to 1C can be combined as appropriate.

Figure 2A:
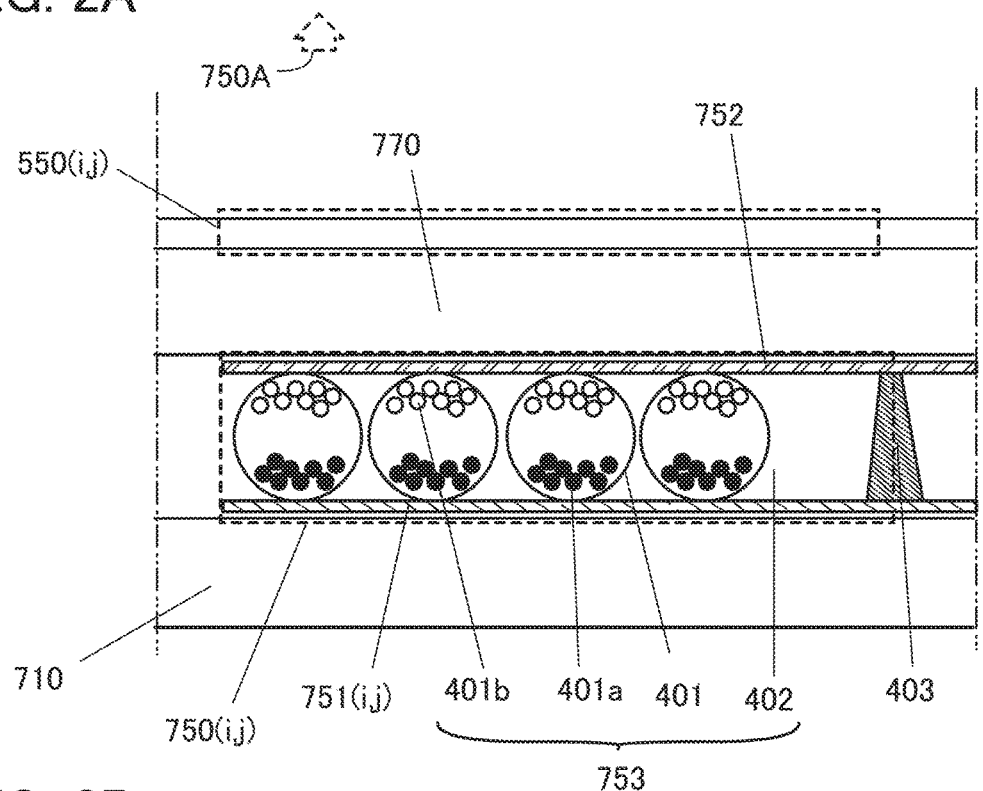
FIGS. 2A and 2B are each a simplified diagram illustrating a pixel of a display device of one embodiment of the present invention.
Figure 2B:
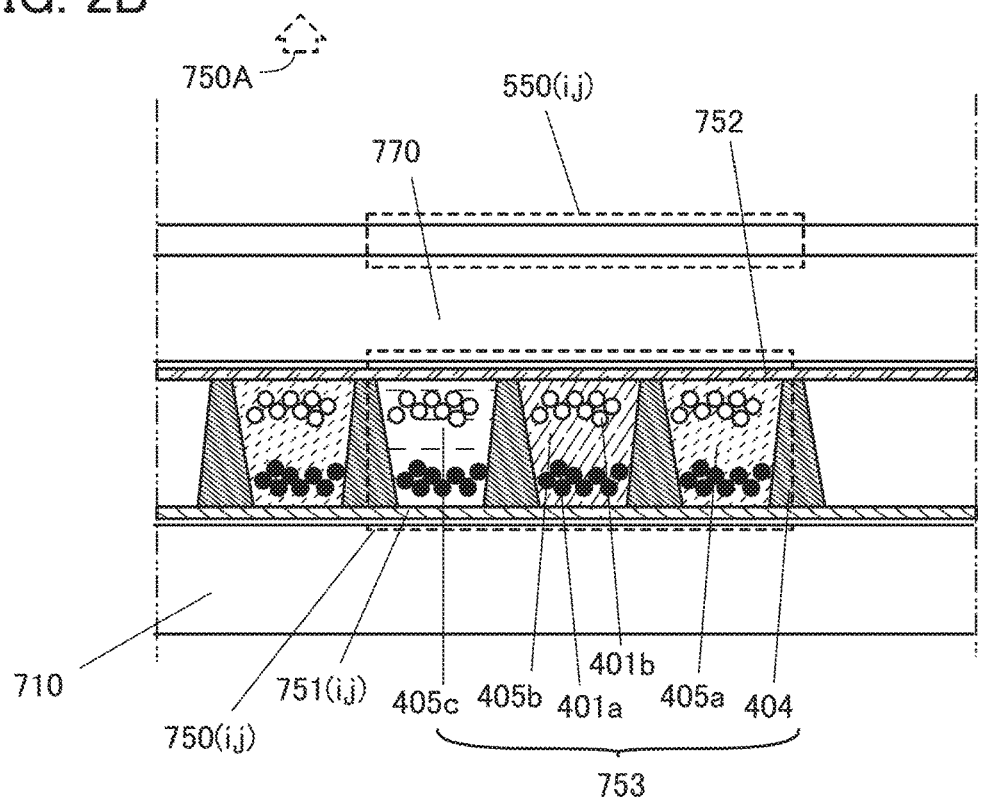

Examples of the display device of one embodiment of the present invention, which has the structure illustrated in FIG. 1A, are illustrated in FIGS. 2A and 2B. FIGS. 2A and 2B are each a simplified diagram of a structure body including the pixel 702(i, j).

The structure body illustrated in FIG. 2A includes a first electrode 751(i, j) and a second electrode 752. The first display element 750(i, j) includes a layer 753 including electrophoretic particles. The layer 753 including electrophoretic particles includes microcapsules 401 and a binder 402. The microcapsules 401 further include positively-charged particles 401a colored in one color and negatively-charged particles 401b colored in another color. Electrophoretic particles can be used as the particles 401a and the particles 401b. In addition, a partition layer 403 is provided. Such a display element including electrophoretic particles does not need electric power to hold images, that is, it has a so-called memory effect, and the display element needs only low electric power even in rewriting images.

For example, the particles 401a may be colored in black, and the particles 401b may be colored in a color corresponding to the pixel. In that case, the display device of one embodiment of the present invention can perform color display even when the first display element 750(i, j) does not include a coloring film. For example, the particles 401b colored in three kinds of colors, red, green, and blue, are provided in different pixels; in this way, color display can be performed. The particles 401b may also be colored in other three kinds of colors, yellow, magenta, and cyan.

In the structure body illustrated in FIG. 2B, the first display element 750(i, j) includes charged high polymer fine particles instead of the microcapsules, for example. In that case, positively-charged high polymer fine particles colored in one color and negatively-charged high polymer fine particles colored in another color may be provided between the first electrode 751(i, j) and the second electrode 752.

In addition, it is possible to use microcapsules including positively-charged particles colored in one color and negatively-charged particles colored in another color. In that case, the display device of one embodiment of the present invention can perform color display without using a color filter layer.

In the case of using a microcup as illustrated in FIG. 2B, partition layers 404 may be provided, and a solution 405a, a solution 405b, and a solution 405c having different colors from each other and the particles 401a and 401b may be provided between the partition layers 404. For example, the solution 405a, the solution 405b, and the solution 405c are colored in three kinds of colors, red, green, and blue, respectively, thereby performing color display. The solution 405a, the solution 405b, and the solution 405c may also be colored in other three kinds of colors, yellow, magenta, and cyan.

In each of the structure bodies illustrated in FIGS. 2A and 2B, the second display element 550(i, j) is provided over the substrate 770. The second display element 550(i, j) can be formed by including a layer containing a light-emitting organic compound, which will be described later.

In each of the above-described structure bodies, it possible to control an electric field applied to the layer 753 including electrophoretic particles and thus to control the arrangement of the electrophoretic particles in the layer 753 including electrophoretic particles. By controlling the arrangement of the electrophoretic particles, the display device of one embodiment of the present invention can perform display.

The structure described in this embodiment can be combined with any of the other embodiments as appropriate.

Embodiment 2

In this embodiment, the structure of a display device in which a reflective display element is formed over a substrate will be described. Specifically, the following structure will be described: a reflective display element is formed over a substrate so that light is reflected in the direction of a plane on which a self-luminous display element is formed and the self-luminous display element is formed over the reflective display element.

Structure Example 1 of Display Device

Figure 3A:
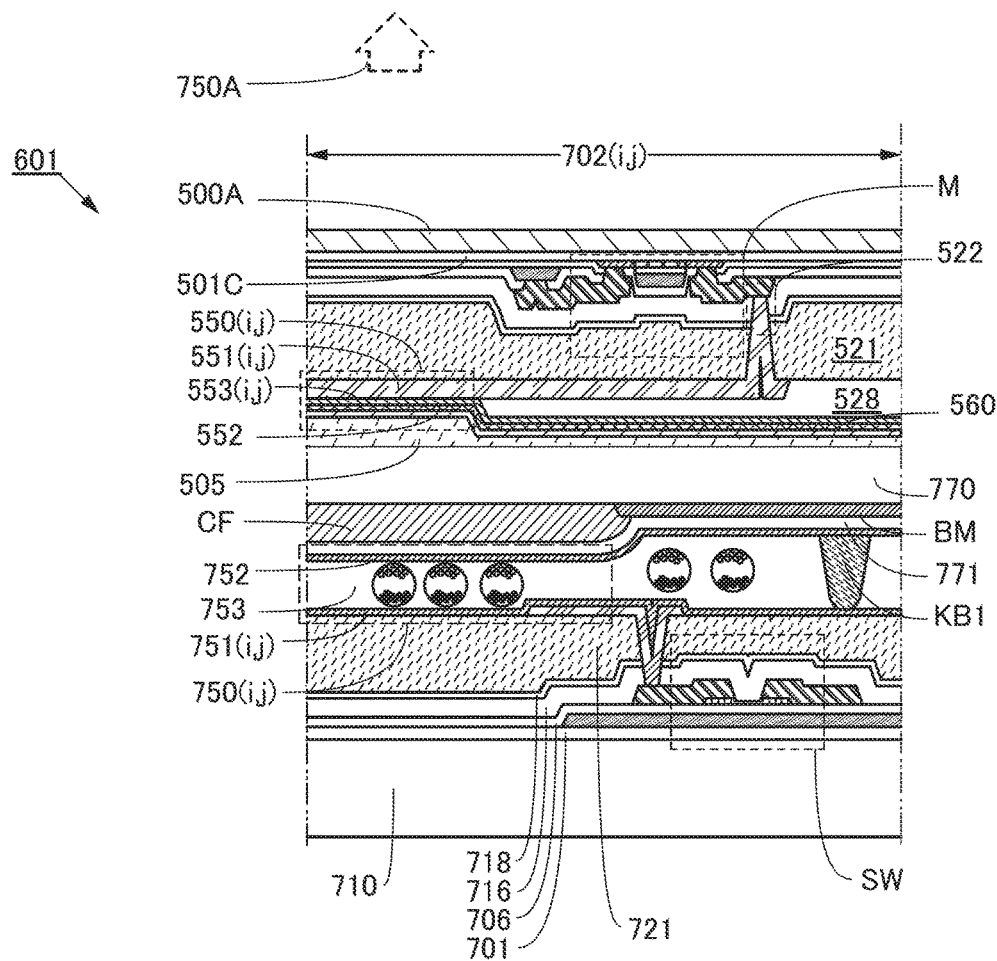
FIGS. 3A to 3C are each a cross-sectional view of a structure body included in a display device of one embodiment of the present invention.

An example of the structure of the pixel 702(i, j) that can be used in a display panel of one embodiment of the present invention will be described. FIG. 3A illustrates a structure body 601.

The pixel 702(i, j) in the display panel of one embodiment of the present invention includes the first display element 750(i, j) and the second display element 550(i, j).

The display panel of one embodiment of the present invention includes, in the pixel 702(i, j), a transistor SW, a transistor M, the first electrode 751(i, j), the second electrode 752, and the layer 753 including electrophoretic particles. The second electrode 752 is provided so that an electric field that controls the arrangement of the electrophoretic particles is generated between the first electrode 751(i, j) and the second electrode 752.

The display panel of one embodiment of the present invention includes the coloring film CF and a light-blocking film BM. The display panel of one embodiment of the present invention also includes an insulating film 771, an insulating film 721, an insulating film 718, an insulating film 716, an insulating film 701, an insulator KB1, and an insulating film 706. The insulator KB1 has the same function as the partition layer 403 illustrated in FIG. 2A.

FIG. 3A illustrates a region where the first electrode 751(i, j) and the second electrode 752 face each other. In FIG. 3A, the first electrode 751(i, j), the second electrode 752, and the layer 753 including electrophoretic particles, which do not overlap with the light-blocking film BM and are surrounded by a dotted line, almost correspond to a display region of the first display element 750(i, j).

The display panel of one embodiment of the present invention includes the substrate 710 or the substrate 770.

A gate electrode and a first electrode of the transistor SW are electrically connected to a scan line and a signal line, respectively.

Figure 3B:
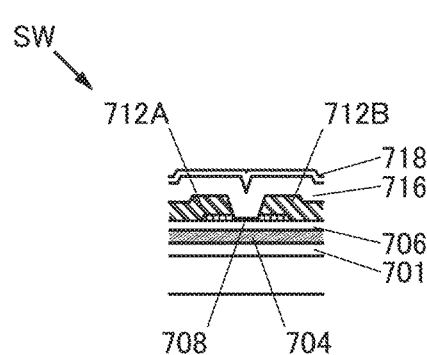

A transistor including a semiconductor film 708, a conductive film 704, the insulating film 706, a conductive film 712A, and a conductive film 712B as illustrated in FIG. 3B can be used as the transistor SW. The conductive film 704 includes a region overlapping with the semiconductor film 708, and the conductive film 712A and the conductive film 712B are electrically connected to the semiconductor film 708. The insulating film 706 includes a region positioned between the semiconductor film 708 and the conductive film 704.

The conductive film 704 and the insulating film 706 serve as a gate electrode and a gate insulating film, respectively. The conductive film 712A serves as one of a source electrode and a drain electrode, and the conductive film 712B serves as the other of the source electrode and the drain electrode.

The coloring film CF includes a region overlapping with the first display element 750(i, j).

The light-blocking film BM includes an opening in a region overlapping with the first display element 750(i, j).

The insulating film 771 includes a region positioned between the layer 753 including electrophoretic particles and the light-blocking film BM or a region positioned between the layer 753 including electrophoretic particles and the coloring film CF.

The substrate 770 includes a region overlapping with the substrate 710 and is provided so that the first display element 750(i, j) lies between the substrate 710 and the substrate 770.

The insulating film 721 includes a region positioned between the layer 753 including electrophoretic particles and the transistor SW. The insulating film 718 includes a region positioned between the insulating film 721 and the transistor SW. The insulating film 716 includes a region positioned between the insulating film 718 and the transistor SW. The insulating film 701 includes a region positioned between the transistor SW and the substrate 710. The insulating film 706 includes a region positioned between the insulating film 716 and the insulating film 701.

The display panel of one embodiment of the present invention includes a bonding layer 505. The bonding layer 505 includes a region positioned between the second display element 550(i, j) and the substrate 770 and has a function of bonding the second display element 550(i, j) to the substrate 770.

The display panel of one embodiment of the present invention includes an insulating film 501C, an insulating layer 521, an insulating film 528, an insulating layer 518, and an insulating layer 516. A resin layer 500A is provided over the insulating film 501C.

The display panel of one embodiment of the present invention includes the transistor M including a semiconductor film 508, a conductive film 504, a conductive film 512A, and a conductive film 512B. The insulating layer 506 includes a region positioned between the semiconductor film 508 and the conductive film 504 (see FIG. 3C). The semiconductor film 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The second display element 550(i, j) in the display panel of one embodiment of the present invention includes a third electrode 551(i, j). In a connection portion 522, the third electrode 551(i, j) is electrically connected to the conductive film 512B of the transistor M, and a fourth electrode 552 of the second display element 550(i, j) is electrically connected to a wiring through which a common potential is supplied. A layer 553(i, j) containing a light-emitting material is provided between the third electrode 551(i, j) and the fourth electrode 552. In FIG. 3A, the third electrode 551(i, j), the fourth electrode 552, and the layer 553(i, j) containing a light-emitting material positioned therebetween, which are surrounded by a dotted line, almost correspond to a display region of the second display element 550(i, j).

The transistor M enables the second display element 550(i, j) to be driven. A protective layer 560 is provided between the fourth electrode 552 and the bonding layer 505.

<Reflective Display Element>

The details of the components of the first display element 750(i, j) will be described with reference to FIGS. 2A and 2B. The first display element 750(i, j) is a reflective display element.

In the display panel of one embodiment of the present invention, the first display element 750(i, j) can include electrophoretic particles.

The first display element 750(i, j) includes the first electrode 751(i, j), the second electrode 752 (it may also be called a counter electrode), and the layer 753 including electrophoretic particles positioned between the first electrode 751(i, j) and the second electrode 752. As for the electrophoretic particles included in the layer 753 including electrophoretic particles, titanium oxide or the like can be used for the positively-charged particles 401a colored in one color, and carbon black or the like can be used for the negatively-charged particles 401b colored in another color. In addition, a single material selected from a conductor, an insulator, a semiconductor, a magnetic material, a liquid crystal material, a ferroelectric material, an electroluminescent material, an electrochromic material, and a magnetophoretic material, or a composite material formed using any of these materials can be used.

The positively-charged particles or the negatively-charged particles migrate by an electric field applied between the first electrode 751(i, j) and the second electrode 752; in this way, an image can be displayed. The material of the layer including electrophoretic particles may be selected as appropriate depending on the system used for electronic paper (a microcapsule electrophoresis system, a horizontal electrophoresis system, a vertical electrophoresis system, a system using a twisting ball, a system using a microcup, a system using a charged toner, a system using Electronic Liquid Powder (trademark), or the like).

A method for forming the first display element 750(i, j) including microcapsules will be described here.

First, the layer 753 including electrophoretic particles is formed over the first electrode 751(i, j) and the partition layer 403 which are formed over the substrate 710. For example, the binder 402 in which microcapsules are dispersed and fixed is provided over the first electrode 751(i, j). Then, the second electrode 752 is formed over the layer 753 including electrophoretic particles. By using the binder 402 over the surface of which the second electrode 752 has been formed in advance, the microcapsules 401 and the second electrode 752 are provided over the first electrode 751(i, j).

Each of the microcapsules 401 includes the positively-charged particles 401a colored in one color and the negatively-charged particles 401b colored in another color, which are dispersed in a solvent included in the microcapsule. The particles colored in one color or another color segregate on one side in each of the microcapsules 401 by the influence of an electric field applied between the first electrode 751(i, j) and the second electrode 752 to change the contrast of the corresponding pixel; in this manner, an image can be displayed. The diameter of each of the microcapsules 401 can be greater than or equal to 1 μm and less than or equal to 1 mm, for example.

Alternatively, a resin film can be used as the binder 402, and the microcapsules 401 can be dispersed and fixed in the resin film. The use of the binder 402 in which the microcapsules 401 have been dispersed and fixed in advance simplifies the manufacturing process.

The partition layer 403 has a function of separating pixel regions. Although the insulating material and the formation method of the partition layer 403 may be similar to those of other insulator layers, carbon black or a black pigment is preferably dispersed therein. Adjacent pixels are separated in this manner, so that cross talk can be prevented and a clear image can be displayed by adding a function as a black stripe as in a liquid crystal display device or the like. The area of the first display element 750(*i, j*) may be determined as appropriate and is 100 μm×400 μm, for example, so that at least one microcapsule including electrophoretic particles can be provided for each pixel electrode. In the layer 753 including electrophoretic particles, the microcapsule 401 does not necessarily have a spherical shape and may have a distorted spherical shape.

The above structure makes it possible to control an electric field applied to the layer 753 including electrophoretic particles and thus to control the arrangement of the electrophoretic particles in the layer 753 including electrophoretic particles.

The microcapsules can be provided by a roll coater method, a printing method, a spray method, or the like.

For example, the layer 753 including electrophoretic particles is formed over the first electrode 751(*i, j*) by a roll coater method. Then, the substrate 770 over the surface of which the second electrode 752 has been formed in advance is provided over the layer 753 including electrophoretic particles. Here, a semi-cured organic resin is formed over the substrate 770, the second electrode 752 is formed over the semi-cured organic resin, and the substrate 770 is then subjected to thermocompression bonding while the surface provided with the second electrode 752 faces the layer including electrophoretic particles, so that the substrate 710 and the substrate 770 adhere each other.

The above structure is merely an example, and the display device of one embodiment of the disclosed invention is not limited to the above structure.

<Substrate 710 and Substrate 770>

A material having heat resistance high enough to withstand heat treatment in the manufacturing process can be used for the substrate 710, the substrate 770, or the like. A material with a thickness greater than or equal to 0.1 mm and less than or equal to 0.7 mm can be used for the substrate 710 or the substrate 770, for example. Specifically, a material polished to a thickness of approximately 0.1 mm can be used.

For example, a large-sized glass substrate having any of the following sizes can be used for the substrate 710, the substrate 770, or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 710, the substrate 770, or the like, an organic material, an inorganic material, a composite material of an organic material and an inorganic material, or the like can be used. For example, an inorganic material, such as glass, ceramic, or a metal, can be used for the substrate 710, the substrate 770, or the like.

Specifically, non-alkali glass, soda-lime glass, potash glass, crystal glass, aluminosilicate glass, tempered glass, chemically tempered glass, quartz, sapphire, or the like can be used for the substrate 710, the substrate 770, or the like. Specifically, an inorganic oxide film, an inorganic nitride film, an inorganic oxynitride film, or the like can be used for the substrate 710, the substrate 770, or the like. For example, a silicon oxide film, a silicon nitride film, a silicon oxynitride film, an aluminum oxide film, or the like can be used for the substrate 710, the substrate 770, or the like. For example, stainless steel, aluminum, or the like can be used for the substrate 710, the substrate 770, or the like.

For example, a single crystal semiconductor substrate or a polycrystalline semiconductor substrate of silicon or silicon carbide, a compound semiconductor substrate of silicon germanium or the like, or an SOI substrate can be used as the substrate 710, the substrate 770, or the like. Thus, a semiconductor element can be provided on the substrate 710, the substrate 770, or the like.

For example, an organic material, such as a resin, a resin film, or plastics, can be used for the substrate 710, the substrate 770, or the like. Specifically, a resin film or a resin plate of polyester, polyolefin, polyamide, polyimide, polycarbonate, an acrylic resin, or the like can be used for the substrate 710, the substrate 770, or the like.

For example, a composite material formed by attaching a metal plate, a thin glass plate, or a film of an inorganic material to a resin film or the like can be used for the substrate 710, the substrate 770, or the like. For example, a composite material formed by dispersing a fibrous or particulate metal, glass, inorganic material, or the like into a resin film can be used for the substrate 710, the substrate 770, or the like. For example, a composite material formed by dispersing a fibrous or particulate resin, organic material, or the like into an inorganic material can be used for the substrate 710, the substrate 770, or the like.

In addition, a single-layer material or a material obtained by stacking a plurality of layers can be used for the substrate 710, the substrate 770, or the like. For example, a material obtained by stacking a substrate, an insulating film that prevents diffusion of impurities contained in the substrate, and the like can be used for the substrate 710, the substrate 770, or the like. Specifically, a material obtained by stacking glass and one or a plurality of films that are selected from a silicon oxide layer, a silicon nitride layer, a silicon oxynitride layer, and the like and that prevent diffusion of impurities contained in the glass can be used for the substrate 710, the substrate 770, or the like. Alternatively, a material obtained by stacking a resin and a film that prevents diffusion of impurities that penetrate the resin, such as a silicon oxide film, a silicon nitride film, or a silicon oxynitride film, can be used for the substrate 710, the substrate 770, or the like.

Specifically, a resin film, a resin plate, a layered material, or the like of polyester, polyolefin, polyamide, polyimide, polycarbonate, an acrylic resin, or the like can be used for the substrate 710, the substrate 770, or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone, can be used for the substrate 710, the substrate 770, or the like.

Specifically, polyethylene terephthalate (PET), polyethylene naphthalate (PEN), polyethersulfone (PES), acrylic, or the like can be used for the substrate 710, the substrate 770, or the like.

Alternatively, paper, wood, or the like can be used for the substrate 710, the substrate 770, or the like.

For example, a flexible substrate can be used as the substrate 710, the substrate 770, or the like.

Note that a transistor, a capacitor, or the like can be directly formed over the substrate. Alternatively, a transistor, a capacitor, or the like can be formed over a substrate which is for use in the manufacturing process and can withstand heat applied in the manufacturing process, and then the transistor, the capacitor, or the like can be transferred to the substrate 710, the substrate 770, or the like. In this manner, a transistor, a capacitor, or the like can be formed over a flexible substrate, for example.

<Insulating Film 721>

For example, an insulating inorganic material, an insulating organic material, or an insulating composite material of an inorganic material and an organic material can be used for the insulating film 721 or the like.

Specifically, an inorganic oxide film, an inorganic nitride film, an inorganic oxynitride film, or a material obtained by stacking some of these films can be used as the insulating film 721 or the like. For example, a film including any of a silicon oxide film, a silicon nitride film, a silicon oxynitride film, an aluminum oxide film, and the like, or a film including a layered material obtained by stacking some of these films can be used as the insulating film 721 or the like.

Specifically, polyester, polyolefin, polyamide, polyimide, polycarbonate, polysiloxane, an acrylic resin, a layered or composite material including a plurality of resins selected from these, or the like can be used for the insulating film 721 or the like. Alternatively, a photosensitive material may be used.

Thus, steps due to various components overlapping with the insulating film 721, for example, can be covered so that a flat surface can be formed.

<Insulating Film 701>

For example, a material that can be used for the insulating film 721 can be used for the insulating film 701. Specifically, a material containing silicon and oxygen can be used for the insulating film 701. Thus, impurity diffusion to the transistor SW or the transistor M can be suppressed.

<Self-Luminous Display Element>

Components of the second display element 550(i, j) will be described below in detail. The second display element 550(i, j) is a self-luminous display element.

<Resin Layer 500A>

The resin layer 500A serves as a protective layer of the self-luminous display element and is a portion to be separated in a process of manufacturing the self-luminous display element. A photosensitive resin can be used as a material of the resin layer 500A. The details will be described later.

<Second Display Element 550(i, j)>

The second display element 550(i, j) includes the third electrode 551(i, j), the fourth electrode 552, and the layer 553(i, j) containing a light-emitting material. According to one embodiment of the present invention, the second display element 550(i, j) is also referred to as a light-emitting element. The layer 553(i, j) containing a light-emitting material will be described later in detail.

The third electrode 551(i, j) and the fourth electrode 552 can be formed using a material that transmits visible light. Specifically, a conductive oxide, such as indium oxide, indium tin oxide, indium zinc oxide, zinc oxide, or zinc oxide to which gallium is added, can be used for the third electrode 551(i, j) or the fourth electrode 552.

When a semi-transmissive layer with a reflectance higher than or equal to 30% and a transmittance higher than or equal to 50% in a wavelength range of greater than or equal to 400 nm and less than or equal to 700 nm is formed as each of the third electrode 551(i, j) and the fourth electrode 552, light emitted from the layer 553(i, j) containing a light-emitting material resonates by multiple reflection, that is, a function as a so-called micro optical resonator (microcavity) may be provided. Although described later, an electrode like the second electrode 752 of the reflective display element may also have semi-transmissivity so that light resonates by multiple reflection.

<Bonding Layer 505>

For the bonding layer 505, various curable adhesives, such as a reactive curable adhesive, a thermosetting adhesive, an anaerobic adhesive, and a photo-curable adhesive, such as an ultraviolet curable adhesive, can be used. Alternatively, an adhesive sheet or the like may be used.

<Insulating Layer 521>

For example, an insulating inorganic material, an insulating organic material, or an insulating composite material of an inorganic material and an organic material can be used for the insulating layer 521 or the like.

Specifically, an inorganic oxide film, an inorganic nitride film, an inorganic oxynitride film, or a layered material obtained by stacking some of these films can be used as the insulating layer 521 or the like. For example, a film including any of a silicon oxide film, a silicon nitride film, a silicon oxynitride film, an aluminum oxide film, and the like, or a film including a layered material obtained by stacking some of these films can be used as the insulating layer 521 or the like.

Specifically, polyester, polyolefin, polyamide, polyimide, polycarbonate, polysiloxane, an acrylic resin, or the like, a layered or composite material including resins selected from these, or the like can be used for the insulating layer 521 or the like. Alternatively, a photosensitive material may be used.

Thus, steps due to various components overlapping with the insulating layer 521, for example, can be covered so that a flat surface can be formed.

<Insulating Film 528>

For example, a material which can be used for the insulating layer 521 can be used for the insulating film 528 or the like. Specifically, a 1-µm-thick polyimide-containing film can be used as the insulating film 528.

<Insulating Film 501C>

For example, the material which can be used for the insulating layer 521 can be used for the insulating film 501C. Specifically, a material containing silicon and oxygen can be used for the insulating film 501C. Thus, diffusion of impurities into a pixel circuit, the second display element, or the like can be inhibited.

For example, a 200-nm-thick film containing silicon, oxygen, and nitrogen can be used as the insulating film 501C.

<Transistor M>

The transistor M can be formed using the same material as the transistor SW. The first electrode and the second electrode of the second display element 550 are electrically connected to a second electrode of the transistor M and a wiring through which a common potential is supplied, respectively. This enables the second display element 550 to be driven.

<Driver Circuit SD>

Although not illustrated, a driver circuit SD is configured to generate an image signal supplied to the pixel circuit in accordance with image data, for example. Specifically, the driver circuit SD has a function of generating a signal whose polarity is inverted. Thus, the first display element 750(i, j) and the second display element 550(i, j) can be driven.

For example, any of sequential circuits, such as a shift register, that drives the first display element 750(i, j) and the second display element 550(i, j) can be used as the driver circuit SD.

For example, an integrated circuit can be used as the driver circuit SD. Specifically, an integrated circuit formed on a silicon substrate can be used as the driver circuit SD.

For example, the driver circuit SD can be mounted on a terminal by a chip on glass (COG) method. Specifically, an anisotropic conductive film can be used to mount an integrated circuit on the terminal. Alternatively, a chip on film (COF) method may be used to mount an integrated circuit on the terminal.

The structure described in this embodiment can be combined with any of the other embodiments as appropriate.

Embodiment 3

In this embodiment, a method for manufacturing a display device will be described in which a reflective display element is formed over a substrate so that light is reflected in the direction of a plane on which a self-luminous display element is formed and the self-luminous display element is formed over the reflective display element. In this embodiment, a method for manufacturing the display device illustrated in FIGS. 3A to 3C, which is one embodiment of the present invention, will be described.

Figure 4A:
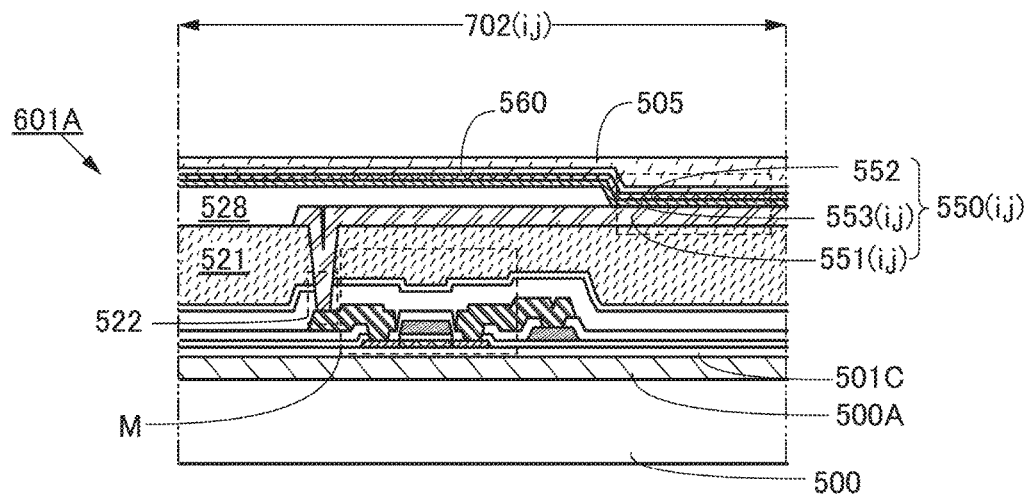
FIGS. 4A to 4C are each a cross-sectional view of a structure body included in a display device of one embodiment of the present invention.
Figure 4B:
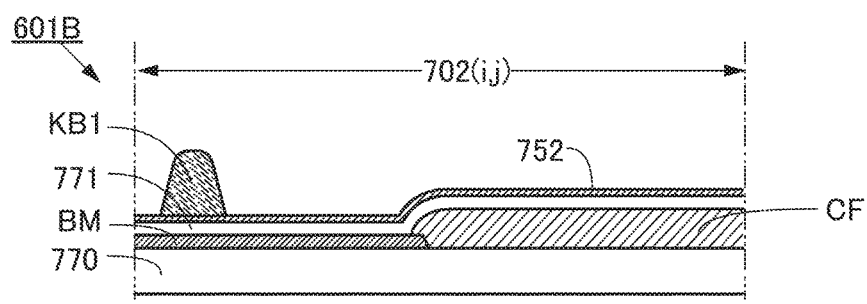
Figure 4C:
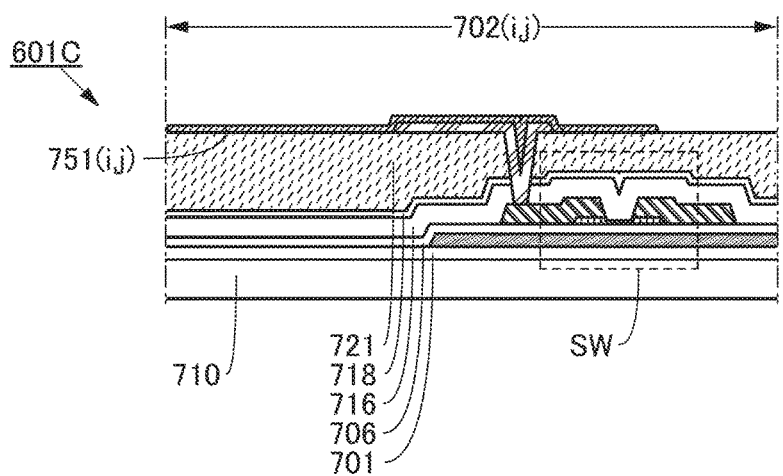

FIG. 4A illustrates a structure body 601A in which the self-luminous display element is provided over a substrate 500. FIG. 4B illustrates a structure body 601B including the coloring film CF, the insulator KB1, the light-blocking film BM, and the insulating film 771 over the substrate 770. FIG. 4C illustrates a structure body 601C in which a circuit for the reflective display element is formed over the substrate 710. Note that the same substrate as the substrate 710 can be used as the substrate 500.

In the structure body 601B illustrated in FIG. 4B, the insulator KB1 is formed in a desired position to be in contact with the second electrode 752. The insulator KB1 can be formed by patterning an organic resin film, such as an acrylic resin film.

After the structure body 601A, the structure body 601B, and the structure body 601C are obtained, the structure body 601B and the structure body 601C are made to face each other and bonded to each other with a binder in which microcapsules including electrophoretic particles have been dispersed and fixed in advance.

Figure 5A:
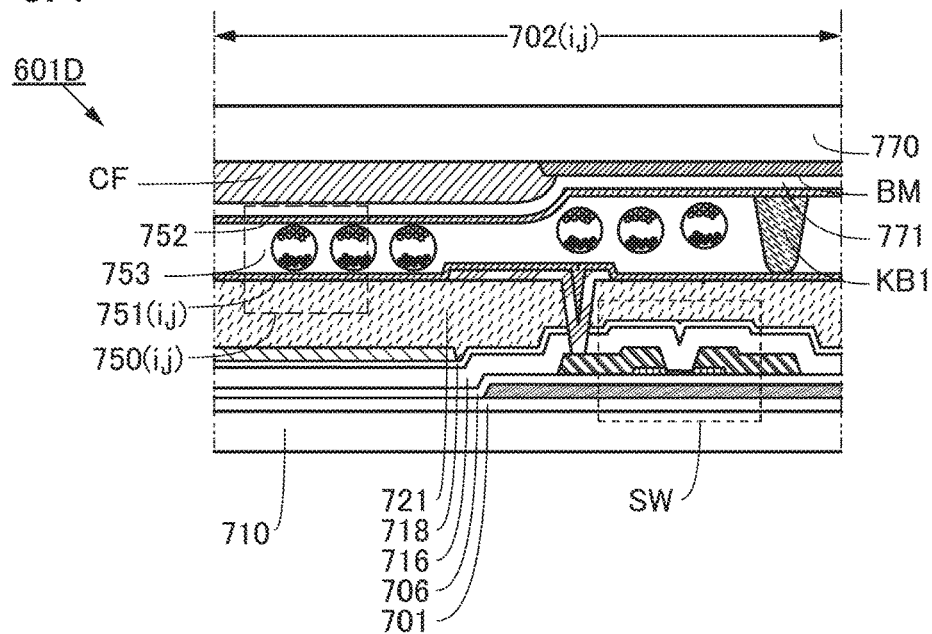
FIGS. 5A and 5B are each a cross-sectional view of a structure body included in a display device of one embodiment of the present invention.
Figure 5B:
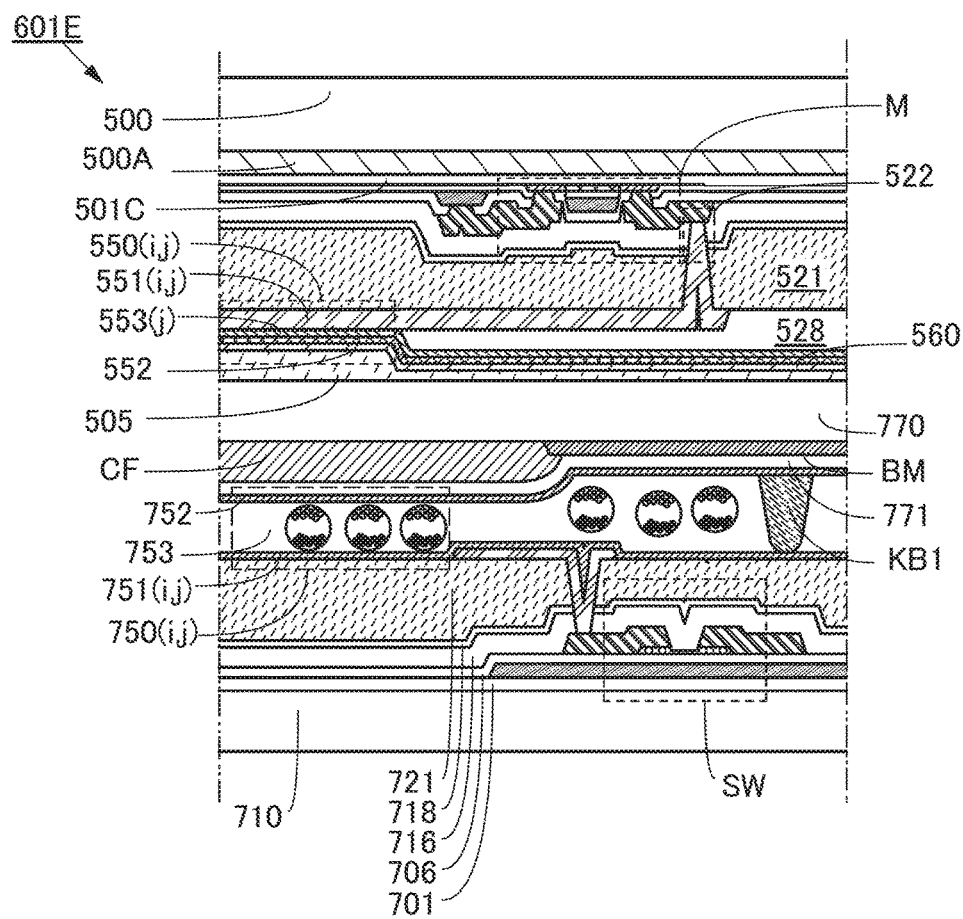

As illustrated in FIG. 5A, a structure body 601D including the reflective display element is formed in such a manner that the structure body 601B and the structure body 601C are bonded to each other. Next, the structure body 601A is bonded to the structure body 601D. As a result, a structure body 601E illustrated in FIG. 5B is formed.

A method for manufacturing the structure body 601A, a method for bonding the structure body 601A and the structure body 601D to each other, and a method for separating the substrate 500 from the structure body 601E will be described below.

<Method for Manufacturing Structure Body 601A>

Although described later, the structure body 601A is divided (separated) into the substrate 500 and a structure manufactured thereover. In that case, the resin layer 500A in the structure body 601A is irradiated with light using a laser. The display device of one embodiment of the present invention preferably includes a metal oxide in a channel formation region of the transistor M. This is because the transistor M can be formed at a temperature lower than or equal to the allowable temperature limit of the resin layer 500A.

In the case where low temperature polysilicon (LTPS) is used for a channel formation region of the transistor, the resin layer is required to have heat resistance because heat at a temperature of approximately 500° C. to 550° C. needs to be applied. Furthermore, the resin layer needs to have a large thickness so that damage in a step of laser crystallization can be reduced.

In contrast, the transistor including a metal oxide can be formed at a temperature lower than or equal to 350° C., or even lower than or equal to 300° C. Thus, the resin layer is not required to have high heat resistance. Accordingly, the heat resistant temperature of the resin layer can be low, and the range of choices for the materials can be widened. Furthermore, the transistor including a metal oxide does not need a laser crystallization process; thus, the resin layer can be thin. Since the resin layer is not required to have high heat resistance and can be thin, the cost in manufacturing a device can be significantly reduced. A metal oxide is preferably used, in which case the steps can be simplified as compared with the case where LTPS is used.

A conductive layer overlapping with a bottom surface of a recessed portion of the resin layer with an insulating layer interposed therebetween can be formed using the same material and the same steps as an electrode or a metal oxide of the transistor.

For example, conductive materials, such as a metal, an alloy, and an oxide conductive layer used for an electrode of the transistor, can be used for the conductive layer.

Alternatively, for example, a metal oxide layer used as the conductive layer and a metal oxide layer used as the semiconductor layer of the transistor are formed using the same material and the same steps. After that, the resistance of only the metal oxide layer used as the conductive layer is reduced (it can also be said that an oxide conductive layer is formed).

Alternatively, for example, a metal oxide layer used as the conductive layer and a metal oxide layer used as the electrode (e.g., a gate electrode) of the transistor are formed using the same material and the same steps. After that, the resistance of the metal oxide layer used as the conductive layer and the resistance of the metal oxide layer used as the electrode of the transistor are reduced.

A metal oxide is a semiconductor material whose resistance can be controlled by oxygen vacancies in the film of the semiconductor material and/or the concentration of impurities (typically, hydrogen or water) in the film of the semiconductor material. Thus, the resistivity of the metal oxide layer or the oxide conductive layer can be controlled by selecting treatment for increasing oxygen vacancies and/or impurity concentration on the metal oxide layer or treatment for reducing oxygen vacancies and/or impurity concentration on the metal oxide layer.

Specifically, the resistivity of the metal oxide can be controlled by plasma treatment. For example, plasma treatment using a gas containing one or more kinds selected from a rare gas (He, Ne, Ar, Kr, or Xe), hydrogen, boron, phosphorus, and nitrogen can be employed. For example, plasma treatment can be performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere. Thus, the metal oxide layer can have a high carrier density and a low resistivity.

Alternatively, hydrogen, boron, phosphorus, or nitrogen is injected into the metal oxide layer by an ion implantation method, an ion doping method, a plasma immersion ion implantation method, or the like, so that the resistivity of the metal oxide layer can be reduced.

Alternatively, a method in which a film containing hydrogen and/or nitrogen is formed in contact with the metal oxide layer and hydrogen and/or nitrogen are/is diffused from the film into the metal oxide layer can be employed. Thus, the metal oxide layer can have a high carrier density and a low resistivity.

Hydrogen contained in the metal oxide layer reacts with oxygen bonded to a metal atom to be water, and also causes oxygen vacancies in a lattice from which oxygen is released (or a portion from which oxygen is released). Entry of hydrogen into the oxygen vacancies generates an electron serving as a carrier in some cases. Furthermore, in some cases, bonding of part of hydrogen to oxygen bonded to a metal atom causes generation of an electron serving as a carrier. Thus, the metal oxide layer can have a high carrier density and a low resistivity.

In the case where heat treatment is performed in the manufacturing process of the display device, oxygen is released from the metal oxide layer by heating the metal oxide layer, so that oxygen vacancies might be increased. Thus, the resistivity of the metal oxide layer can be reduced.

Note that such an oxide conductive layer formed using a metal oxide layer can be referred to as a metal oxide layer having a high carrier density and a low resistance, a metal oxide layer having conductivity, or a metal oxide layer having high conductivity.

The resin layer 500A in the display device of one embodiment of the present invention has a thickness greater than or equal to 0.1 μm and less than or equal to 3 μm. By forming the resin layer thin, the display device can be manufactured at low cost. The display device can be lightweight and thin. The display device can have higher flexibility.

According to one embodiment of the present invention, the transistor or the like is formed at a temperature lower than or equal to the allowable temperature limit of the resin layer. The heat resistance of the resin layer can be measured by, for example, a weight loss percentage due to heat, specifically, the 5% weight loss temperature. According to one embodiment of the present invention, the 5% weight loss temperature of the resin layer is preferably lower than or equal to 450° C., more preferably lower than or equal to 400° C., more preferably lower than 400° C., more preferably lower than 350° C.

According to one embodiment of the present invention, irradiation with a linear laser beam is performed. A laser apparatus used in a manufacturing line for LTPS or the like can be effectively used. A linear laser beam is condensed into a long rectangular shape so that the resin layer is irradiated with light.

Manufacturing Method Example 1

First, the resin layer 500A is formed using a photosensitive material over the substrate 500.

In particular, a photosensitive and thermosetting material is preferably used. In this embodiment, a photosensitive and thermosetting material is used.

Specifically, a material is deposited and then the film is heated, so that the resin layer 500A is formed. Note that this heat treatment can also be referred to as postbake treatment because it is performed after the material is deposited.

By the heat treatment, released gas components (e.g., hydrogen or water) of the resin layer 500A can be reduced. In particular, the heat treatment is preferably performed at a temperature higher than the fabricating temperature of each layer formed over the resin layer 500A. For example, in the case where the manufacturing temperature of the transistor is below 350° C., a film to be the resin layer 500A is preferably heated at a temperature higher than 350° C. and lower than or equal to 450° C., more preferably lower than or equal to 400° C., more preferably lower than or equal to 375° C. Thus, a gas released from the resin layer 500A in the manufacturing process of the transistor can be significantly reduced.

The resin layer 500A has flexibility. The substrate 500 has lower flexibility than the resin layer 500A.

The resin layer 500A is preferably formed using a photosensitive polyimide resin (also referred to as PSPI).

Examples of a photosensitive material which can be used to form the resin layer 500A include an acrylic resin, an epoxy resin, a polyamide resin, a polyimideamide resin, a siloxane resin, a benzocyclobutene-based resin, and a phenol resin.

The resin layer 500A is preferably formed using a spin coater. By a spin coating method, a thin film can be uniformly formed over a large-sized substrate.

The resin layer 500A is preferably formed using a solution having a viscosity greater than or equal to 5 cP and less than 500 cP, more preferably greater than or equal to 5 cP and less than 100 cP, more preferably greater than or equal to 10 cP and less than or equal to 50 cP. As the viscosity of the solution is lower, application is performed more easily. As the viscosity of the solution is lower, inclusion of air bubbles can be reduced more; thus, a high-quality film can be formed.

The resin layer 500A preferably has a thickness greater than or equal to 0.01 μm and less than 10 μm, more preferably greater than or equal to 0.1 μm and less than or equal to 3 μm, more preferably greater than or equal to 0.5 μm and less than or equal to 1 μm. With a solution having low viscosity, the resin layer 500A having a small thickness can easily be formed. When the resin layer 500A has a thickness in the above range, the display device can have higher flexibility. Without limitation thereon, the thickness of the resin layer 500A may be greater than or equal to 10 μm. For example, the resin layer 500A may have a thickness greater than or equal to 10 μm and less than or equal to 200 μm. The resin layer 500A preferably has a thickness greater than or equal to 10 μm because the rigidity of the display device can be increased.

Alternatively, the resin layer 500A can be formed by dipping, spray coating, ink-jetting, dispensing, screen printing, or offset printing, or with a doctor knife, a slit coater, a roll coater, a curtain coater, or a knife coater, for example.

The resin layer 500A preferably has a thermal expansion coefficient greater than or equal to 0.1 ppm/° C. and less than or equal to 20 ppm/° C., more preferably greater than or equal to 0.1 ppm/° C. and less than or equal to 10 ppm/° C. As the resin layer 500A has a lower thermal expansion coefficient, generation of a crack in a layer included in the transistor or the like and breakage of the transistor or the like which are caused owing to the heat treatment can further be prevented.

In the case where the resin layer 500A is positioned on the display surface side of the display device, the resin layer 500A preferably has a high visible-light transmitting property.

The substrate 500 has stiffness high enough for easy transfer and has resistance to heat applied in the manufacturing process. Examples of a material that can be used for the substrate 500 include glass, quartz, ceramic, sapphire, a resin, a semiconductor, a metal, and an alloy. Examples of the glass include alkali-free glass, barium borosilicate glass, and aluminoborosilicate glass.

Next, the insulating film 501C is formed over the resin layer 500A.

The insulating film 501C is formed at a temperature lower than or equal to the allowable temperature limit of the resin layer 500A. The insulating film 501C is preferably formed at a temperature lower than the heating temperature in the above-described postbake treatment.

The insulating film 501C can be used as a barrier layer that prevents diffusion of impurities contained in the resin layer 500A into the transistor and the display element formed later. For example, the insulating film 501C preferably prevents moisture and the like contained in the resin layer 500A from diffusing into the transistor and the display element when the resin layer 500A is heated. Thus, the insulating film 501C preferably has a high barrier property.

As the insulating film 501C, an inorganic insulating film, such as a silicon nitride film, a silicon oxynitride film, a silicon oxide film, a silicon nitride oxide film, an aluminum oxide film, or an aluminum nitride film, can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used. It is particularly preferable that a silicon nitride film be formed over the resin layer 500A and a silicon oxide film be formed over the silicon nitride film.

An inorganic insulating film is preferably formed at high temperatures because the film can have higher density and higher barrier property as the deposition temperature becomes higher.

The substrate temperature during the deposition of the insulating film 501C is preferably higher than or equal to room temperature (25° C.) and lower than or equal to 350° C., more preferably higher than or equal to 100° C. and lower than or equal to 300° C.

Next, the transistor M is formed over the insulating film 501C.

There is no particular limitation on the structure of the transistor in the display device. For example, a planar transistor, a staggered transistor, or an inverted staggered transistor may be used. A top-gate transistor or a bottom-gate transistor may be used. Gate electrodes may be provided above and below a channel.

Here, the case where a top-gate transistor including the semiconductor film 508 containing a metal oxide is formed as the transistor M is described.

According to one embodiment of the present invention, a metal oxide is used as a semiconductor of the transistor. A semiconductor material having a wider band gap and a lower carrier density than silicon is preferably used because the off-state current of the transistor can be reduced.

The transistor M is formed at a temperature lower than or equal to the allowable temperature limit of the resin layer 500A. The transistor M is preferably formed at a temperature lower than the heating temperature in the above-described postbake treatment.

The substrate temperature in a step of forming the conductive film is preferably higher than or equal to room temperature and lower than or equal to 350° C., more preferably higher than or equal to room temperature and lower than or equal to 300° C.

The conductive layers included in the display device can each have a single-layer structure or a stacked structure including any of metals, such as aluminum, titanium, chromium, nickel, copper, yttrium, zirconium, molybdenum, silver, tantalum, and tungsten, or an alloy containing any of these metals as its main component. Alternatively, a light-transmitting conductive material, such as indium oxide, ITO, indium oxide containing tungsten, indium zinc oxide containing tungsten, indium oxide containing titanium, ITO containing titanium, indium zinc oxide, ZnO, ZnO containing gallium, or indium tin oxide containing silicon, may be used. Alternatively, a semiconductor, such as a metal oxide or polycrystalline silicon whose resistance is lowered by containing an impurity element or the like, or silicide, such as nickel silicide, may be used. A film containing graphene may be used as well. The film containing graphene can be formed, for example, by reducing a film containing graphene oxide. A semiconductor, such as a metal oxide containing an impurity element, may be used. Alternatively, the conductive layers may be formed using a conductive paste of silver, carbon, copper, or the like or a conductive polymer, such as a polythiophene. A conductive paste is preferable because it is inexpensive. A conductive polymer is preferable because it is easily applied.

The semiconductor film 508 can be formed in the following manner: a metal oxide film is formed, a resist mask is formed, the metal oxide film is etched, and the resist mask is removed.

The substrate temperature during the deposition of the metal oxide film is preferably lower than or equal to 350° C., more preferably higher than or equal to room temperature and lower than or equal to 200° C., more preferably higher than or equal to room temperature and lower than or equal to 130° C.

The metal oxide film can be formed using either an inert gas or an oxygen gas. Note that there is no particular limitation on the percentage of oxygen flow rate (the partial pressure of oxygen) in the step of forming the metal oxide film. In the case where a transistor having high field-effect mobility is obtained, the percentage of oxygen flow rate (the partial pressure of oxygen) in the step of forming the metal oxide film is preferably higher than or equal to 0% and lower than or equal to 30%, more preferably higher than or equal to 5% and lower than or equal to 30%, more preferably higher than or equal to 7% and lower than or equal to 15%.

The metal oxide film preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained. The metal oxide film preferably includes, for example, a film represented by an In-M-Zn-based oxide that contains at least indium, zinc, and M (aluminum, gallium, yttrium, tin, boron, silicon, titanium, iron, nickel, germanium, zirconium, molybdenum, lanthanum, cerium, neodymium, hafnium, tantalum, tungsten, or magnesium).

The substrate temperature in the step of forming the conductive film is preferably higher than or equal to room temperature and lower than or equal to 350° C., more preferably higher than or equal to room temperature and lower than or equal to 300° C.

Figure 3C:
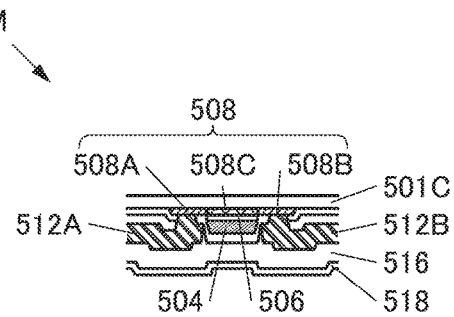

In the transistor M, the conductive film 504 serves as a gate electrode, the insulating layer 506 serves as a gate insulating layer, and the conductive film 512A and the conductive film 512B serve as a source and a drain (FIG. 3C).

Through the above steps, the insulating film 501C and the transistor M can be formed over the resin layer 500A.

Next, the insulating layer 516 that covers the transistor M is formed. The insulating layer 516 can be formed using a method similar to that of the insulating film 501C.

It is preferable to use an oxide insulating film, such as a silicon oxide film or a silicon oxynitride film, formed in an atmosphere containing oxygen for the insulating layer 516. The insulating layer 518 with low oxygen diffusibility and oxygen permeability, such as a silicon nitride film, is preferably stacked over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the semiconductor film 508. As a result, oxygen vacancies in the semiconductor film 508 can be filled and defects at the interface between the semiconductor film 508 and the insulating layer 506 can be repaired, leading to a reduction in defect levels. This enables the fabrication of a highly reliable display device.

According to one embodiment of the present invention, the insulating layer 518 is further formed over the insulating layer 516.

Then, the insulating layer 521 is formed over the insulating layer 518. The display element is formed over the insulating layer 521 in a later step; thus, the insulating layer 521 preferably serves as a planarization layer. For the insulating layer 521, the description of the organic insulating film or the inorganic insulating film that can be used as the insulating film 501C can be referred to.

The insulating layer 521 is formed at a temperature lower than or equal to the allowable temperature limit of the resin layer 500A. The insulating layer 521 is preferably formed at a temperature lower than the heating temperature in the above-described postbake treatment.

In the case of using an organic insulating film as the insulating layer 521, it is preferable that the temperature applied to the resin layer 500A in forming the insulating layer 521 be higher than or equal to room temperature and lower than or equal to 350° C., more preferably higher than or equal to room temperature and lower than or equal to 300° C.

In the case of using an inorganic insulating film as the insulating layer 521, the substrate temperature during the deposition is preferably higher than or equal to room temperature and lower than or equal to 350° C., more preferably higher than or equal to 100° C. and lower than or equal to 300° C.

Next, an opening reaching the conductive film 512B is formed in the insulating layer 521, the insulating layer 518, and the insulating layer 516.

After that, the third electrode 551(i, j) is formed. The third electrode 551(i, j) partly serves as a pixel electrode of the second self-luminous display element 550(i, j). The third electrode 551(i, j) can be formed in the following manner: a conductive film is formed, a resist mask is formed, the conductive film is etched, and the resist mask is removed.

The third electrode 551(i, j) is formed at a temperature lower than or equal to the allowable temperature limit of the resin layer 500A. The third electrode 551(i, j) is preferably formed at a temperature lower than the heating temperature in the above-described postbake treatment.

The substrate temperature in the step of forming the conductive film is preferably higher than or equal to room temperature and lower than or equal to 350° C., more preferably higher than or equal to room temperature and lower than or equal to 300° C.

Next, the insulating film 528 is formed to cover an end portion of the third electrode 551(i, j). For the insulating film 528, the description of the organic insulating film or the inorganic insulating film that can be used as the insulating film 501C can be referred to.

The insulating film 528 is formed at a temperature lower than or equal to the allowable temperature limit of the resin layer 500A. The insulating film 528 is preferably formed at a temperature lower than the heating temperature in the above-described postbake treatment.

In the case of using an organic insulating film as the insulating film 528, it is preferable that the temperature applied to the resin layer 500A in forming the insulating film 528 be higher than or equal to room temperature and lower than or equal to 350° C., more preferably higher than or equal to room temperature and lower than or equal to 300° C.

In the case of using an inorganic insulating film as the insulating film 528, the substrate temperature during the deposition is preferably higher than or equal to room temperature and lower than or equal to 350° C., more preferably higher than or equal to 100° C. and lower than or equal to 300° C.

Next, the layer 553(i, j) containing a light-emitting material and the fourth electrode 552 are formed. The fourth electrode 552 partly serves as a common electrode of the second self-luminous display element 550(i, j).

The layer 553(i, j) containing a light-emitting material can be formed by an evaporation method, a coating method, a printing method, a discharge method, or the like. In the case where the layer 553(i, j) containing a light-emitting material is formed for each individual pixel, an evaporation method using a shadow mask, such as a metal mask, an ink-jet method, or the like can be used. In the case of sharing the layer 553(i, j) containing a light-emitting material by some pixels, an evaporation method using no metal mask can be used.

Either a low molecular compound or a high molecular compound can be used for the layer 553(i, j) containing a light-emitting material, and an inorganic compound may also be used.

The fourth electrode 552 can be formed by an evaporation method, a sputtering method, or the like.

The fourth electrode 552 is formed at a temperature lower than or equal to the allowable temperature limit of the resin layer 500A and lower than or equal to the allowable temperature limit of the layer 553(i, j) containing a light-emitting material. The fourth electrode 552 is preferably formed at a temperature lower than the heating temperature in the above-described postbake treatment.

Through the above steps, the second self-luminous display element 550(i, j) can be formed. The second self-luminous display element 550(i, j) has a structure in which the third electrode 551(i, j) partly serving as a pixel electrode, the layer 553(i, j) containing light-emitting material, and the fourth electrode 552 partly serving as a common electrode are stacked.

Although a top-emission light-emitting element is formed as the second self-luminous display element 550(i, j) here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Although not illustrated, an insulating layer may be formed to cover the fourth electrode 552. The insulating layer serves as a protective layer for suppressing diffusion of impurities, such as water, into the second self-luminous display element 550(i, j). The second self-luminous display element 550(i, j) is sealed with the insulating layer.

The insulating layer is formed at a temperature lower than or equal to the allowable temperature limit of the resin layer 500A and lower than or equal to the allowable temperature limit of the second self-luminous display element 550(i, j). The insulating layer is preferably formed at a temperature lower than the heating temperature in the above-described postbake treatment.

Next, the protective layer 560 is formed over the fourth electrode 552. The protective layer 560 can be used as a layer positioned on the outermost surface of the display device. The protective layer 560 preferably has a high visible-light transmitting property.

The above-described organic insulating film that can be used as the insulating film 501C is preferably used as the protective layer 560 because the surface of the display device can be prevented from being damaged or cracked.
<Attachment of Structure Body 601D and Structure Body 601A>

FIG. 5B illustrates an example in which the structure body 601D is attached to the protective layer 560 with the bonding layer 505.

As the bonding layer 505, various curable adhesives, such as a reactive curable adhesive, a thermosetting adhesive, an anaerobic adhesive, and a photo-curable adhesive, such as an ultraviolet curable adhesive, can be used. Alternatively, an adhesive sheet or the like may be used.
<Separation of Substrate 500>

Figure 6A:
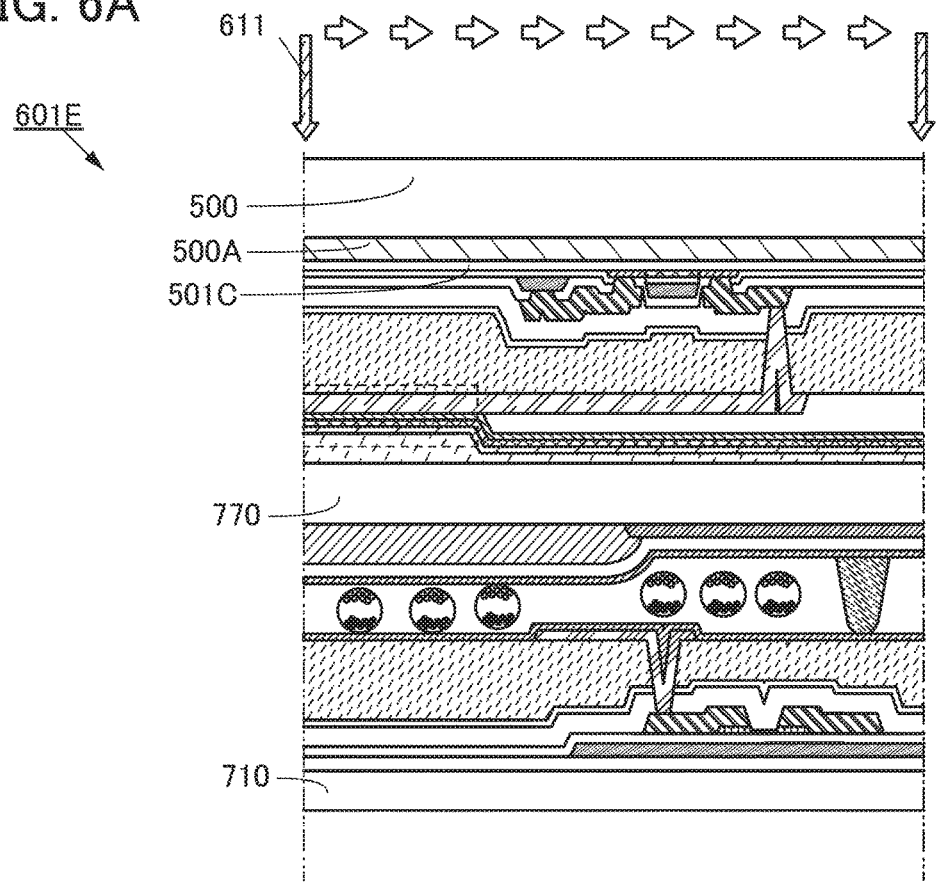
FIGS. 6A and 6B are each a cross-sectional view of a structure body included in a display device of one embodiment of the present invention.

Next, the resin layer 500A is irradiated with laser light 611 through the substrate 500. The laser light 611 is, for example, a linear laser beam with which scanning is performed from the left side to the right side in FIG. 6A, and the major axis is perpendicular to the scanning direction and the incident direction (from top to bottom).

The resin layer 500A absorbs the laser light 611.

With irradiation with the laser light 611, the resin layer 500A is weakened. Alternatively, with irradiation with the laser light 611, the adhesion between the resin layer 500A and the substrate 500 is decreased.

As the laser light 611, light, at least part of which has a wavelength at which the light passes through the substrate 500 and the light is absorbed by the resin layer 500A, is used. The laser light 611 is preferably light with a wavelength range from visible light to ultraviolet light. For example, light with a wavelength in a range of 200 nm to 400 nm, preferably a range of 250 nm to 350 nm can be used. In particular, an excimer laser with a wavelength of 308 nm is preferably used because the productivity is increased. An excimer laser is used for LTPS laser crystallization and an apparatus for an existing LTPS manufacturing line can be used; thus, new capital investment is not needed, which is preferable. A solid-state UV laser (also referred to as a semiconductor UV laser), such as a UV laser with a wavelength of 355 nm that is the third harmonic of a Nd:YAG laser, may also be used. A solid-state laser is preferable because the solid-state laser does not use a gas and thus the running cost can be reduced to approximately 1/3 of the case of an excimer laser. A pulsed laser, such as a picosecond laser, may also be used.

In the case where linear laser light is used as the laser light 611, the substrate 500 and a light source are relatively moved, scanning is performed with the laser light 611, and a region that is desirably separated is irradiated with the laser light 611.

Next, the substrate 500 is separated from the structure body 601E.

For example, the substrate 500 can be separated from the structure body 601E by applying perpendicular pulling force to the substrate 500. Specifically, the substrate 500 can be peeled by attaching a mechanism to part of the top surface of the substrate 500 and pulling up the substrate 500.

By inserting a sharp instrument, such as a knife, between the substrate 500 and the insulating film 501C, the separation starting point may be formed. Alternatively, by making a cut in the resin layer 500A with a sharp instrument, the separation starting point may be formed.

The position of the separation surface may vary depending on the materials and the formation methods of the resin layer 500A, the substrate 500, and the like, the conditions of light irradiation, and the like.

Although the resin layer 500A serves as a protective layer of the structure body 601E, the resin layer 500A may be completely removed in consideration of transmittance and the like.

Figure 6B:
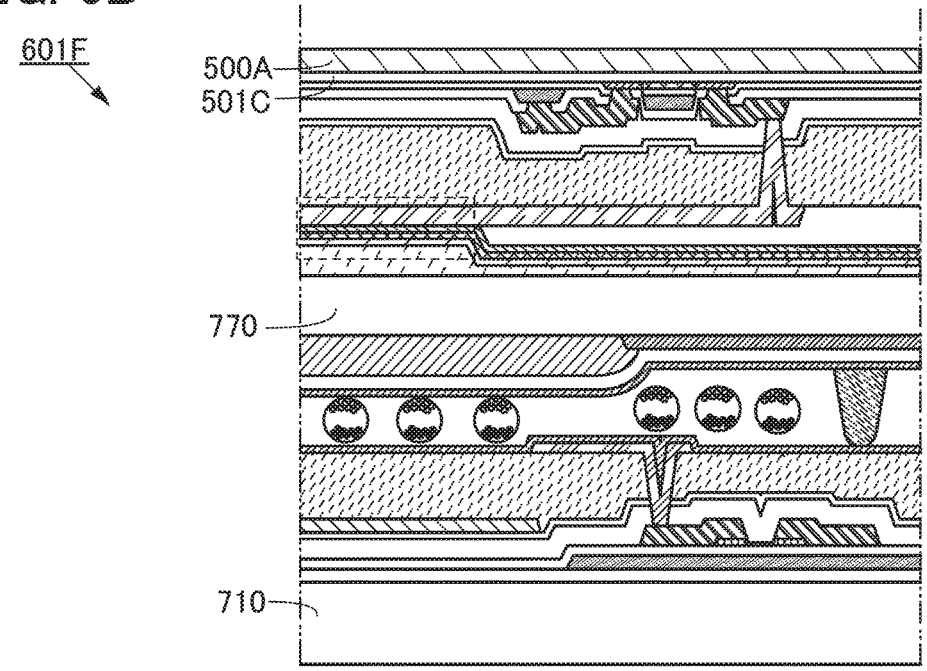

Thus, a structure body 601F illustrated in FIG. 6B can be obtained. Through the above steps, a display device can be manufactured in which a reflective display element is formed over a substrate so that light is reflected in the direction of a plane on which a self-luminous display element is formed and the self-luminous display element is formed over the reflective display element.

Note that this embodiment can be combined with any of the other embodiments in this specification as appropriate.

Embodiment 4

In this embodiment, a display device of one embodiment of the present invention, which has a structure different from that illustrated in FIGS. 3A to 3C, will be described.

Structure Example 2 of Display Device

Figure 7:
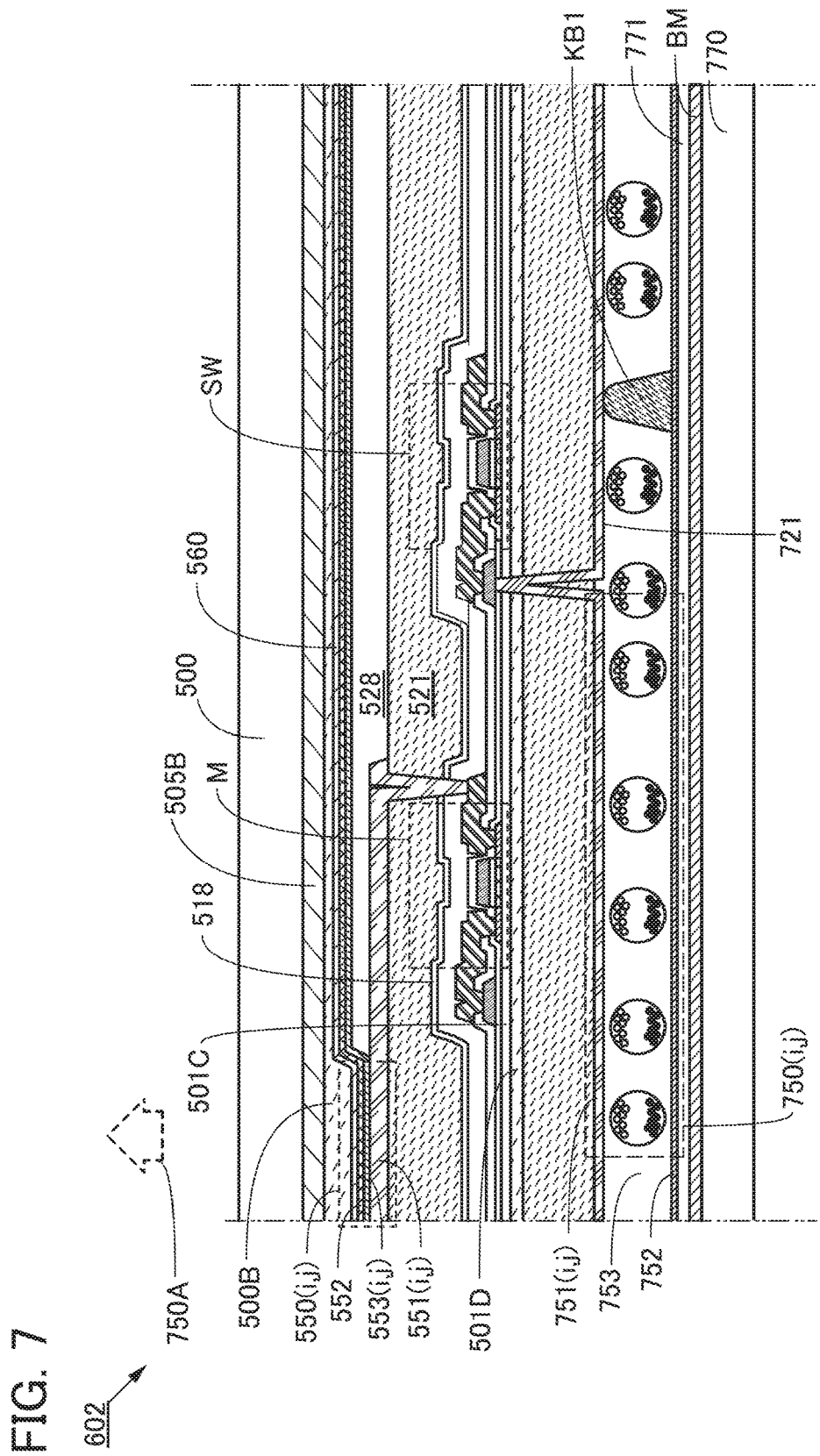
FIG. 7 is a cross-sectional view of a structure body included in a display device of one embodiment of the present invention.

FIG. 7 illustrates a structure body 602, some components of which are different from those of the structure body 601. The first electrode 751(i, j) and the second electrode 752 are arranged to face each other also in the structure body 602.

A display panel including the structure body 602 illustrated in FIG. 7, which is one embodiment of the present invention, includes the substrate 770.

Display of the first display element 750(i, j) is controlled by the transistor SW. Display of the second display element 550(i, j) is controlled by the transistor M. A semiconductor layer of each of the transistor SW and the transistor M is formed in contact with the insulating film 501C.

The layer 753 including electrophoretic particles is provided between the transistor SW and the substrate 770 or between the transistor M and the substrate 770. In other words, the first display element 750(i, j) is provided between the insulating film 501C and the substrate 770.

The display device including the structure body 602, which is one embodiment of the present invention and in which the transistor SW and the transistor M are manufactured using the same material to have the same structure, can be manufactured in a small number of steps as compared with the display device including the structure body 601, so that high productivity can be obtained.

A method for manufacturing the structure body 602 will be described with reference to FIGS. 8A and 8B.

Figure 8A:
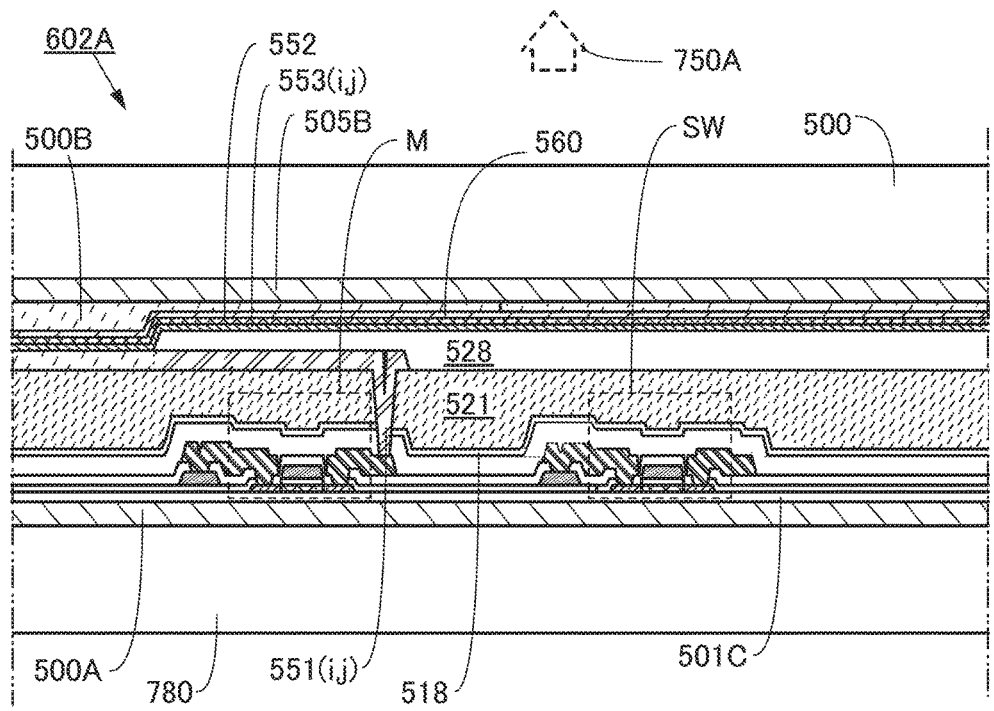
FIGS. 8A and 8B are each a cross-sectional view of a structure body included in a display device of one embodiment of the present invention.

In a method for manufacturing a structure body 602A illustrated in FIG. 8A, the resin layer 500A is formed over a substrate 780 first. As in the case of the structure body 601, the resin layer 500A is preferably formed using a photosensitive polyimide resin. Next, the transistor SW and the transistor M are formed over the insulating film 501C in manners similar to those of the transistors SW and M in the structure body 601. The transistors SW and M are formed at a temperature lower than or equal to the allowable temperature limit of a polyimide resin. For example, a transistor using a metal oxide for a semiconductor film can be used.

Next, the insulating layer 518 and the insulating layer 521 are formed. An opening is formed in the insulating layer 518 and the insulating layer 521, and then the third electrode 551(i, j) is formed. After the insulating film 528 is formed, the layer 553(i, j) containing a light-emitting material and the fourth electrode 552 are formed.

Next, the protective layer 560 and a resin layer 500B are formed and the substrate 500 is bonded with a bonding layer 505B. Consequently, the structure body 602A is formed. Although the resin layer 500B and the bonding layer 505B are formed in the structure body 602A, only the bonding layer 505B may be formed.

Here, irradiation with the laser light 611 (not illustrated) is performed from the substrate 780 side of the structure body 602A. The resin layer 500A is formed using a material that facilitates separation caused by the irradiation with the laser light 611 more than the material used for the resin layer 500B. Thus, the substrate 780 is separated from the structure body 602A at the resin layer 500A.

Figure 8B:
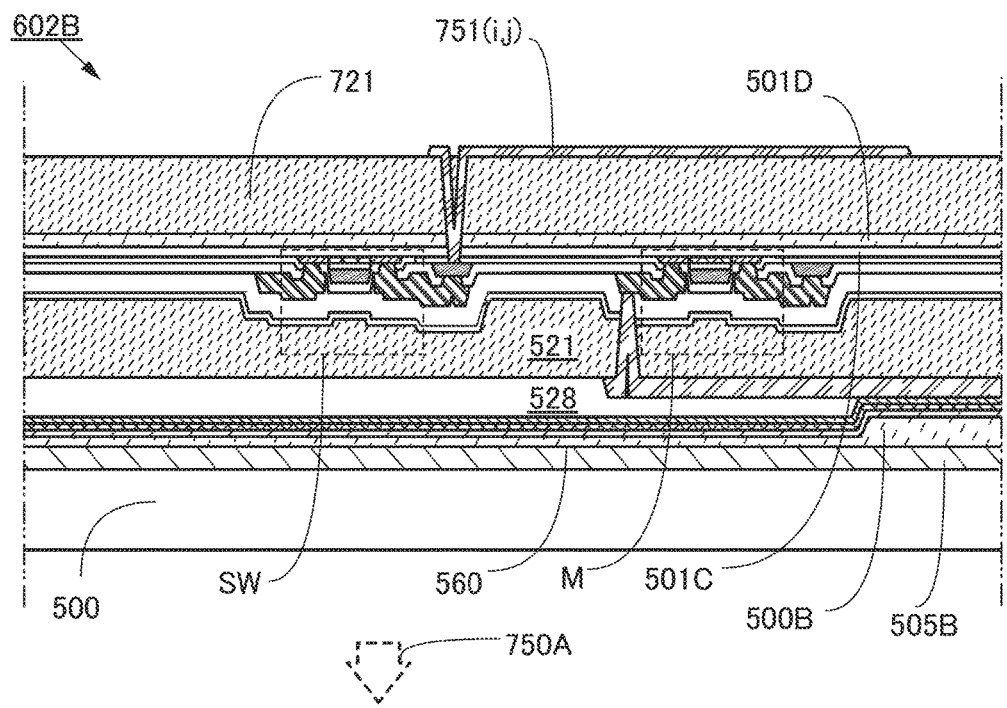

After the resin layer 500A is removed by oxygen plasma treatment or the like, an insulating layer 501D is formed in contact with the exposed insulating film 501C (see FIG. 8B). The insulating layer 501D is formed to perform planarization and prevent diffusion of impurities. The same material as the insulating film 501C can be used for the insulating layer 501D. Note that the insulating layer 501D is not necessarily formed in the case where planarization and prevention of diffusion of impurities are not needed.

Next, the insulating film 721 is formed. The insulating film 721 is provided to perform planarization and prevent diffusion of impurities.

An opening is formed in the insulating film 721 and the insulating layer 501D, and the first electrode 751(i, j) is formed to be electrically connected to the source electrode or the drain electrode of the transistor SW. Thus, a structure body 602B is obtained.

The first electrode 751(i, j) is formed over the substrate 500. The second electrode 752 is electrically connected to a wiring through which a common potential is supplied.

Then, in a manner similar to that in the case of fabricating the structure body 601, the substrate 770 and the substrate 500 are bonded to each other with a binder in which microcapsules including electrophoretic particles have been dispersed and fixed in advance, and the layer 753 including electrophoretic particles is formed between the substrate 500 and the substrate 770 provided with the coloring film CF. Through such steps, the structure body 602 is obtained.

Structure Example 3 of Display Device

Figure 9:
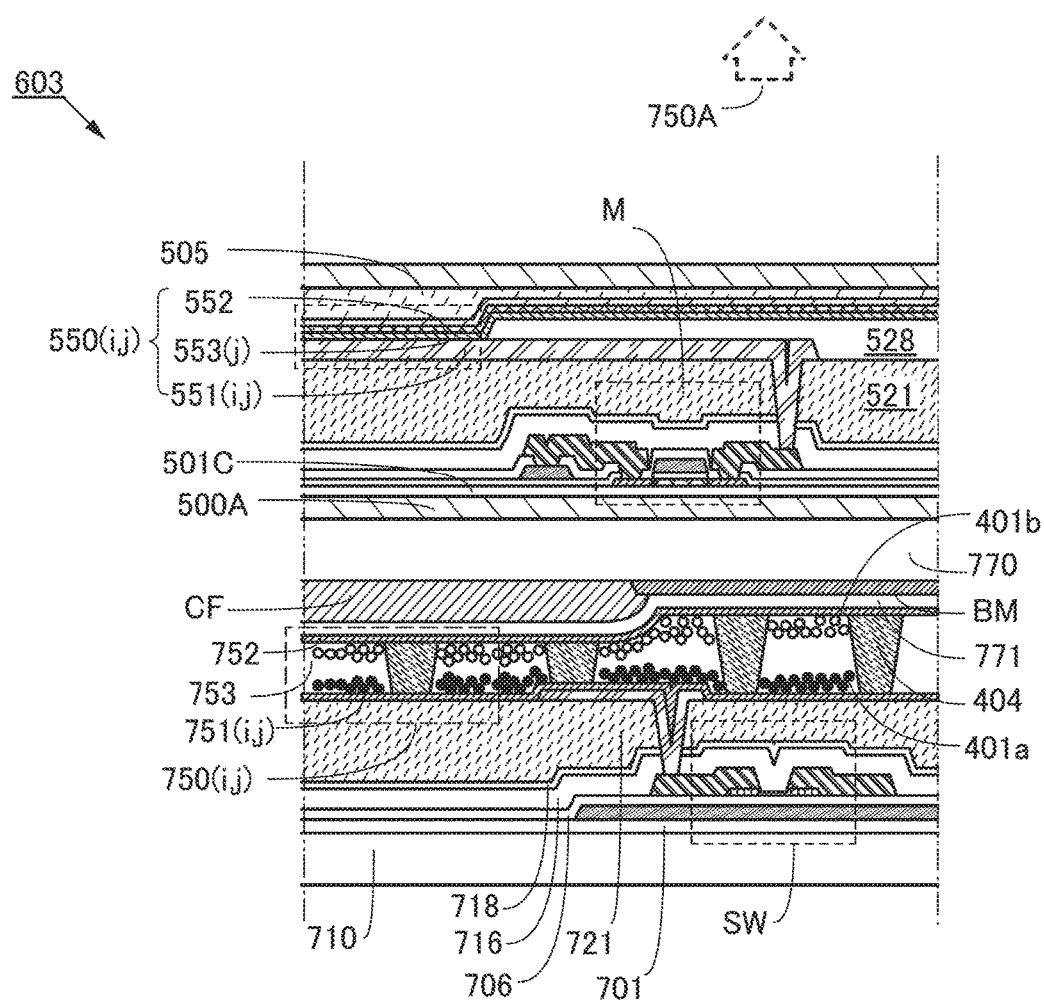
FIG. 9 is a cross-sectional view of a structure body included in a display device of one embodiment of the present invention.

FIG. 9 illustrates a structure body 603, some components of which are different from those of the structure body 601. Also in the structure body 603, the first electrode 751(i, j) and the second electrode 752 are provided to face each other.

A display panel including the structure body 603, which is one embodiment of the present invention, includes the substrate 710 and the substrate 770.

Display of the first display element 750(i, j) is controlled by the transistor SW. Display of the second display element 550(i, j) is controlled by the transistor M. A semiconductor layer of the transistor M is formed in contact with the insulating film 501C. A semiconductor layer of the transistor SW is formed in contact with the insulating film 706.

In the structure body 603, the insulating film 501C is provided between the first display element 750(i, j) and the second display element 550(i, j). The insulating film 706 is provided between the first display element 750(i, j) and the substrate 710.

FIG. 9 illustrates a reflective display element using a microcup, in which the partition layers 404 are provided and the particles 401a and the particles 401b are provided therebetween. The particles 401a and the particles 401b are colored in different colors from each other. As well as a system using microcapsules, this system using a microcup can be used for the reflective display element of one embodiment of the present invention.

Structure Example 4 of Display Device

Figure 10:
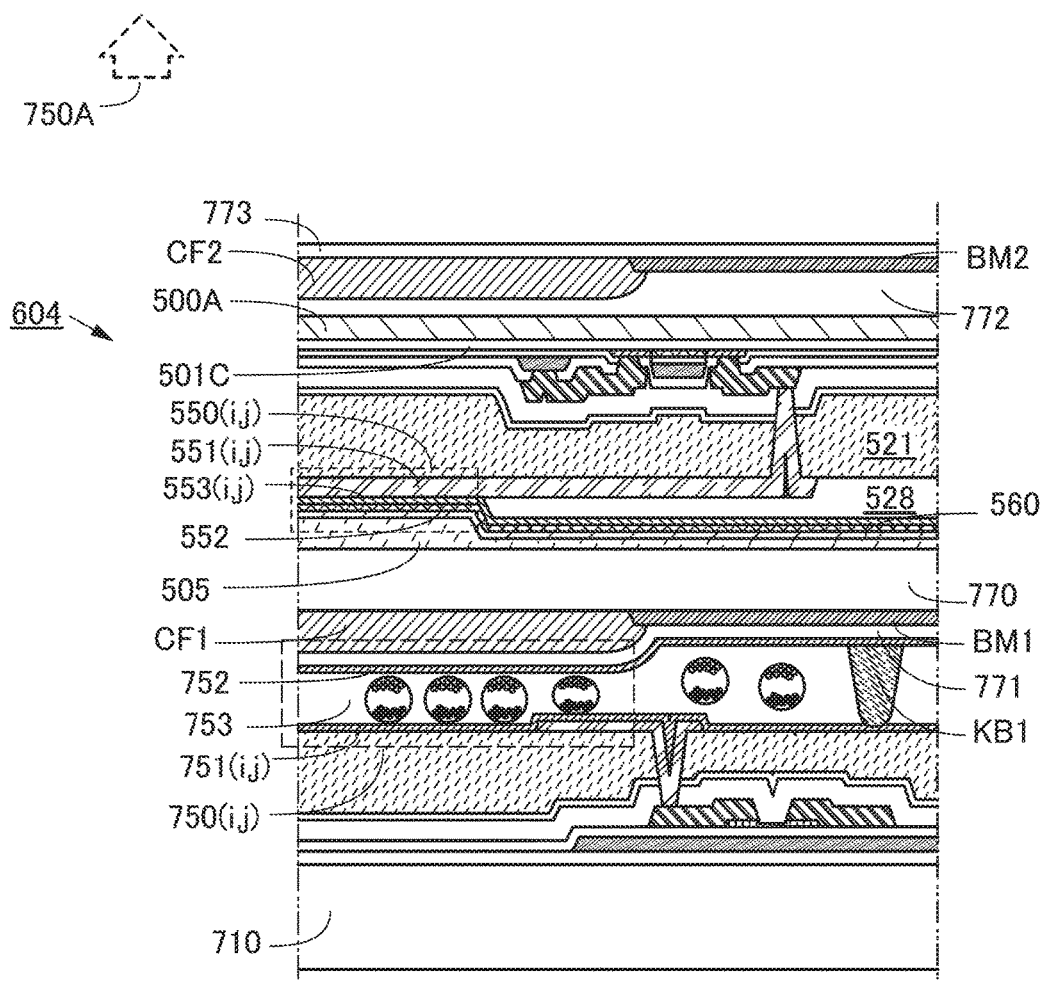
FIG. 10 is a cross-sectional view of a structure body included in a display device of one embodiment of the present invention.

FIG. 10 illustrates a structure body 604, some components of which are different from those of the structure body 603.

In a display panel including the structure body 604 of one embodiment of the present invention, the coloring film CF2 and a light-blocking film BM2 are formed in contact with an insulating film 772. There is a region where two coloring films and two light-blocking films, that is, the coloring film CF1 and a light-blocking film BM1 which are formed in contact with the substrate 770 and the coloring film CF2 and the light-blocking film BM2, overlap with each other in the direction perpendicular to the substrate.

In the structure body 604, the second display element 550(i, j) can be a self-luminous display element that emits white light. When a plurality of coloring films are provided, the color purity of desired light can be improved.

In each of the structure bodies including display elements of embodiments of the present invention, a reflective display element is formed over a substrate so that light is reflected in the direction of a plane on which a self-luminous display element is formed and the self-luminous display element is formed over the reflective display element. One embodiment of the present invention is a structure body having such a structure, and the coloring film, the transistor M, and the transistor SW may be formed in any positions in the structure body.

A structure body including a display element of one embodiment of the present invention preferably includes a photosensitive resin and is preferably manufactured through a separation step using laser treatment.

The structure described in this embodiment can be combined with any of the other embodiments as appropriate.

Embodiment 5

In this embodiment, the structure of a display panel 700 which can be used in the display device described in Embodiment 1 will be described.

Figure 11:
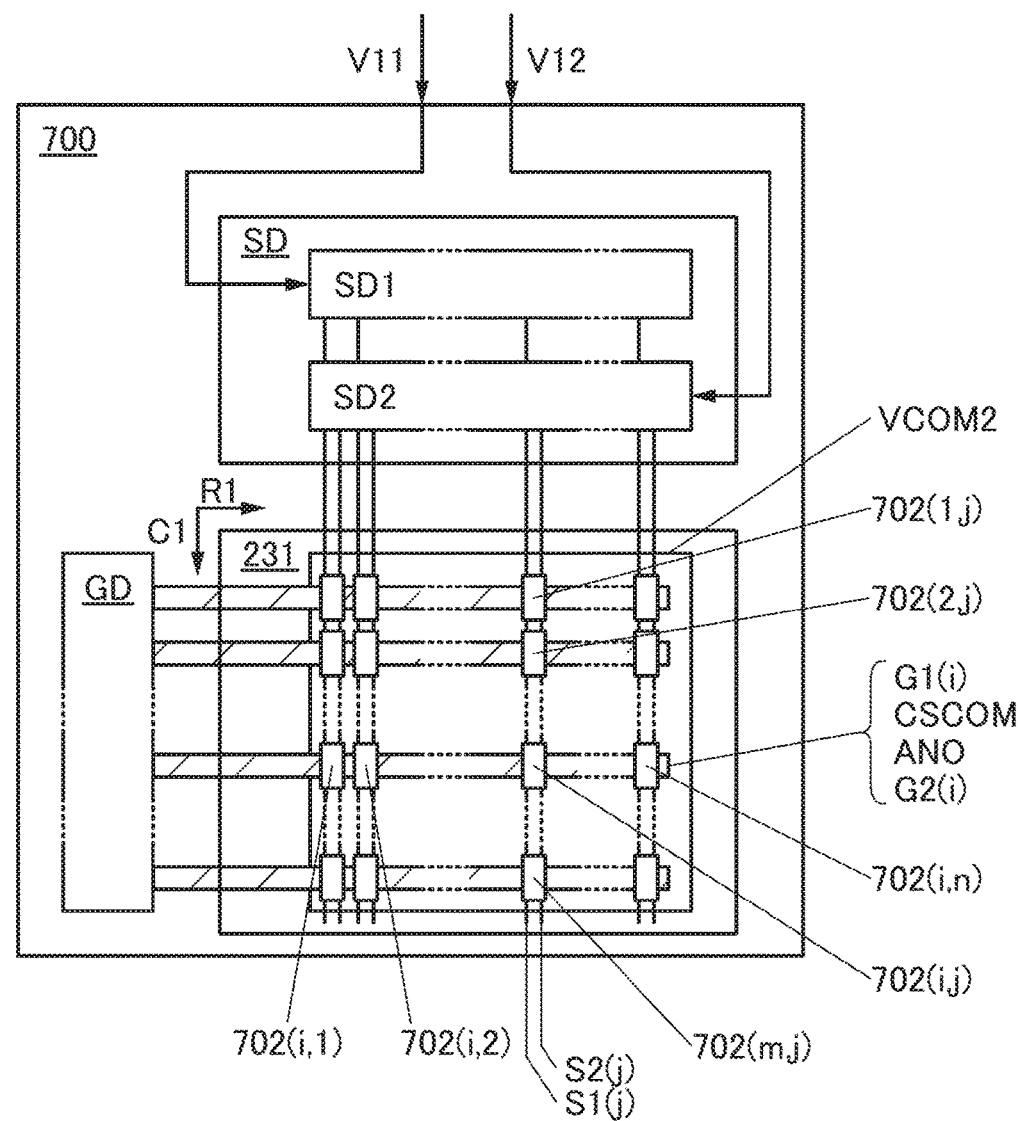
FIG. 11 is a block diagram illustrating the structure of a display device of an embodiment.

FIG. 11 is a block diagram illustrating the structure of the display device of one embodiment of the present invention. The display device includes a display panel.

Figure 12:
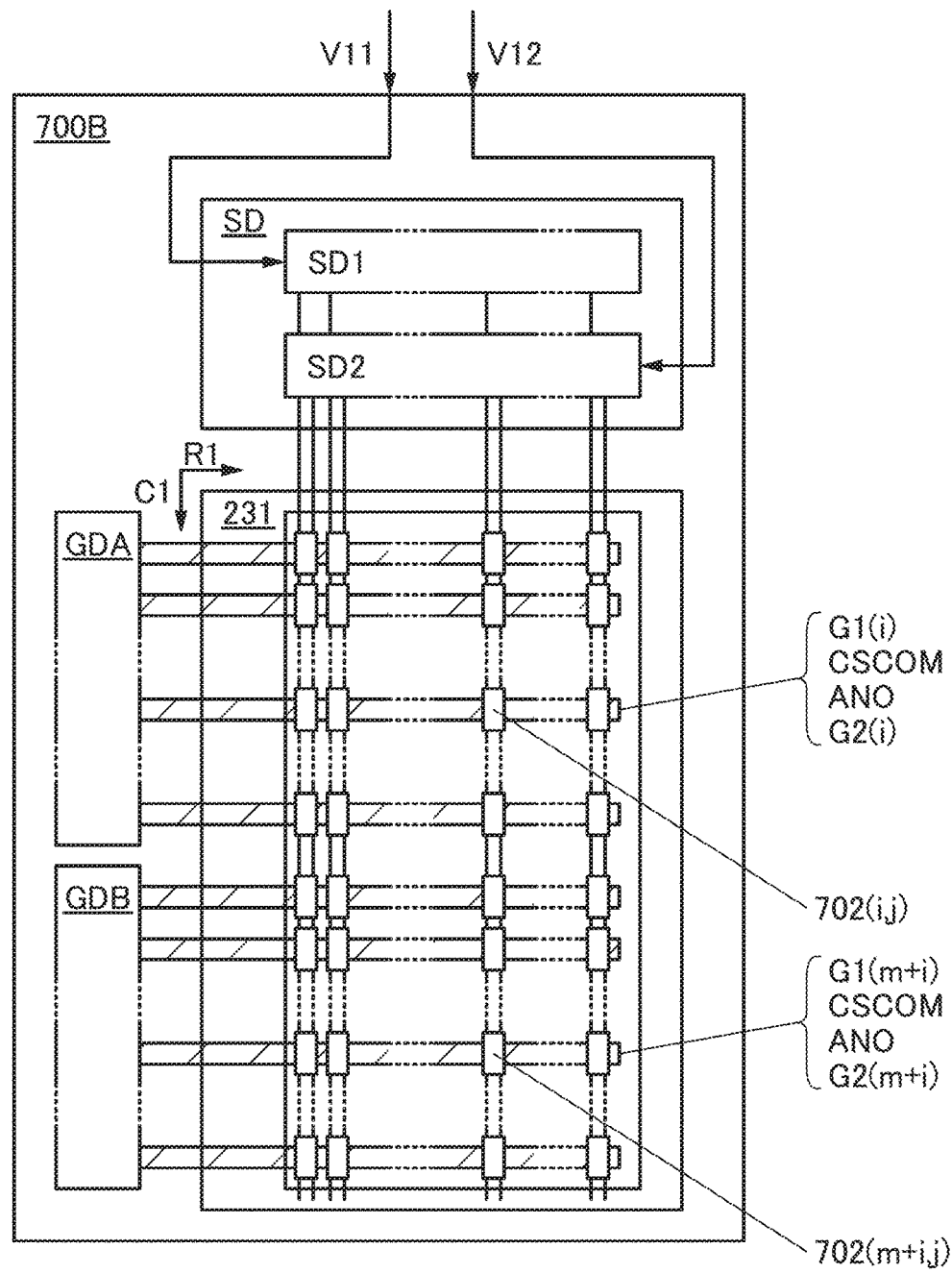
FIG. 12 is a block diagram illustrating the structure of a display portion in an information processing device of an embodiment.

FIG. 12 is a block diagram illustrating the structure of the display panel included in the display device of one embodiment of the present invention. FIG. 12 is a block diagram illustrating a structure different from that in FIG. 11.

Figure 13A:
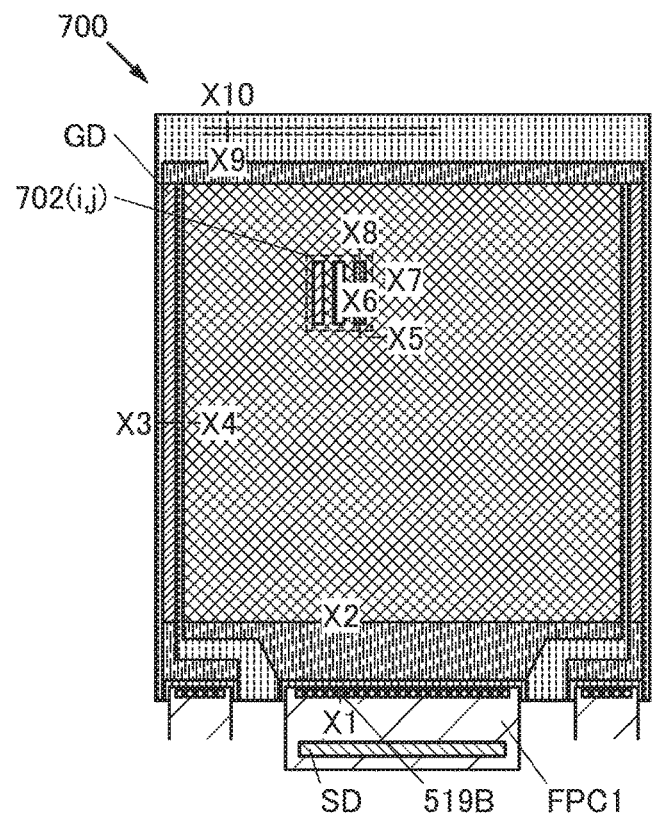
FIGS. 13A to 13C illustrate the structure of a display panel that can be used in a display device of an embodiment.
Figure 13B:
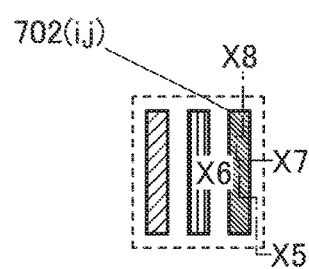
Figure 13C:
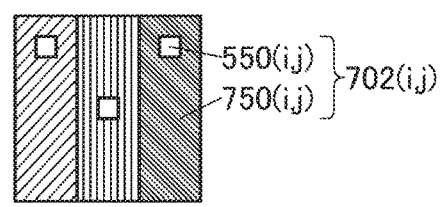

FIGS. 13A to 13C each illustrate the structure of the display panel which can be used in the display device of one embodiment of the present invention. FIG. 13A is a top view of the display panel. FIG. 13B is a top view illustrating part of a pixel of the display panel illustrated in FIG. 13A. FIG. 13C is a schematic view illustrating the structure of the pixel illustrated in FIG. 13B.

Figure 14A:
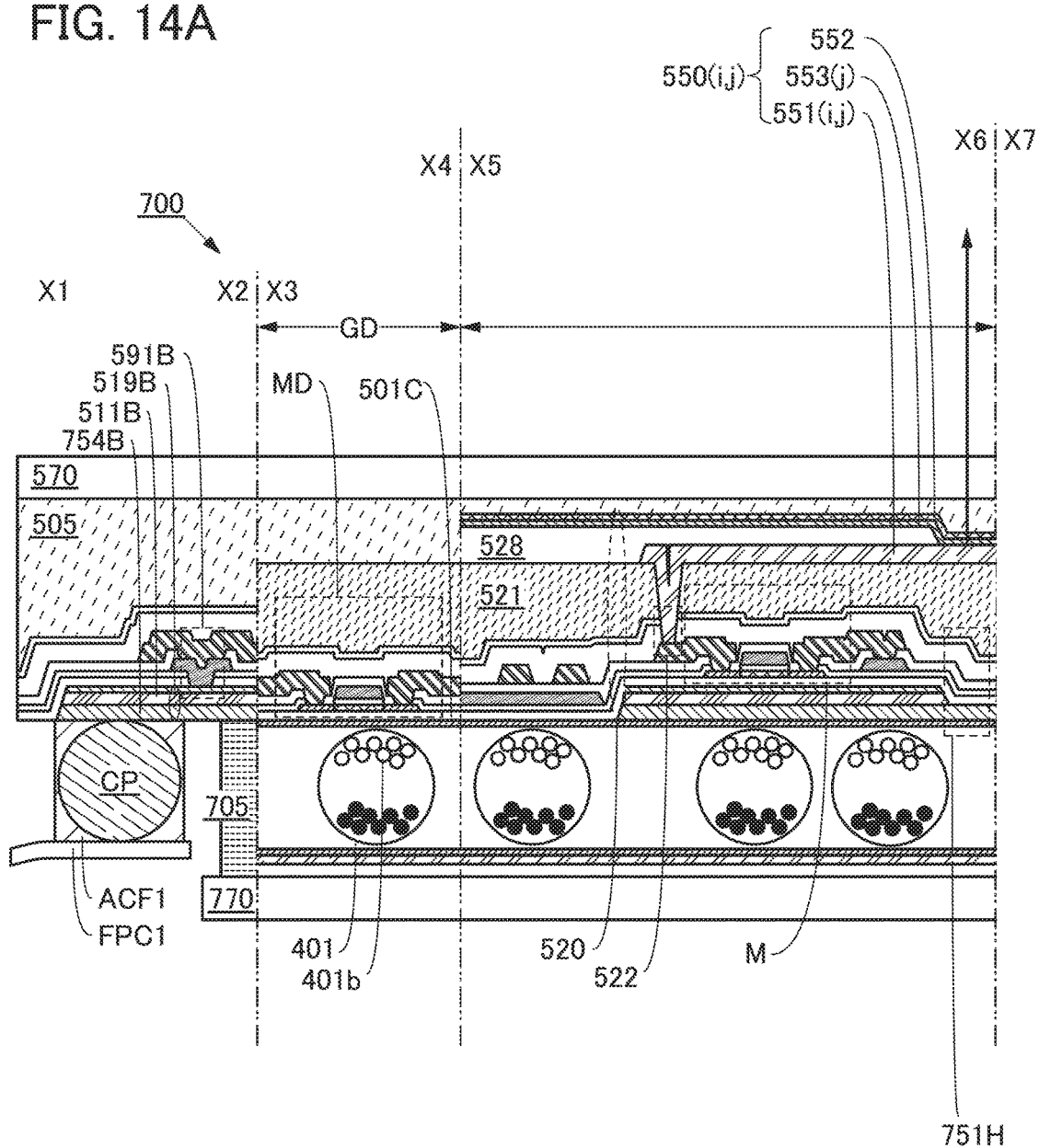
FIGS. 14A and 14B are cross-sectional views illustrating the structure of a display panel that can be used in a display device of an embodiment.
Figure 14B:
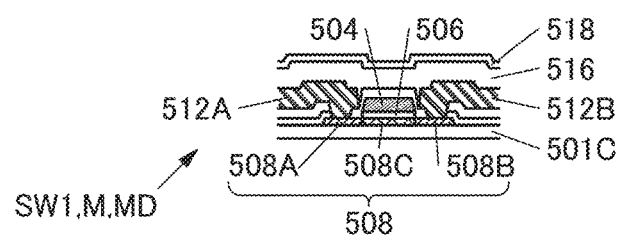
Figure 15:
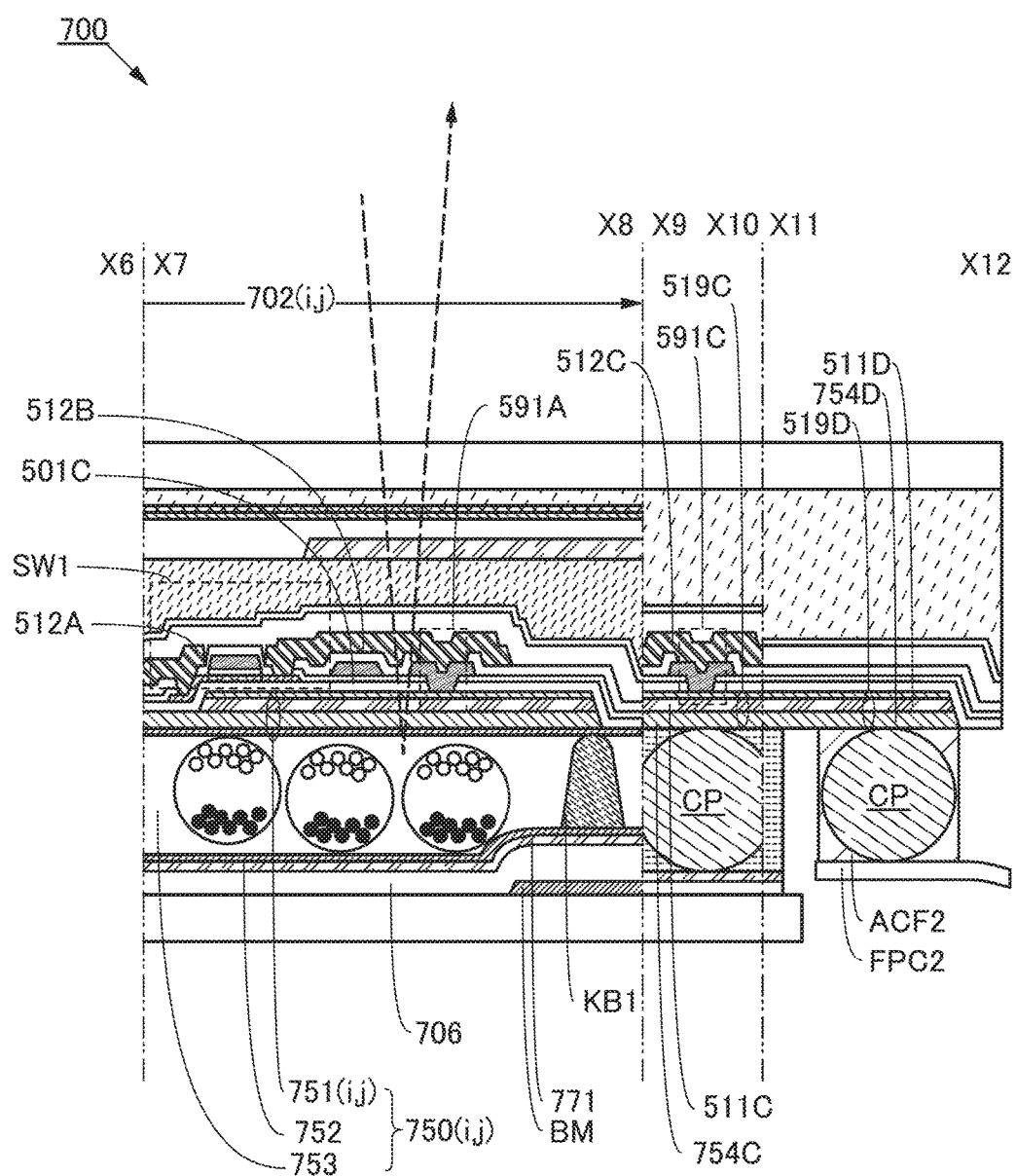
FIG. 15 is a cross-sectional view illustrating the structure of a display panel that can be used in a display device of an embodiment.

FIGS. 14A and 14B and FIG. 15 are cross-sectional views each illustrating the structure of the display panel. FIG. 14A is a cross-sectional view taken along lines X1-X2, X3-X4, and X5-X6 in FIG. 13A. FIG. 14B illustrates part of FIG. 14A.

FIG. 15 is a cross-sectional view taken along lines X7-X8 and X9-X10 in FIG. 13A.

Figure 17:
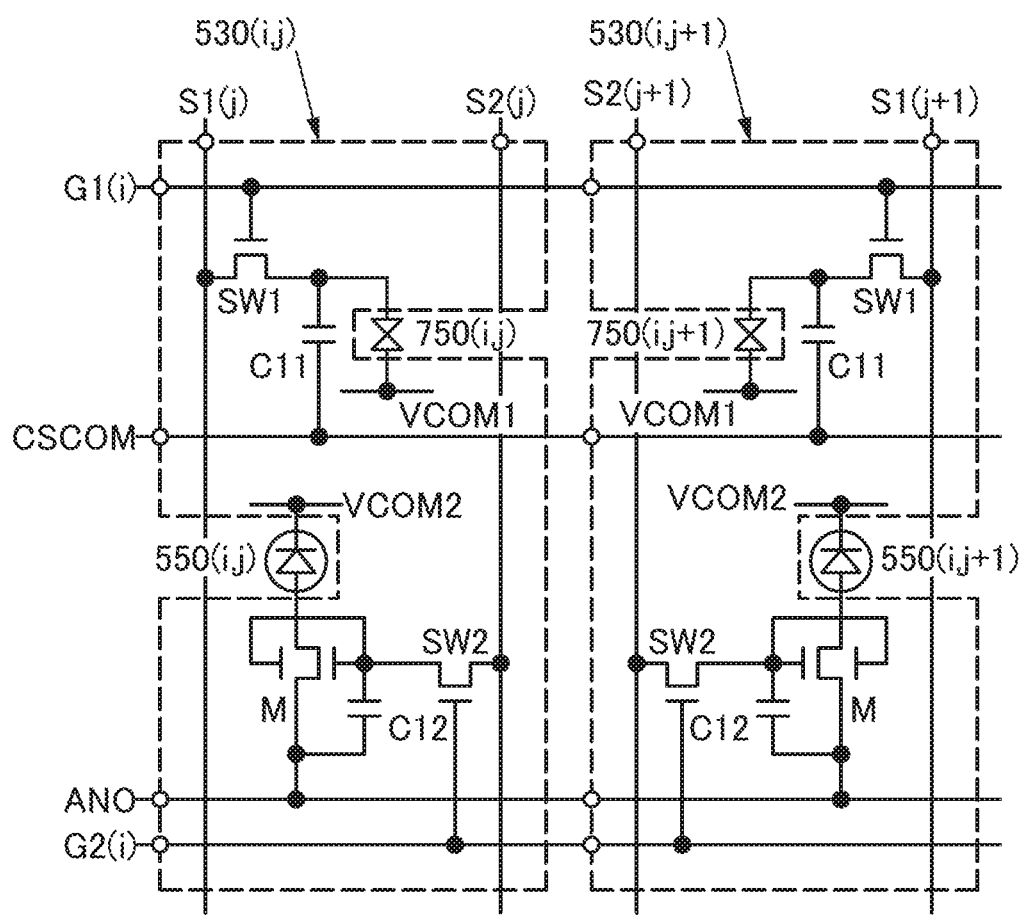
FIG. 17 is a circuit diagram illustrating a pixel circuit of a display panel that can be used in a display device of an embodiment.

FIG. 17 is a circuit diagram illustrating the structure of a pixel circuit included in the display panel of one embodiment of the present invention.

Note that in this specification, an integral variable of 1 or more may be used for reference numerals. For example, "(p)" where p is an integral value of 1 or more may be used for part of a reference numeral that specifies any one of components (p components at a maximum). For another example, "(m, n)" where m and n are each an integral value of 1 or more may be used for part of a reference numeral that specifies any one of components (m×n components at a maximum).

The display panel 700 described in this embodiment includes a display region 231 (see FIG. 11). Note that the display panel 700 includes a driver circuit GD or the driver circuit SD. The display panel 700 has a function of receiving information V11 and information V12 from an arithmetic device or the like. The arithmetic device can generate the information V11 and the information V12, so that the display panel 700 can display images and the like by a desired display method, in which, for example, the information V11 includes moving image information and the information V12 includes still image information. In the display panel 700, a first display element performs display on the basis of the information V11, and a second display element performs display on the basis of the information V12.

The display panel can include a plurality of driver circuits. For example, a display panel 700B can include a driver circuit GDA and a driver circuit GDB (see FIG. 12).

<Display Region 231>

The display region 231 includes a group of pixels 702(i, 1) to 702(i, n), another group of pixels 702(1, j) to 702(m, j), and a scan line G1(i) (see FIG. 11 or FIG. 17). The display region 231 includes a scan line G2(i), a wiring CSCOM, a third conductive film ANO, a signal line S1(j), and a signal line S2(j). Note that i is an integer greater than or equal to 1 and less than or equal to m, j is an integer greater than or equal to 1 and less than or equal to n, and each of m and n is an integer greater than or equal to 1.

The group of pixels 702(i, 1) to 702(i, n) include the pixel 702(i, j) and are provided in the row direction (the direction indicated by an arrow R1 in the drawing).

The group of pixels 702(1, j) to 702(m, j) include the pixel 702(i, j) and are provided in the column direction (the direction indicated by an arrow C1 in the drawing) that intersects the row direction.

The scan line G1(i) and the scan line G2(i) are electrically connected to the group of pixels 702(i, 1) to 702(i, n) provided in the row direction.

The group of pixels 702(1, j) to 702(m, j) arranged in the column direction are electrically connected to the signal line S1(j) and the signal line S2(j).

<Driver Circuit GD>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, a moving image can be smoothly displayed.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed.

For example, in the case where a plurality of driver circuits are provided, the driver circuits GDA and GDB may supply selection signals at different frequencies. Specifically, the selection signal can be supplied at a higher frequency to a region where moving images are smoothly displayed than to a region where a still image is displayed in the state where flickering is suppressed.

<Driver Circuit SD, Driver Circuit SD1, and Driver Circuit SD2>

The driver circuit SD includes a driver circuit SD1 and a driver circuit SD2. The driver circuit SD1 has a function of supplying an image signal on the basis of the information V11. The driver circuit SD2 has a function of supplying an image signal on the basis of the information V12 (see FIG. 11).

The driver circuit SD1 has a function of generating an image signal to be supplied to a pixel circuit electrically connected to a display element. Specifically, the driver circuit SD1 has a function of generating a signal whose polarity is inverted.

The driver circuit SD2 has a function of generating an image signal to be supplied to a pixel circuit electrically connected to another display element which performs display by a method different from that of the above display element. The driver circuit SD2 can drive, for example, an organic EL element.

For example, any of a variety of sequential circuits, such as a shift register, can be used as the driver circuit SD.

For example, an integrated circuit in which the driver circuit SD1 and the driver circuit SD2 are integrated can be used as the driver circuit SD. Specifically, an integrated circuit formed on a silicon substrate can be used as the driver circuit SD.

For example, the integrated circuit can be mounted on a terminal by a chip on glass (COG) method or a chip on film (COF) method. Specifically, an anisotropic conductive film can be used to mount the integrated circuit on a terminal.

Structure Example of Pixel

The pixel 702(i, j) includes the first display element 750(i, j), the second display element 550(i, j), and part of a functional layer 520 (see FIG. 13C, FIG. 14A, and FIG. 15). In this embodiment, the negatively-charged particles 401b, which are electrophoretic particles included in the first display element 750(i, j), can be colored in three kinds of colors in the display device. For example, as the particles 401b, the first display element 750(i, j) includes particles colored in red, a first display element 750(i, j+1) includes particles colored in green, and a first display element 750(i, j+2) includes particles colored in blue (not illustrated). At this time, the display panel 700 can perform color display even when it includes no coloring film.

<Functional Layer>

The functional layer 520 includes a first conductive film, a second conductive film, and the insulating film 501C (see FIGS. 14A and 14B). In addition, the functional layer 520 includes the insulating layer 521, the insulating film 528, the insulating layer 518, and the insulating layer 516. The functional layer 520 also includes a pixel circuit 530(i, j) (see FIG. 14A and FIG. 17).

The functional layer 520 includes a region positioned between a substrate 570 and the substrate 770.

<Insulating Film 501C>

The insulating film 501C includes a region positioned between the first conductive film and the second conductive film and includes an opening 591A (see FIG. 15).

<First Conductive Film>

For example, the first electrode 751(i, j) of the first display element 750(i, j) can be used as the first conductive film. The first conductive film is electrically connected to the first electrode 751(i, j).

<Second Conductive Film>

For example, the conductive film 512B can be used as the second conductive film. The second conductive film includes a region overlapping with the first conductive film. The second conductive film is electrically connected to the first conductive film through the opening 591A (see FIG. 15). Note that the first conductive film electrically connected to the second conductive film through the opening 591A that is formed in the insulating film 501C can be referred to as a through electrode.

The second conductive film is electrically connected to the pixel circuit 530(i, j). For example, a conductive film which serves as a source electrode or a drain electrode of a transistor used as a switch SW1 of the pixel circuit 530(i, j) can be used as the second conductive film.

<Pixel Circuit>

The pixel circuit 530(i, j) has a function of driving the first display element 750(i, j) and the second display element 550(i, j) (see FIG. 17).

A switch, a transistor, a diode, a resistor, an inductor, a capacitor, or the like can be included in the pixel circuit 530(i, j).

For example, one or a plurality of transistors can be used as a switch. Alternatively, a plurality of transistors connected in parallel, in series, or in combination of parallel connection and series connection can be used as a switch.

For example, the pixel circuit 530(i, j) is electrically connected to the signal line S1(j), the signal line S2(j), the scan line G1(i), the scan line G2(i), the wiring CSCOM, and the third conductive film ANO (see FIG. 17). Note that the conductive film 512A is electrically connected to the signal line S1(j) (see FIG. 15 and FIG. 17).

The pixel circuit 530(i, j) includes the switch SW1 and a capacitor C11 (see FIG. 17).

The pixel circuit 530(i, j) includes a switch SW2, the transistor M, and a capacitor C12.

For example, a transistor including a gate electrode electrically connected to the scan line G1(i) and a first electrode electrically connected to the signal line S1(j) can be used as the switch SW1.

The capacitor C11 includes a first electrode electrically connected to a second electrode of the transistor used as the switch SW1 and a second electrode electrically connected to the wiring CSCOM.

For example, a transistor including a gate electrode electrically connected to the scan line G2(i) and a first electrode electrically connected to the signal line S2(j) can be used as the switch SW2.

The transistor M includes a gate electrode electrically connected to the second electrode of the transistor used as the switch SW2 and a first electrode electrically connected to the third conductive film ANO.

Note that a transistor including a conductive film provided such that a semiconductor film is interposed between the gate electrode and the conductive film can be used as the transistor M. For example, as the conductive film, a conductive film electrically connected to a wiring that can supply the same potential as that of the gate electrode of the transistor M can be used.

The capacitor C12 includes a first electrode electrically connected to the second electrode of the transistor used as the switch SW2 and a second electrode electrically connected to the first electrode of the transistor M.

The first electrode and the second electrode of the first display element 750(i, j) are electrically connected to the second electrode of the transistor used as the switch SW1 and a wiring VCOM1, respectively. This enables the first display element 750(i, j) to be driven.

Furthermore, the third electrode 551(i, j) and the fourth electrode 552 of the second display element 550(i, j) are electrically connected to the second electrode of the transistor M and a fourth conductive film VCOM2, respectively. This enables the second display element 550(i, j) to be driven.

<First Display Element 750(i, j)>

For example, a display element having a function of controlling reflection or transmission of light can be used as the first display element 750(i, j). Specifically, a reflective display element can be used as the first display element 750(i, j). Alternatively, a MEMS shutter display element or the like can be used. The use of a reflective display element can reduce power consumption of the display panel.

The first display element 750(i, j) includes the first electrode 751 (i, j), the second electrode 752, and the layer 753 including electrophoretic particles. The second electrode 752 is positioned so that an electric field that controls the arrangement of the electrophoretic particles is generated between the first electrode 751(i, j) and the second electrode 752 (see FIG. 14A and FIG. 15).

<Second Display Element 550(i, j)>

A display element having a function of emitting light can be used as the second display element 550(i, j), for example. Specifically, an organic EL element or the like can be used.

The second display element 550(i, j) has a function of emitting light toward the insulating film 501C (see FIG. 14A).

The second display element 550(i, j) is provided so that the display using the second display element 550(i, j) can be perceived from part of a region from which the display using the first display element 750(i, j) can be perceived. For example, a dashed arrow in the drawing denotes the directions in which external light is incident on and reflected by the first display element 750(i, j) that displays image data by controlling the intensity of external light reflection (see FIG. 15). In addition, a solid arrow in the drawing denotes the direction in which the second display element 550(i, j) emits light to part of the region where display using the first display element 750(i, j) can be perceived (see FIG. 14A).

The second display element 550(i, j) includes the third electrode 551(i, j), the fourth electrode 552, and a layer 553(j) containing a light-emitting material (see FIG. 14A).

The fourth electrode 552 includes a region overlapping with the third electrode 551(i, j).

The layer 553(j) containing a light-emitting material includes a region positioned between the third electrode 551(i, j) and the fourth electrode 552.

The third electrode 551(i, j) is electrically connected to the pixel circuit 530(i, j) at the connection portion 522. Note that the third electrode 551(i, j) and the fourth electrode 552 are electrically connected to the third conductive film ANO and the fourth conductive film VCOM2, respectively (see FIG. 17).

<Intermediate Film>

The display panel described in this embodiment includes an intermediate film 754C and an intermediate film 754D.

The intermediate film 754C includes a region in contact with a conductive film 511C. The intermediate film 754D includes a region in contact with a conductive film 511D.

<Insulating Layer 521, Insulating Film 528, Insulating Layer 518, Insulating Layer 516, and the Like>

The insulating layer 521 includes a region positioned between the pixel circuit 530(i, j) and the second display element 550(i, j).

The insulating film 528 is positioned between the insulating layer 521 and the substrate 570 and includes an opening in a region overlapping with the second display element 550(i, j).

The insulating film 528 formed along the periphery of the third electrode 551(i, j) can prevent a short circuit between the third electrode 551(i, j) and the fourth electrode 552.

The insulating layer 518 includes a region positioned between the insulating layer 521 and the pixel circuit 530(i, j).

The insulating layer 516 includes a region positioned between the insulating layer 518 and the pixel circuit 530(i, j).

<Terminal and the Like>

The display panel described in this embodiment includes a terminal 519B and a terminal 519C.

The terminal 519B includes a conductive film 511B and an intermediate film 754B, and the intermediate film 754B includes a region in contact with the conductive film 511B. The terminal 519B is electrically connected to the signal line S1(j), for example (see FIG. 14A and FIG. 17).

The terminal 519C includes the conductive film 511C and the intermediate film 754C, and the intermediate film 754C includes a region in contact with the conductive film 511C. The conductive film 511C is electrically connected to the wiring VCOM1, for example (see FIG. 15 and FIG. 17).

A conductive material CP is positioned between the terminal 519C and the second electrode 752, and has a function of electrically connecting the terminal 519C and the second electrode 752. For example, a conductive particle can be used as the conductive material CP.

<Substrate and the Like>

The display panel described in this embodiment includes the substrate 570 and the substrate 770.

The substrate 770 includes a region overlapping with the substrate 570. The substrate 770 includes a region provided so that the functional layer 520 is positioned between the substrate 770 and the substrate 570.

<Bonding Layer, Sealing Material, Structure Body, and the Like>

The display panel described in this embodiment also includes the bonding layer 505, a sealing material 705, and the insulator KB1.

The bonding layer 505 includes a region positioned between the functional layer 520 and the substrate 570, and has a function of bonding the functional layer 520 and the substrate 570 together.

The sealing material 705 includes a region positioned between the functional layer 520 and the substrate 770, and has a function of bonding the functional layer 520 and the substrate 770 together.

The insulator KB1 has a function of providing a certain space between the functional layer 520 and the substrate 770. The insulator KB1 also has a function as a partition for separating pixel regions from each other.

<Light-Blocking Film and the Like>

The display panel described in this embodiment includes the light-blocking film BM and the insulating film 771.

The light-blocking film BM includes an opening in a region overlapping with the first display element 750(i, j) (see FIG. 15).

The insulating film 771 includes a region positioned between the light-blocking film BM and the layer 753 including electrophoretic particles.

Examples of Components

The display panel 700 includes the substrate 570, the substrate 770, the insulator KB1, the sealing material 705, or the bonding layer 505.

The display panel 700 also includes the functional layer 520, the insulating layer 521, or the insulating film 528.

The display panel 700 also includes the signal line S1(j), the signal line S2(j), the scan line G1(i), the scan line G2(i), the wiring CSCOM, or the third conductive film ANO (see FIG. 17).

The display panel 700 also includes the first conductive film or the second conductive film.

The display panel 700 also includes the terminal 519B, the terminal 519C, the conductive film 511B, or the conductive film 511C.

The display panel 700 also includes the pixel circuit 530(i, j) or the switch SW1.

The display panel 700 also includes the first display element 750(i, j), the first electrode 751(i, j), the reflective film, the opening, the layer 753 including electrophoretic particles, or the second electrode 752.

The display panel 700 also includes the light-blocking film BM or the insulating film 771.

The display panel 700 also includes the second display element 550(i, j), the third electrode 551(i, j), the fourth electrode 552, or the layer 553(j) containing a light-emitting material.

The display panel 700 also includes the insulating film 501C.

The display panel 700 also includes the driver circuit GD or the driver circuit SD.

<Substrate 570>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material, such as glass, ceramic, or metal, can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, or an SOI substrate can be used as the substrate 570 or the like. Thus, a semiconductor element can be provided on the substrate 570 or the like.

For example, an organic material, such as a resin, a resin film, or plastic, can be used for the substrate 570 or the like. Specifically, a resin film or resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, inorganic material, or the like into a resin film can be used for the substrate 570 or the like. For example, a composite material formed by dispersing a fibrous or particulate resin, organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, or a silicon oxynitride film, are stacked can be used for the substrate 570 or the like.

Specifically, a resin film, a resin plate, a layered material, or the like containing polyester, polyolefin, polyamide, polyimide, polycarbonate, an acrylic resin, or the like can be used for the substrate 570 or the like.

Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the substrate 570 or the like.

Specifically, polyethylene terephthalate (PET), polyethylene naphthalate (PEN), polyethersulfone (PES), acrylic, or the like can be used for the substrate 570 or the like. Alternatively, a cyclo olefin polymer (COP), a cyclo olefin copolymer (COC), or the like can be used.

Alternatively, paper, wood, or the like can be used for the substrate 570 or the like.

For example, a flexible substrate can be used as the substrate 570 or the like.

Note that a transistor, a capacitor, or the like can be directly formed over the substrate. Alternatively, a transistor, a capacitor, or the like formed over a substrate for use in manufacturing processes which can withstand heat applied in the manufacturing process can be transferred to the substrate 570 or the like. Thus, a transistor, a capacitor, or the like can be formed over a flexible substrate, for example.
<Substrate 770>

For example, a light-transmitting material can be used for the substrate 770. Specifically, any of the materials that can be used for the substrate 570 can be used for the substrate 770.

For example, aluminosilicate glass, tempered glass, chemically tempered glass, sapphire, or the like can be favorably used for the substrate 770. This can prevent breakage or damage of the display panel caused by the use.
<Insulator KB1>

The insulator KB1 or the like can be formed using an organic material, an inorganic material, or a composite material of an organic material and an inorganic material, for example. Accordingly, a predetermined space can be provided between components between which the insulator KB1 and the like are provided.

Specifically, for the insulator KB1, polyester, polyolefin, polyamide, polyimide, polycarbonate, polysiloxane, an acrylic resin, or the like, or a composite material of a plurality of resins selected from these can be used. Alternatively, a photosensitive material may be used.
<Sealing Material 705>

For the sealing material 705 or the like, an inorganic material, an organic material, a composite material of an inorganic material and an organic material, or the like can be used.

For example, an organic material, such as a thermally fusible resin or a curable resin, can be used for the sealing material 705 or the like.

For example, an organic material, such as a reactive curable adhesive, a photo-curable adhesive, a thermosetting adhesive, and/or an anaerobic adhesive, can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the sealing material 705 or the like.
<Bonding Layer 505>

For example, any of the materials that can be used for the sealing material 705 can be used for the bonding layer 505.
<Insulating Layer 521>

For example, an insulating inorganic material, an insulating organic material, or an insulating composite material of an inorganic material and an organic material can be used for the insulating layer 521 or the like.

Specifically, an inorganic oxide film, an inorganic nitride film, an inorganic oxynitride film, or a layered material obtained by stacking some of these films can be used for the insulating layer 521 or the like. For example, a film including any of a silicon oxide film, a silicon nitride film, a silicon oxynitride film, an aluminum oxide film, and the like, or a film including a layered material obtained by stacking some of these films can be used for the insulating layer 521 or the like.

Specifically, polyester, polyolefin, polyamide, polyimide, polycarbonate, polysiloxane, an acrylic resin, or the like, a layered or composite material including resins selected from these, or the like can be used for the insulating layer 521 or the like. Alternatively, a photosensitive material may be used.

Thus, steps due to various components overlapping with the insulating layer 521, for example, can be covered so that a flat surface can be formed.

<Insulating Film 528>

For example, a material which can be used for the insulating layer 521 can be used for the insulating film 528 or the like. Specifically, a 1-μm-thick polyimide-containing film can be used as the insulating film 528.

<Insulating Film 501A>

A material that can be used for the insulating layer 521 can be used for an insulating film 501A, for example. Alternatively, for example, a material having a function of supplying hydrogen can be used for the insulating film 501A.

Specifically, a material in which a material containing silicon and oxygen and a material containing silicon and nitrogen are stacked can be used for the insulating film 501A. For example, a material having a function of releasing hydrogen by heating or the like to supply the hydrogen to another component can be used for the insulating film 501A. Specifically, a material having a function of releasing hydrogen taken in the manufacturing process, by heating or the like, to supply the hydrogen to another component can be used for the insulating film 501A.

For example, a film containing silicon and oxygen that is formed by a chemical vapor deposition method using silane or the like as a source gas can be used as the insulating film 501A.

Specifically, a material in which a material containing silicon and oxygen with a thickness greater than or equal to 200 nm and less than or equal to 600 nm and a material containing silicon and nitrogen with a thickness of approximately 200 nm are stacked can be used for the insulating film 501A.

<Insulating Film 501C>

For example, any of the materials that can be used for the insulating layer 521 can be used for the insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

<Intermediate Film 754B and Intermediate Film 754C>

For example, a film with a thickness greater than or equal to 10 nm and less than or equal to 500 nm, preferably greater than or equal to 10 nm and less than or equal to 100 nm can be used as the intermediate film 754B or the intermediate film 754C.

For example, a material having a function of allowing hydrogen passage and supplying hydrogen can be used for the intermediate film.

For example, a conductive material can be used for the intermediate film.

For example, a light-transmitting material can be used for the intermediate film.

Specifically, a material containing indium and oxygen, a material containing indium, gallium, zinc, and oxygen, a material containing indium, tin, and oxygen, or the like can be used for the intermediate film. Note that the above material is permeable to hydrogen.

Specifically, a 50- or 100-nm-thick film containing indium, gallium, zinc, and oxygen can be used as the intermediate film.

Note that a material in which films serving as etching stoppers are stacked can be used for the intermediate film. Specifically, a material in which a 50-nm-thick film containing indium, gallium, zinc, and oxygen and a 20-nm-thick film containing indium, tin, and oxygen are stacked in this order can be used for the intermediate film.

<Wiring, Terminal, and Conductive Film>

A conductive material can be used for the wiring or the like. Specifically, a conductive material can be used for the signal line S1($j$), the signal line S2($j$), the scan line G1($i$), the scan line G2($i$), the wiring CSCOM, the third conductive film ANO, the terminal 519B, the terminal 519C, the conductive film 511B, the conductive film 511C, and the like.

For example, an inorganic conductive material, an organic conductive material, a metal, conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film containing graphene oxide is formed and is subjected to reduction, so that a film containing graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conductive high molecule can be used for the wiring or the like.

Note that the terminal 519B can be electrically connected to a flexible printed circuit FPC1 using a conductive material ACF1, for example.

<First Conductive Film and Second Conductive Film>

For example, any of the materials that can be used for the wiring or the like can be used for the first conductive film or the second conductive film.

Alternatively, the first electrode 751(i, j), the wiring, or the like can be used for the first conductive film.

The conductive film 512B serving as the source electrode or the drain electrode of the transistor that can be used for the switch SW1, the wiring, or the like can be used for the second conductive film.

<First Display Element 750(i, j)>

For example, a display element having a function of controlling reflection of light can be used as the first display element 750(i, j).

The first display element 750(i, j) includes the first electrode, the second electrode, and the layer including electrophoretic particles. The arrangement of the electrophoretic particles in the layer including electrophoretic particles can be controlled by a voltage between the first electrode and the second electrode.

<Layer 753 Including Electrophoretic Particles>

For example, the materials given in Embodiment 2 can be used.

<First Electrode 751(i, j)>

For example, a material in which a light-transmitting conductive film and a reflective film including an opening are stacked can be used for the first electrode 751(i, j).

<Second Electrode 752>

For example, a conductive material can be used for the second electrode 752. For example, a material that transmits visible light can be used for the second electrode 752.

For example, a conductive oxide, a metal film thin enough to transmit light, or a metal nanowire can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

The electrode that is away from the plane on which the self-luminous display element is formed, i.e., the first electrode 751(i, j) or the second electrode 752, can be formed using a material used for the wiring or the like, such as a reflective film.

<Coloring Film>

Although not illustrated, the coloring film may be formed using a material that transmits light in a predetermined color. Thus, the coloring film can be used as, for example, a color filter. For example, a material that transmits blue light, green light, or red light can be used for the coloring film. Furthermore, a material that transmits yellow light, white light, or the like can be used for the coloring film.

Note that a material having a function of converting the emitted light to light in a predetermined color can be used for the coloring film. Specifically, quantum dots can be used for the coloring film. Thus, display with high color purity can be achieved.

<Light-Blocking Film BM>

The light-blocking film BM can be formed using a material that prevents light transmission and thus can be used as a black matrix, for example.

<Insulating Film 771>

The insulating film 771 can be formed of polyimide, an epoxy resin, an acrylic resin, or the like, for example.

<Second Display Element 550(i, j)>

A light-emitting element can be used as the second display element 550(i, j), for example. Specifically, an organic electroluminescent element, an inorganic electroluminescent element, a light-emitting diode, or the like can be used as the second display element 550(i, j). For example, a light-emitting organic compound can be used for the layer 553(j) containing a light-emitting material.

For example, quantum dots can be used for the layer 553(j) containing a light-emitting material. Accordingly, the half width becomes narrow, and light in a bright color can be emitted.

A layered material for emitting blue light, green light, or red light can be used for the layer 553(j) containing a light-emitting material, for example.

For example, a belt-like layered material that extends in the column direction along the signal line S2(j) can be used for the layer 553(j) containing a light-emitting material.

Alternatively, a layered material for emitting white light can be used for the layer 553(j) containing a light-emitting material. Specifically, a layered material in which a layer containing a light-emitting material including a fluorescent material that emits blue light, and a layer containing materials that are other than a fluorescent material and that emit green light and red light or a layer containing a material that is other than a fluorescent material and that emits yellow light are stacked can be used for the layer 553(j) containing a light-emitting material.

For example, a material that can be used for the wiring or the like can be used for the third electrode 551(i, j). Specifically, a material that reflects visible light can be used for the third electrode 551(i, j). Alternatively, a material that transmits visible light can be used for the third electrode 551(i, j).

For example, a material that transmits visible light among the materials that can be used for the wiring or the like can be used for the fourth electrode 552.

Specifically, conductive oxide, indium-containing conductive oxide, indium oxide, indium tin oxide, indium zinc oxide, zinc oxide, zinc oxide to which gallium is added, or the like can be used for the fourth electrode 552. Alternatively, a metal film that is thin enough to transmit light can be used for the fourth electrode 552. Further alternatively, a metal film that transmits part of light and reflects another part of light can be used for the fourth electrode 552. Accordingly, the second display element 550(i, j) can have a microcavity structure. As a result, light of a predetermined wavelength can be extracted more efficiently than light of other wavelengths.

<Driver Circuit GD>

Any of a variety of sequential circuits, such as a shift register, can be used as the driver circuit GD. For example, a transistor MD, a capacitor, and the like can be used in the driver circuit GD. Specifically, a transistor including a semiconductor film that can be formed in the same process as the semiconductor film of the transistor M or the transistor which can be used as the switch SW1 can be used.

Note that the transistor MD can have the same structure as the transistor M.

<Transistor>

For example, semiconductor films formed in the same step can be used for transistors in the driver circuit and the pixel circuit.

As the transistor in the driver circuit or the pixel circuit, a bottom-gate transistor or a top-gate transistor can be used, for example.

For example, a manufacturing line for a bottom-gate transistor including amorphous silicon as a semiconductor can easily be remodeled into a manufacturing line for a bottom-gate transistor including a metal oxide as a semiconductor. Furthermore, for example, a manufacturing line for a top-gate transistor including polysilicon as a semiconductor can easily be remodeled into a manufacturing line for a top-gate transistor including a metal oxide as a semiconductor. In any case, a conventional manufacturing line can be effectively used.

For example, a transistor including a semiconductor containing an element belonging to Group 14 for a semiconductor film can be used. Specifically, a semiconductor containing silicon can be used for the semiconductor film. For example, single crystal silicon, polysilicon, microcrystalline silicon, or amorphous silicon can be used for the semiconductor film of the transistor.

Note that the temperature for forming a transistor including polysilicon as a semiconductor is lower than the temperature for forming a transistor including single crystal silicon as a semiconductor.

In addition, the transistor including polysilicon as a semiconductor has higher field-effect mobility than the transistor including amorphous silicon as a semiconductor, thereby achieving a higher aperture ratio. Moreover, pixels arranged at very high resolution, a gate driver circuit, and a source driver circuit can be formed over the same substrate. As a result, the number of components included in an electronic device can be reduced.

The transistor including polysilicon as a semiconductor has higher reliability than the transistor including amorphous silicon as a semiconductor.

Alternatively, a transistor including a compound semiconductor can be used. Specifically, a semiconductor containing gallium arsenide can be used for the semiconductor film.

Alternatively, a transistor including an organic semiconductor can be used. Specifically, an organic semiconductor containing any of polyacenes and graphene can be used for the semiconductor film.

For example, a transistor whose semiconductor film contains a metal oxide can be used. Specifically, a metal oxide containing indium or a metal oxide containing indium, gallium, and zinc can be used for the semiconductor film.

For example, a transistor having a lower leakage current in the off state than a transistor including amorphous silicon for a semiconductor film can be used. Specifically, a transistor including a metal oxide for a semiconductor film can be used.

For example, a transistor including the semiconductor film 508, the conductive film 504, the conductive film 512A, and the conductive film 512B can be used as the switch SW1 (see FIG. 14B). The insulating layer 506 includes a region positioned between the semiconductor film 508 and the conductive film 504.

The conductive film 504 includes a region overlapping with the semiconductor film 508. The conductive film 504 serves as a gate electrode. The insulating layer 506 serves as a gate insulating film.

The conductive film 512A and the conductive film 512B are electrically connected to the semiconductor film 508. The conductive film 512A has one of a function as a source electrode and a function as a drain electrode, and the conductive film 512B has the other.

A conductive film in which a 10-nm-thick film containing tantalum and nitrogen and a 300-nm-thick film containing copper are stacked can be used as the conductive film 504, for example. The film containing copper includes a region provided so that the film containing tantalum and nitrogen is positioned between the film containing copper and the insulating layer 506.

A material in which a 400-nm-thick film containing silicon and nitrogen and a 200-nm-thick film containing silicon, oxygen, and nitrogen are stacked can be used for the insulating layer 506, for example. Note that the film containing silicon and nitrogen includes a region provided so that the film containing silicon, oxygen, and nitrogen is positioned between the film containing silicon and nitrogen and the semiconductor film 508.

For example, a 25-nm-thick film containing indium, gallium, and zinc can be used as the semiconductor film 508.

For example, a conductive film in which a 50-nm-thick film containing tungsten, a 400-nm-thick film containing aluminum, and a 100-nm-thick film containing titanium are stacked in this order can be used as the conductive film 512A or 512B. Note that the film containing tungsten includes a region in contact with the semiconductor film 508.

Note that this embodiment can be combined with any of the other embodiments in this specification as appropriate.

Embodiment 6

In this embodiment, the structure of an input/output device of one embodiment of the present invention will be described with reference to FIG. 19, FIGS. 20A, 20B1, 20B2, and 20C, FIGS. 21A and 21B, and FIG. 22. The input/output device of one embodiment of the present invention has a structure in which the transistor SW and the transistor M are formed between the first display element 750($i, j$) and the second display element 550($i, j$) as in the structure body 602 illustrated in FIG. 7. The first display element 750($i, j$) and the second display element 550($i, j$) are formed between the substrate 770 and the substrate 570. The substrate 570 is provided between a sensing element 775($g, h$) and the second display element 550($i, j$).

Figure 19:
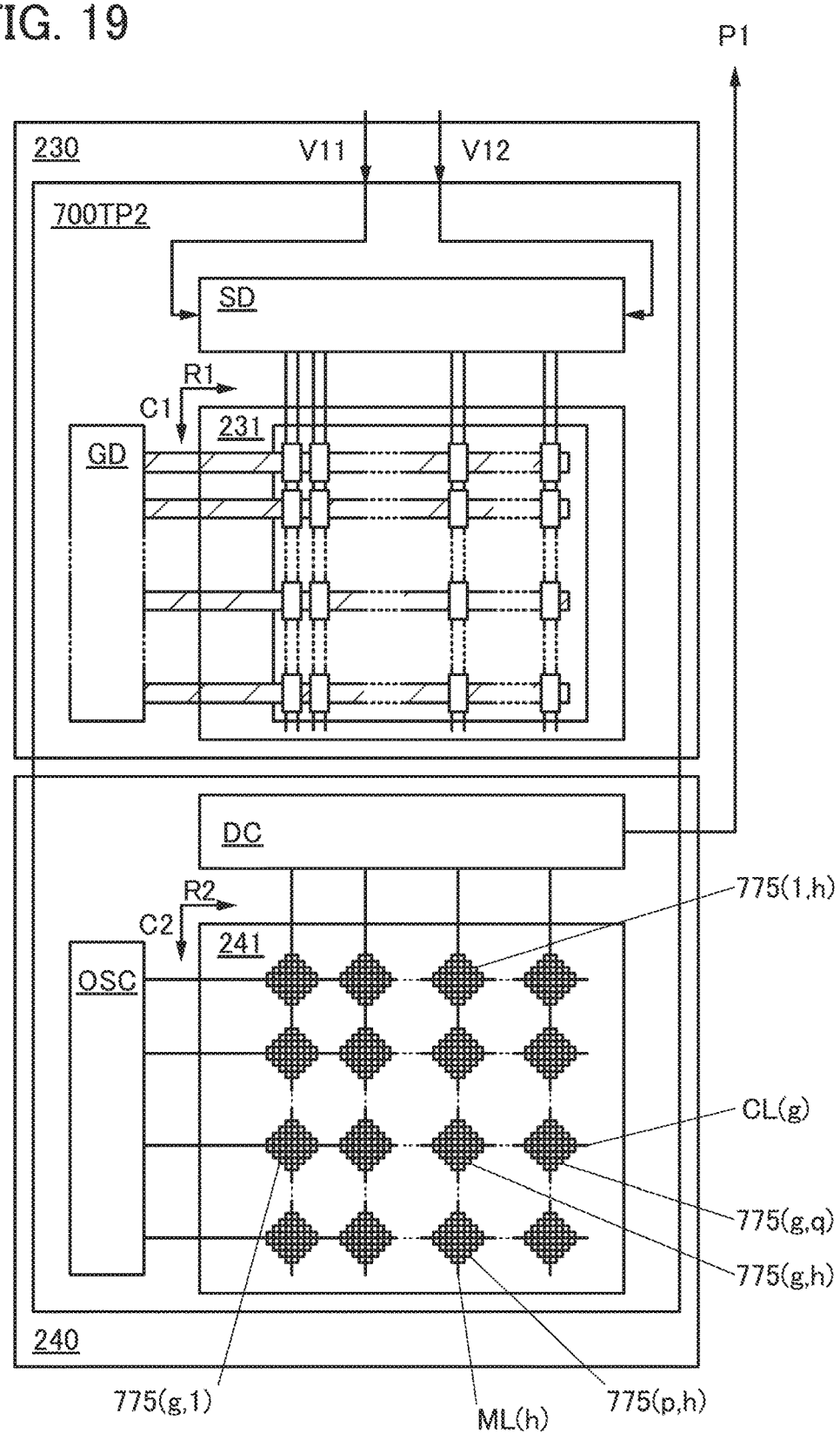
FIG. 19 is a block diagram illustrating the structure of an input portion that can be used in an input/output device of an embodiment.

FIG. 19 is a block diagram illustrating the structure of the input/output device of one embodiment of the present invention.

Figure 20A:
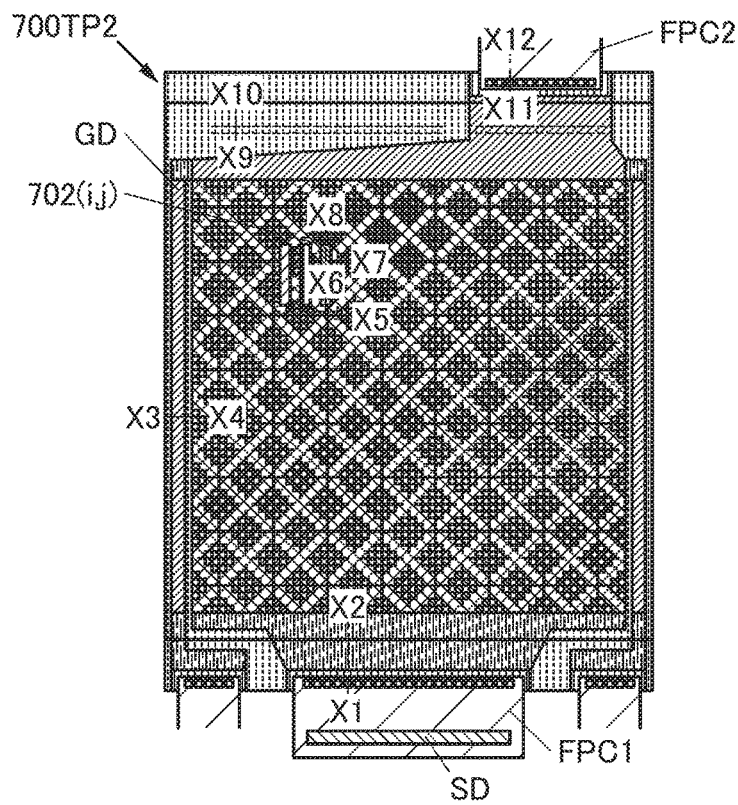
FIGS. 20A, 20B1, 20B2, and 20C illustrate the structure of an input/output panel that can be used in an input/output device of an embodiment.
Figures 1, 20B:
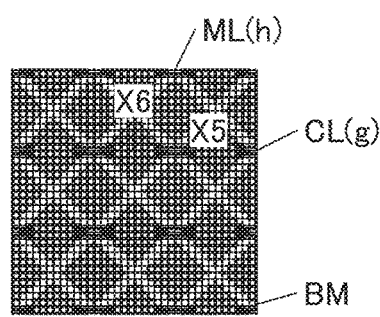
Figures 2, 20B:
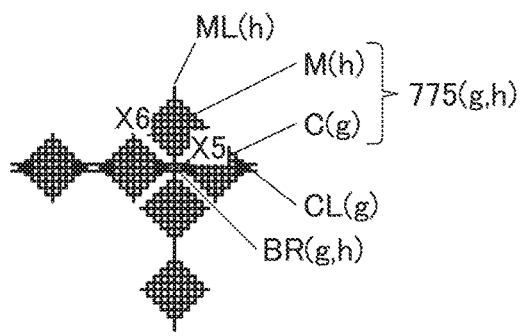
Figure 20C:
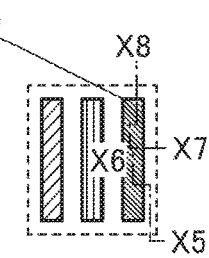

FIGS. 20A, 20B1, 20B2, and 20C illustrate the structure of an input/output panel which can be used for the input/output device of one embodiment of the present invention. FIG. 20A is a top view of the input/output panel. FIG. 20B1 is a schematic view illustrating part of an input portion of the input/output panel. FIG. 20B2 is a schematic view illustrating part of the structure in FIG. 20B1. FIG. 20C is a schematic view illustrating the structure of the pixel 702($i, j$) which can be used for the input/output device.

Figure 21A:
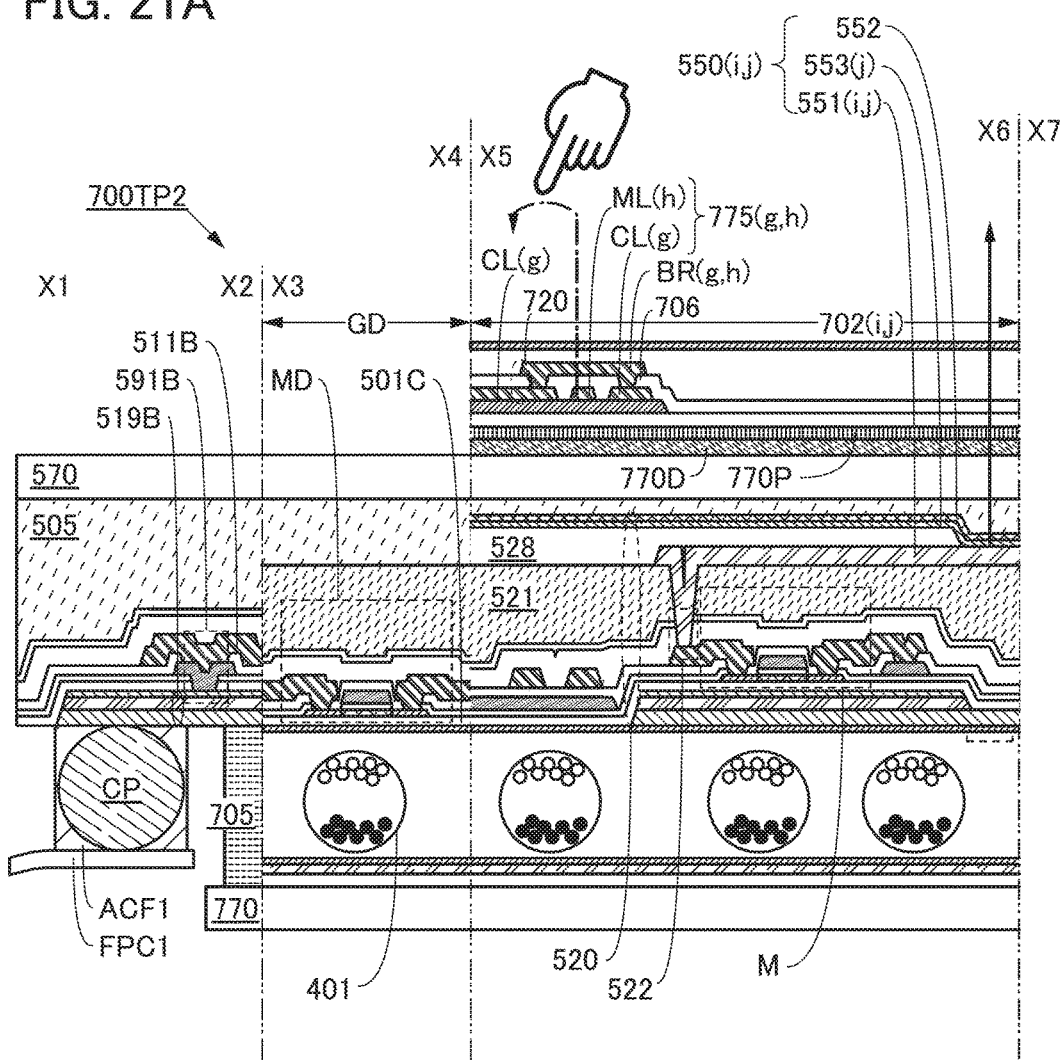
FIGS. 21A and 21B are cross-sectional views illustrating the structure of an input/output panel that can be used in an input/output device of an embodiment.
Figure 21B:
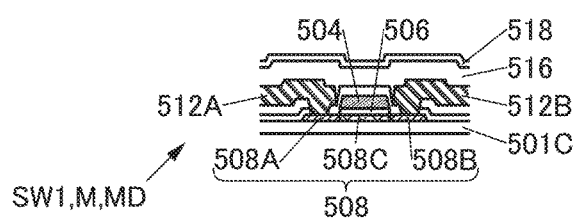
Figure 22:
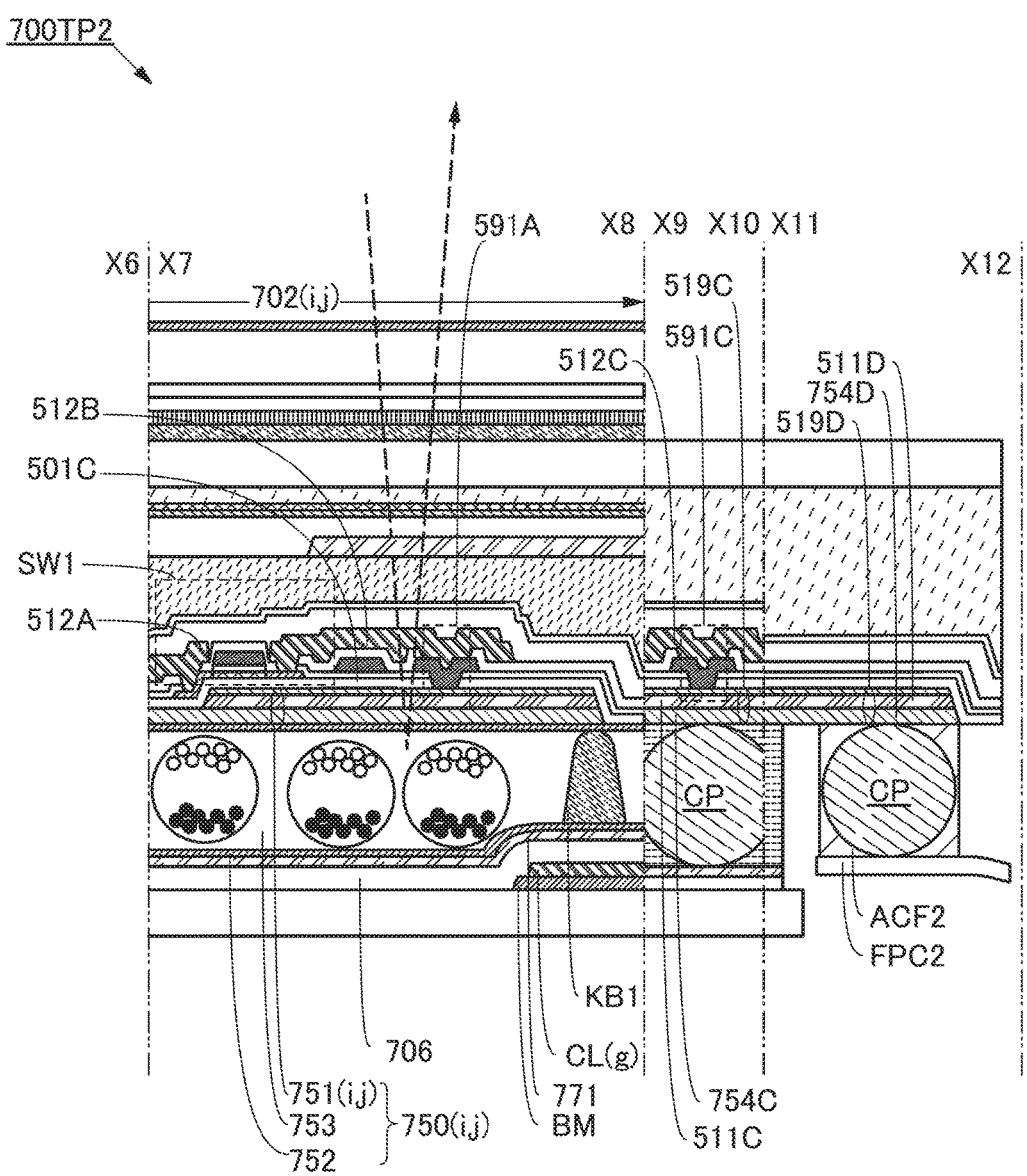
FIG. 22 is a cross-sectional view illustrating the structure of an input/output panel that can be used in an input/output device of an embodiment.

FIGS. 21A and 21B and FIG. 22 illustrate the structure of the input/output panel which can be used for the input/output device of one embodiment of the present invention. FIG. 21A is a cross-sectional view taken along lines X1-X2, X3-X4, and X5-X6 in FIG. 20A. FIG. 21B is a cross-sectional view illustrating part of the structure in FIG. 21A.

FIG. 22 is a cross-sectional view taken along lines X7-X8, X9-X10, and X11-X12 in FIG. 20A.

An example of a transmission path of light which reaches the first display element 750($i, j$) is illustrated in consideration of depth in FIG. 22; thus, even when the transmission path of light and another element overlap with each other in the drawings, the transmission path is secured.

The input/output device described in this embodiment includes a display portion 230 and an input portion 240 (see FIG. 19). Note that the input/output device includes an input/output panel 700TP2.

The input portion 240 includes a sensor region 241, and the sensor region 241 includes a region overlapping with a display region 231 of the display portion 230. The sensor region 241 has a function of sensing an object that approaches a region overlapping with the display region 231 (see FIG. 21A).

<Input Portion 240>

The input portion 240 includes the sensor region 241, an oscillator circuit OSC, and a sensor circuit DC (see FIG. 19).

The sensor region 241 includes a group of sensing elements 775(g, 1) to 775(g, q) and another group of sensing elements 775(1, h) to 775(p, h). Note that g is an integer greater than or equal to 1 and less than or equal top, h is an integer greater than or equal to 1 and less than or equal to q, and each of p and q is an integer greater than or equal to 1.

The group of the sensing elements 775(g, 1) to 775(g, q) include a sensing element 775(g, h). The sensing elements 775(g, 1) to 775(g, q) are arranged in the row direction (indicated by an arrow R2 in the drawing). Note that the direction indicated by the arrow R2 in FIG. 19 may be the same as or different from the direction indicated by an arrow R1 in FIG. 19.

The group of the sensing elements 775(1, h) to 775(p, h) include the sensing element 775(g, h). The sensing elements 775(1, h) to 775(p, h) are arranged in the column direction (the direction indicated by an arrow C2 in the drawing) that intersects the row direction.

The group of the sensing elements 775(g, 1) to 775(g, q) arranged in the row direction include an electrode C(g) that is electrically connected to a control line CL(g) (see FIG. 20B2).

The group of the sensing elements 775(1, h) to 775(p, h) arranged in the column direction include an electrode M(h) that is electrically connected to a sensor signal line ML(h).

The control line CL(g) includes a conductive film BR(g, h) (see FIG. 21A). The conductive film BR(g, h) includes a region overlapping with the sensor signal line ML(h).

The insulating film 706 includes a region positioned between the sensor signal line ML(h) and the conductive film BR(g, h). Thus, a short circuit between the sensor signal line ML(h) and the conductive film BR(g, h) can be prevented.

<Sensing Element 775(g, h)>

The sensing element 775(g, h) is electrically connected to the control line CL(g) and the sensor signal line ML(h).

The sensing element 775(g, h) has a light-transmitting property. The sensing element 775(g, h) includes the electrode C(g) and the electrode M(h).

For example, a conductive film including an opening in a region overlapping with the pixel 702(i, j) can be used for the electrode C(g) and the sensor signal line ML(h). Accordingly, an object that approaches the region overlapping with the display panel can be sensed without disturbing display of the display panel. Moreover, the thickness of the input/output device can be reduced. As a result, a novel input/output device with high convenience or high reliability can be provided.

The electrode C(g) is electrically connected to the control line CL(g).

The electrode M(h) is electrically connected to the sensor signal line ML(h) and is positioned so that an electric field part of which is blocked by an object approaching a region overlapping with the display panel 700 is generated between the electrode M(h) and the electrode C(g).

The control line CL(g) has a function of supplying a control signal.

The sensor signal line ML(h) has a function of receiving a sensor signal.

The sensing element 775(g, h) has a function of supplying a sensor signal which changes in accordance with the control signal and the distance between the sensing element and an object approaching the region overlapping with the display panel 700.

Thus, the object approaching the region overlapping with the display device can be sensed while the image data is displayed on the display device. As a result, a novel input/output device with high convenience or high reliability can be provided.

<Oscillator Circuit OSC>

The oscillator circuit OSC is electrically connected to the control line CL(g) and has a function of supplying a control signal. For example, a rectangular wave, a sawtooth wave, a triangular wave, or the like can be used as the control signal.

<Sensor Circuit DC>

The sensor circuit DC is electrically connected to the sensor signal line ML(h) and has a function of supplying a sensor signal on the basis of a change in the potential of the sensor signal line ML(h). Note that the sensor signal includes positional data P1, for example.

<Display Portion 230>

For example, any of the display devices described in Embodiments 1 to 5 can be used as the display portion 230.

<Input/Output Panel 700TP2>

The input/output panel 700TP2 is different from, for example, the display panel 700 described in Embodiment 2 in that a functional layer 720 and a top-gate transistor are provided. Different structures will be described in detail below, and the above description is referred to for other similar structures.

The functional layer 720 includes the control line CL(g), the sensor signal line ML(h), and the sensing element 775(g, h), for example (see FIGS. 21A and 21B or FIG. 22).

Note that the gap between the control line CL(g) and the second electrode 752 or between the sensor signal line ML(h) and the second electrode 752 is greater than or equal to 0.2 m and less than or equal to 16 μm, preferably greater than or equal to 1 μm and less than or equal to 8 μm, more preferably greater than or equal to 2.5 μm and less than or equal to 4 μm.

<Conductive Film 511D>

The input/output panel 700TP2 described in this embodiment includes the conductive film 511D (see FIG. 22).

Although not illustrated, the conductive material CP or the like can be provided between the control line CL(g) and the conductive film 511D to electrically connect the control line CL(g) and the conductive film 511D. Alternatively, the conductive material CP or the like can be provided between the sensor signal line ML(h) and the conductive film 511D to electrically connect the sensor signal line ML(h) and the conductive film 511D. A material that can be used for the wiring or the like can be used for the conductive film 511D, for example.

<Functional Films 770P and 770D>

The input/output panel 700TP2 described in this embodiment can include functional films 770P and 770D (see FIG. 21A). At least one of the functional films 770P and 770D preferably has a function of a so-called circularly polarizing plate that can transmit a particular circularly polarized light of the self-light-emitting element. In the case where the coloring layer is formed, the circularly polarizing plate does not need to be provided. The functional films 770P and 770D may be formed in the display panel 700 for the above purpose.

When the functional films 770P and 770D are provided, a material with a thickness greater than or equal to 0.1 mm and less than or equal to 0.7 mm can also be used for the substrate 570, for example. Specifically, a substrate polished for reducing the thickness can be used. In that case, the functional film 770P and the functional film 770D can be provided close to the first display element 750($i$, $j$). As a result, image blur can be reduced and an image can be displayed clearly.

<Terminal 519D>

The input/output panel 700TP2 described in this embodiment includes a terminal 519D. The terminal 519D is electrically connected to the conductive film 511D.

The terminal 519D is provided with the conductive film 511D and the intermediate film 754D, and the intermediate film 754D includes a region in contact with the conductive film 511D.

For example, a material that can be used for the wiring or the like can be used for the terminal 519D. Specifically, the terminal 519D can have the same structure as the terminal 519B or the terminal 519C (see FIG. 22).

Note that for example, the terminal 519D can be electrically connected to a flexible printed circuit FPC2 using a conductive material ACF2, for example. Accordingly, a control signal can be supplied to the control line CL(g) using the terminal 519D, or a sensor signal can be supplied from the sensor signal line ML(h) using the terminal 519D, for example.

<Switch SW1, Transistor M, and Transistor MD>

A transistor that can be used for the switch SW1, the transistor M, and the transistor MD include the conductive film 504 including a region overlapping with the insulating film 501C and the semiconductor film 508 including a region positioned between the insulating film 501C and the conductive film 504. Note that the conductive film 504 serves as a gate electrode (see FIG. 21B).

The semiconductor film 508 includes the first region 508A, the second region 508B, and the third region 508C. The first region 508A and the second region 508B do not overlap with the conductive film 504. The third region 508C is positioned between the first region 508A and the second region 508B and overlaps with the conductive film 504.

The transistor MD includes the insulating layer 506 between the third region 508C and the conductive film 504. Note that the insulating layer 506 serves as a gate insulating film.

The first region 508A and the second region 508B have a lower resistivity than the third region 508C, and serve as a source region and a drain region.

The first region 508A and the second region 508B can be formed in the semiconductor film 508 by, for example, performing plasma treatment on the metal oxide film using a gas containing a rare gas.

For example, the conductive film 504 can be used as a mask. The use of the conductive film 504 as a mask allows the shape of part of the third region 508C to be self-aligned with the shape of an end of the conductive film 504.

The transistor MD includes the conductive film 512A and the conductive film 512B that are in contact with the first region 508A and the second region 508B, respectively. The conductive film 512A and the conductive film 512B serve as a source electrode and a drain electrode.

For example, a transistor which can be formed in the same process as the transistor MD can be used as the transistor M.

The display device including a touch sensor manufactured in such a manner can be combined with one or more of a keyboard, a hardware button, a pointing device, an illuminance sensor, an imaging device, an audio input device, a viewpoint input device, and a pose detection device to form a semiconductor device.

Note that this embodiment can be combined with any of the other embodiments in this specification as appropriate.

Embodiment 7

In this embodiment, a light-emitting element which can be used for a semiconductor device of one embodiment of the present invention, specifically the layer 553($i$, $j$) containing a light-emitting material, will be described with reference to FIG. 18.

Structure Example of Light-Emitting Element

First, the structure of a light-emitting element which can be used for a semiconductor device of one embodiment of the present invention will be described with reference to FIG. 18. FIG. 18 is a schematic cross-sectional view of a light-emitting element 160.

Note that one or both of an inorganic compound and an organic compound can be used for the light-emitting element 160. As an organic compound used for the light-emitting element 160, a low molecular compound or a high molecular compound can be given. A high molecular compound is preferable because it is thermally stable and can easily form a thin film with excellent uniformity by a coating method or the like.

Figure 18:
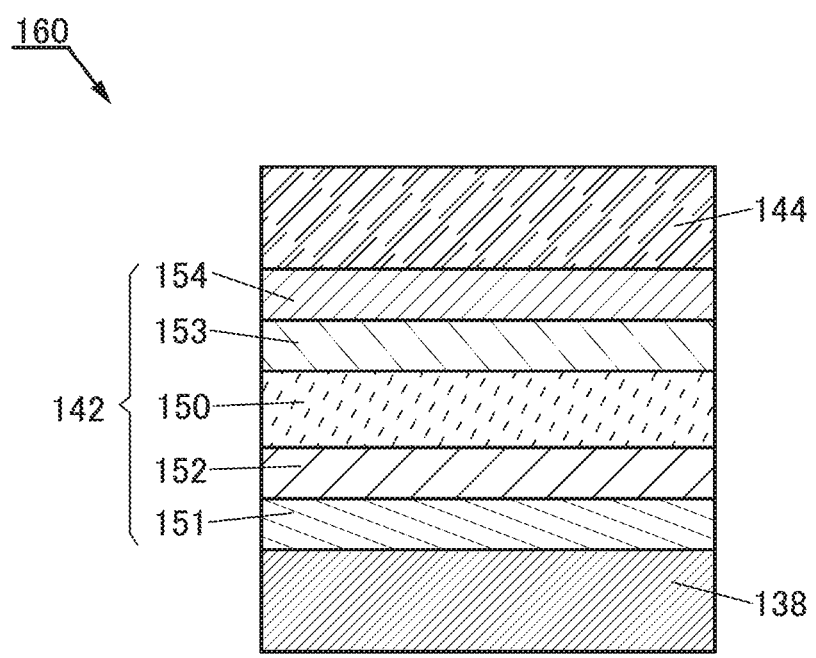
FIG. 18 illustrates a method for manufacturing a light-emitting element of an embodiment.

The light-emitting element 160 illustrated in FIG. 18 includes a pair of electrodes (a conductive film 138 and a conductive film 144) and an EL layer 142 between the pair of electrodes. The EL layer 142 includes at least a light-emitting layer 150.

The EL layer 142 illustrated in FIG. 18 includes the light-emitting layer 150 and functional layers, such as a hole-injection layer 151, a hole-transport layer 152, an electron-transport layer 153, and an electron-injection layer 154.

In this embodiment, description is given assuming that the conductive film 138 and the conductive film 144 of the pair of electrodes serve as an anode and a cathode, respectively, but the structure of the light-emitting element 160 is not limited thereto. For example, a structure in which the conductive film 138 and the conductive film 144 serve as a cathode and an anode, respectively, and the layers between the electrodes are stacked in the reverse order may be used. In other words, the layers may be stacked from the anode side in the following order: the hole-injection layer 151, the hole-transport layer 152, the light-emitting layer 150, the electron-transport layer 153, and the electron-injection layer 154.

The structure of the EL layer 142 is not limited to the structure illustrated in FIG. 18, and another structure may be used as long as the structure includes the light-emitting layer 150 and at least one of the hole-injection layer 151, the hole-transport layer 152, the electron-transport layer 153, and the electron-injection layer 154. The EL layer 142 may include a functional layer that is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

A low molecular compound or a high molecular compound can be used for the light-emitting layer 150.

In this specification and the like, a high molecular compound refers to a polymer that has molecular weight distribution and an average molecular weight of $1\times10^3$ to $1\times10^8$. A low molecular compound is a compound which does not have molecular weight distribution and whose molecular weight is less than or equal to $1\times10^4$.

A high molecular compound refers to a compound in which one or a plurality of constituent units is polymerized. In other words, the constituent unit refers to a unit at least one of which is included in a high molecular compound.

A high molecular compound may refer to a block copolymer, a random copolymer, an alternating copolymer, a graft copolymer, or the like.

In the case where an end group of a high molecular compound includes a polymerization active group, the light emission characteristics and luminance lifetime of a light-emitting element might be reduced. For this reason, an end group of a high molecular compound is preferably a stable end group. As a stable end group, a group which is covalently bonded to a main chain is preferable, and a group which is bonded to an aryl group or a heterocycle group through a carbon-carbon bond is particularly preferable.

When a low molecular compound is used for the light-emitting layer 150, a light-emitting low molecular compound is preferably contained as a guest material in addition to a low molecular compound serving as a host material. In the light-emitting layer 150, the weight percentage of a host material is larger than that of at least a guest material, and a guest material is dispersed in a host material.

A light-emitting organic compound can be used as a guest material. A substance capable of emitting fluorescence (hereinafter also referred to as a fluorescent compound) or capable of emitting phosphorescence (hereinafter also referred to as a phosphorescent compound) can be used as the light-emitting organic compound.

In the light-emitting element 160 of one embodiment of the present invention, voltage application between the pair of electrodes (the conductive film 138 and the conductive film 144) causes electrons and holes to be injected from the cathode and the anode, respectively, into the EL layer 142, whereby a current flows. By recombination of the injected electrons and holes, excitons are formed. The ratio of singlet excitons to triplet excitons (hereinafter referred to as exciton generation probability) which are generated by the carrier (electrons and holes) recombination is approximately 1:3 according to the statistically obtained probability. Accordingly, in a light-emitting element that contains a fluorescent compound, the probability of generation of singlet excitons, which contribute to light emission, is 25% and the probability of generation of triplet excitons, which do not contribute to light emission, is 75%. In the light-emitting element containing a phosphorescent compound, the singlet excitons and triplet excitons can both contribute to light emission. Accordingly, the light-emitting element that contains a phosphorescent compound is preferred because it has higher emission efficiency than the light-emitting element that contains a fluorescent compound.

Note that the term "exciton" refers to a carrier (electron and hole) pair. Since excitons have energy, a material in which excitons are generated is brought into an excited state.

When a high molecular compound is used for the light-emitting layer 150, it is preferable that the high molecular compound include, as its constituent unit, a skeleton having a function of transporting holes (a hole-transport property) and a skeleton having a function of transporting electrons (an electron-transport property). Alternatively, it is preferable that the high molecular compound include a π-electron deficient heteroaromatic skeleton and at least one of a π-electron rich heteroaromatic skeleton and an aromatic amine skeleton. The skeletons are bonded to each other directly or through another skeleton.

When the high molecular compound includes a skeleton having a hole-transport property and a skeleton having an electron-transport property, the carrier balance can easily be controlled. As a result, a carrier recombination region can also be controlled easily. In view of this, it is preferable that the composition ratio of the skeleton having a hole-transport property to the skeleton having an electron-transport property be in the range of 1:9 to 9:1 (molar ratio). It is more preferable that the skeleton having an electron-transport property be contained at a higher proportion than the skeleton having a hole-transport property.

The high molecular compound may include, as its constituent unit, a light-emitting skeleton, in addition to the skeleton having a hole-transport property and the skeleton having an electron-transport property. When the high molecular compound includes a light-emitting skeleton, the composition ratio of the light-emitting skeleton to all the constituent units of the high molecular compound is preferably low, specifically higher than or equal to 0.1 mol % and lower than or equal to 10 mol %, more preferably higher than or equal to 0.1 mol % and lower than or equal to 5 mol %.

Note that the constituent units of the high molecular compound used for the light-emitting element 160 may have different bonding directions, bonding angles, bonding lengths, and the like. In addition, the constituent units may have different substituents, and different skeletons may be provided between the constituent units. In addition, polymerization methods of the constituent units may be different.

The light-emitting layer 150 may contain a light-emitting low molecular material as a guest material, in addition to the high molecular compound serving as a host material. In that case, the light-emitting low molecular compound is dispersed as a guest material in the high molecular compound serving as a host material, and the weight percentage of the high molecular compound is higher than that of at least the light-emitting low molecular compound. The weight percentage of the light-emitting low molecular compound to the high molecular compound is preferably higher than or equal to 0.1 wt % and lower than or equal to 10 wt %, more preferably higher than or equal to 0.1 wt % and lower than or equal to 5 wt %.

A light-emitting element having high emission efficiency which is obtained in such a manner is used for the display device of one embodiment of the present invention, whereby the display device can have higher visibility.

Note that the structure described in this embodiment can be used in appropriate combination with any of the other embodiments.

Embodiment 8

The display device of one embodiment of the present invention includes a display medium whose contrast, luminance, reflectance, transmittance, or the like is changed by an electrical or magnetic effect, such as a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical interference type MEMS display element, an electrowetting element, or a piezoelectric ceramic display.

When a liquid crystal display device is used as a reflective display device, the transmittance of a polarizing plate included in the display device is lower than or equal to 50%. The display device of one embodiment of the present invention does not include a polarizing plate and thus can perform display while suppressing a decrease in the intensity of external light or light emitted from a light-emitting element.

A structural example of a MEMS shutter display element which can be used as the first reflective display element 750($i, j$) of one embodiment of the present invention will be described with reference to FIG. 23, FIG. 24, FIG. 25, and FIG. 26.

Figure 23:
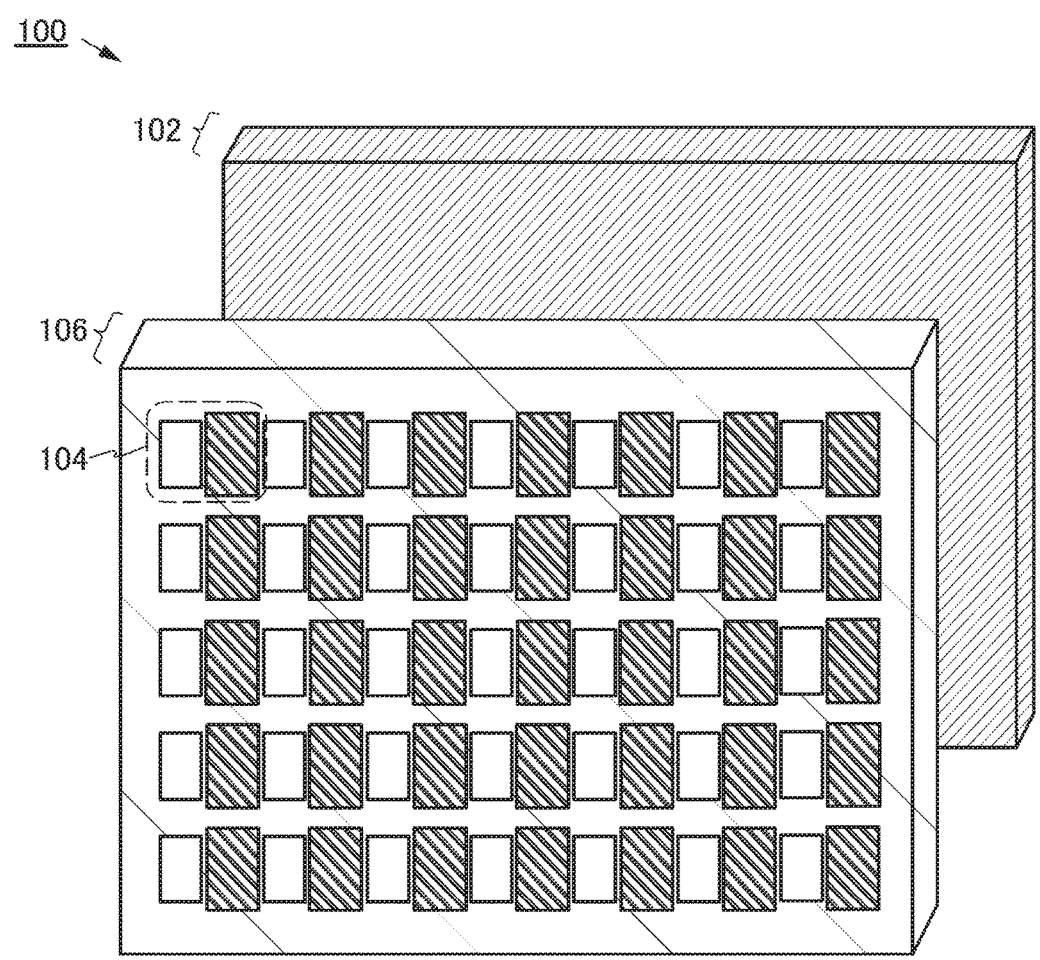
FIG. 23 illustrates a structure example of a MEMS shutter display element of an embodiment.

A display device 100 illustrated in FIG. 23 includes a display portion 102 and a plurality of shutter-like units 104 for adjusting the amount of light included in a support 106.

In the reflective display element of one embodiment of the present invention, the display portion 102 includes a light-reflective layer. That is, light that has passed through the shutter-like unit 104 for adjusting the amount of light is reflected at the display portion 102 and passes through the shutter-like unit 104 for adjusting the amount of light again to be perceived.

The shutter-like unit 104 for adjusting the amount of light can switch between the light-blocking state and the transmission state of light reflected at the display portion 102. Note that the shutter-like unit 104 for adjusting the amount of light may be any unit having a function of switching between the light-blocking state and the transmission state; for example, it may be a shutter including a light-blocking layer including an opening and a movable light-blocking layer capable of blocking light passing through the opening.

Figure 24:
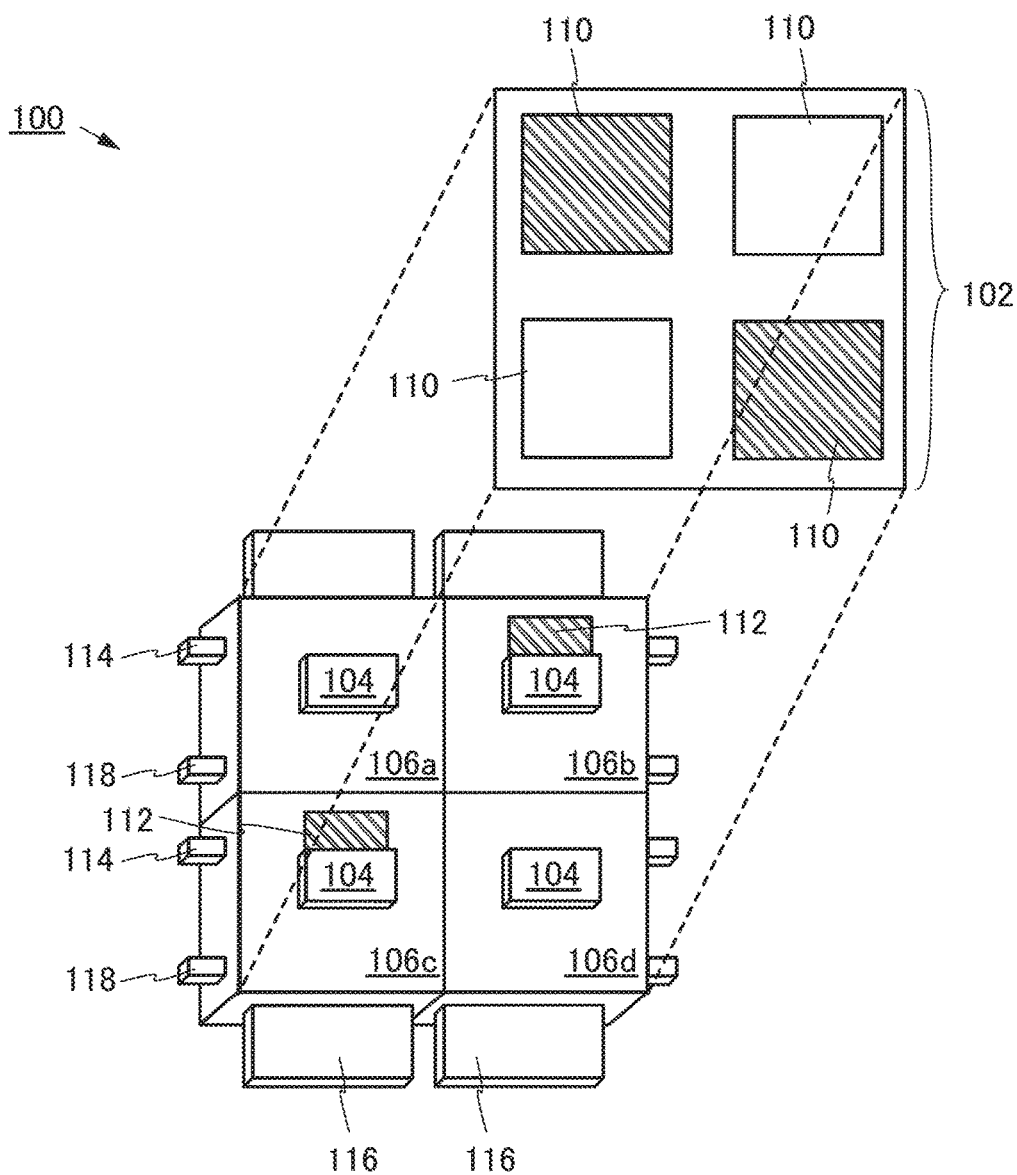
FIG. 24 is a projection view of a display device of an embodiment.

In the reflective display element of one embodiment of the present invention, the display portion 102 may display an image. FIG. 24 is a projection view specifically illustrating the display device 100. The display device 100 includes a plurality of supports 106a to 106d (also collectively referred to as the support 106) which are arranged in rows and columns. Each support 106 includes the unit 104 for adjusting the amount of light and an opening 112, and corresponds to a pixel 110 in the display portion 102. The support 106 itself has light-transmitting properties. When one or more of supports 106 having specific colors corresponding to the respective pixels 110 are selectively brought into the transmission state, the color pixels 110 can be produced in the display device 100.

The display portion 102 may be of a passive matrix type or an active matrix type; in the latter case, operation of elements is controlled by transistors. In either case, wirings electrically connected to pixels need to be provided in a grid pattern. In order to improve the aperture ratio, a conductive film used as the wirings in the display portion is preferably formed using a light-transmitting conductive material.

When the display portion 102 is of an active matrix type, a transistor is also preferably formed using a light-transmitting material. A metal oxide film is preferably used as a light-transmitting semiconductor film of a transistor. For the metal oxide film, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, or the like can be used.

The unit 104 for adjusting the amount of light is a MEMS shutter using MEMS technology. The unit 104 for adjusting the amount of light includes a MEMS structure body and a MEMS driving element portion. The MEMS structure body has a three-dimensional structure and includes a plurality of shutters which are partly movable microstructure bodies.

The MEMS structure body also includes, in addition to a light-blocking layer and a movable light-blocking layer, an actuator for making the movable light-blocking layer slide parallel to the substrate surface, a structure body supporting the movable light-blocking layer, and the like.

The MEMS driving element portion includes a transistor that drives the movable light-blocking layer through the actuator. The transistor used in the MEMS driving element portion is preferably formed using a light-transmitting material and can be formed using a material similar to that of a transistor used in the display portion 102. A conductive film used as a wiring in the MEMS driving element portion is preferably formed using a light-transmitting conductive material.

Each support 106 is electrically connected to a scan line 114, a signal line 116, and a power source line 118. The unit 104 for adjusting the amount of light is switched between the light-blocking state and the transmission state depending on potentials supplied from these lines.

Next, an example of the structure of the MEMS shutter that can be used as the unit 104 for adjusting the amount of light will be described with reference to FIG. 25.

Figure 25:
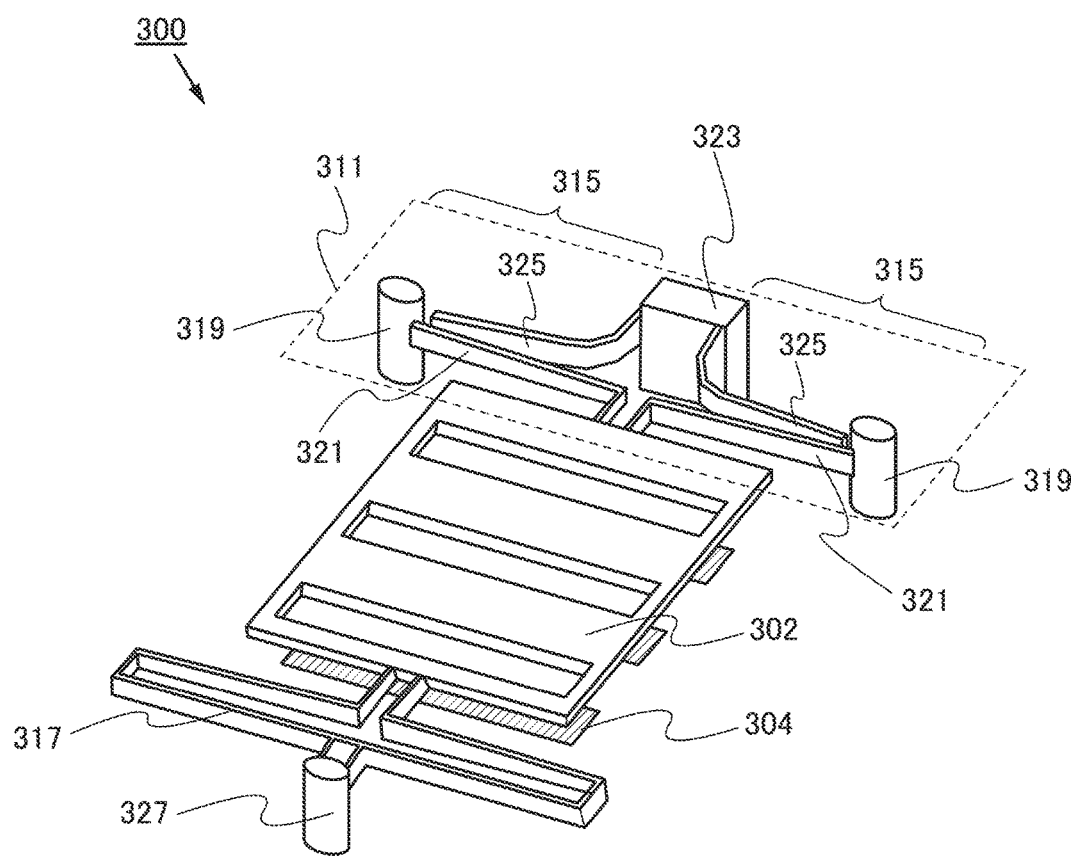
FIG. 25 illustrates a structure example of a MEMS shutter of an embodiment.

FIG. 25 illustrates a shutter 300. The shutter 300 includes a movable light-blocking layer 302 connected to a driving part 311. The driving part 311 is provided over a light-blocking layer (not illustrated for simplification) including an opening 304 and includes two flexible actuators 315. One side of the movable light-blocking layer 302 is electrically connected to the actuators 315. The actuators 315 have a function of moving the movable light-blocking layer 302 in a lateral direction parallel to the surface of the light-blocking layer including the opening 304.

The actuators 315 each include a movable electrode 321 electrically connected to the movable light-blocking layer 302 and a structure body 319, and a movable electrode 325 electrically connected to a structure body 323. The movable electrode 325 is adjacent to the movable electrode 321. One end of the movable electrode 325 is electrically connected to the structure body 323, and the other end thereof can be freely moved. The other end of the movable electrode 325 that can be moved freely is curved so as to be closest to a connection portion of the movable electrode 321 and the structure body 319.

The other side of the movable light-blocking layer 302 is connected to a spring 317 having restoring force to resist force applied by the driving part 311. The spring 317 is connected to a structure body 327.

The structure bodies 319, the structure body 323, and the structure body 327 serve as mechanical supports to make the movable light-blocking layer 302, the actuators 315, and the spring 317 float in the vicinity of the surface of the light-blocking layer including the opening 304.

Under the movable light-blocking layer 302, the openings 304 surrounded by the light-blocking layer are provided. Note that the shapes of the movable light-blocking layer 302 and the opening 304 are not limited thereto.

The structure body 323 included in the shutter 300 is electrically connected to a transistor (not illustrated). The transistor drives the movable light-blocking layer. Thus, a given voltage can be applied through the transistor to the movable electrode 325 connected to the structure body 323. The structure bodies 319 and 327 are each connected to a ground electrode (GND). Accordingly, the movable electrode 321 connected to the structure body 319 and the spring 317 connected to the structure body 327 each have a potential, GND. Note that the structure bodies 319 and 327 may also be electrically connected to a common electrode which can apply a given voltage. The spring 317 and the structure body 327 may be replaced with the driving part 311 so that the shutter includes the two driving parts 311.

When voltage is applied to the movable electrode 325, the movable electrode 325 and the movable electrode 321 are electrically attracted to each other by a potential difference therebetween. As a result, the movable light-blocking layer 302 connected to the movable electrode 321 is drawn toward the structure body 323 and moves toward the structure body 323 in the lateral direction. Since the movable electrode 321 serves as a spring, when the potential difference between the movable electrode 321 and the movable electrode 325 is removed, the movable electrode 321 releases the stress stored in the movable electrode 321 and pushes the movable light-blocking layer 302 back to the original position. When the movable electrode 321 is drawn toward the movable electrode 325, the movable light-blocking layer 302 may shield the opening 304 or may be positioned so as not to overlap the opening 304.

Alternatively, an operation similar to the above can be performed in the following manner: generating a magnetic field in the element and applying magnetic force to the movable electrode 321 or 325. With such an operation based on an electrical or magnetic action, the light-blocking unit, that is, the MEMS shutter selectively transmits light.

A method for manufacturing the shutter 300 will be described below. A sacrificial layer with a predetermined shape is formed by a photolithography process over the light-blocking layer including the opening 304. The sacrificial layer can be formed using, for example, an organic resin, such as polyimide or acrylic, or an inorganic insulating film, such as silicon oxide, silicon nitride, silicon oxynitride, or silicon nitride oxide. Note that in this specification and the like, "silicon oxynitride" contains more oxygen than nitrogen, and "silicon nitride oxide" contains more nitrogen than oxygen. The oxygen content and the nitrogen content are measured by Rutherford backscattering spectrometry (RBS) or hydrogen forward scattering spectrometry (HFS).

Next, a film formed of a light-blocking material is formed over the sacrificial layer by a printing method, a sputtering method, an evaporation method, or the like and then is selectively etched, whereby the shutter 300 is formed. As the light-blocking material, for example, a semiconductor or a metal, such as chromium, molybdenum, nickel, titanium, copper, tungsten, tantalum, neodymium, aluminum, or silicon, or an alloy or an oxide thereof can be used. Alternatively, the shutter 300 is formed by an inkjet method. The shutter 300 is preferably formed to a thickness greater than or equal to 100 nm and less than or equal to 5 µm.

Then, the sacrificial layer is removed, whereby the shutter 300 which can be moved in a space can be formed. After that, the surface of the shutter 300 is preferably oxidized by oxygen plasma, thermal oxidation, or the like so that an oxide film is formed. Alternatively, an insulating film formed of alumina, silicon oxide, silicon nitride, silicon oxynitride, silicon nitride oxide, DLC (diamond-like carbon), or the like is preferably formed over the surface of the shutter 300 by an atomic layer deposition method or a CVD method. Providing the insulating film over the shutter 300 can slow down the deterioration of the shutter 300 over time.

Next, a control circuit 200 including the light-blocking unit will be described with reference to FIG. 26.

FIG. 26 is a schematic view of the control circuit 200 in the display device. The control circuit 200 controls the array of pixels 210 in supports 206 each of which includes a shutter provided with an actuator for bringing the light-blocking unit to the light-blocking state and an actuator for bringing the light-blocking unit to the transmission state. The pixels 210 in the array each have a substantially square shape and the pitch, or the distance between the pixels, is 180 µm to 200 µm.

In the control circuit 200, a scan line 204 is provided for the pixels 210 in each row, and a first signal line 208a and a second signal line 208b are provided for the pixels 210 in each column. The first signal line supplies a signal for bringing the light-blocking unit to the transmission state, whereas the second signal line supplies a signal for bringing the light-blocking unit to the light-blocking state. The control circuit 200 also includes a charge line 212, an operation line 214, and a common power source line 215. The charge line 212, the operation line 214, and the common power source line 215 are shared by the pixels 210 in a plurality of rows and columns in the array.

Each of the pixels 210 is provided with a transistor 216 charged to bring the light-blocking unit to the transmission state, a transistor 218 discharged to bring the light-blocking unit to the transmission state, a transistor 217 to which data is written so that the light-blocking unit is brought to the transmission state, and a capacitor 219. The transistors 216 and 218 are electrically connected to the actuator for bringing the light-blocking unit to the transmission state.

Each of the pixels 210 is provided with a transistor 220 charged to bring the light-blocking unit to the light-blocking state, a transistor 222 discharged to bring the light-blocking unit to the light-blocking state, a transistor 227 to which data is written so that the light-blocking unit is brought to the light-blocking state, and a capacitor 229. The transistors 220 and 222 are electrically connected to the actuator for bringing the light-blocking unit to the light-blocking state.

The transistors 216, 218, 220, and 222 include a material other than a metal oxide in a channel region and therefore can operate at sufficiently high speed.

The transistors 217 and 227 include a highly purified metal oxide in a channel region. When a transistor including a highly purified metal oxide in a channel region is turned off, data can be retained in a floating node (e.g., a node at which the transistors 217 and 218 and the capacitor 219 are connected, or a node at which the transistors 220 and 227 and the capacitor 229 are connected). In addition, the transistor including a highly purified metal oxide has an extremely low off-state current, which eliminates the need for a refresh operation or significantly reduces the frequency of the refresh operation, resulting in a sufficiently low power consumption.

The off-state current was actually measured using a transistor including a metal oxide and having a channel width W of 1 m. As a result, in the case where the drain voltage $V_D$ is +1 V or +10 V and the gate voltage $V_G$ is in the range of −5 V to −20 V, the off-state current of the transistor was found to be lower than or equal to $1 \times 10^{-12}$ A which is the detection limit, namely, lower than or equal to 1 aA ($1 \times 10^{-18}$ A) per unit channel width (1 µm). As a result of more accurate measurements, the off-state current at room temperature (25° C.) was lower than or equal to approximately 40 zA/µm ($4 \times 10^{-20}$ A/µm) at a source-drain voltage of 4 V and lower than or equal to approximately 10 zA/µm ($1 \times 10^{-20}$ A/µm) at a source-drain voltage of 3.1 V. Even at 85° C., the off-state current was lower than or equal to approximately 100 zA/μm (1×10⁻¹⁹ A/μm) at a source-drain voltage of 3.1 V.

It is thus confirmed that the off-state current of a transistor including a highly purified metal oxide is sufficiently low. For the details about more accurate measurements of the off-state current, Japanese Published Patent Application No. 2011-166130 can be referred to.

A conductive film is formed over the same surface as a metal oxide film of the transistors 217 and 227 and used as one electrode of each of the capacitors 219 and 229. There is a small step on the capacitors formed using such a conductive film, leading to easy integration and miniaturization of the display device. For example, part of the light-blocking unit or the transistor can overlap with the capacitor, thereby obtaining a miniaturized display device occupying a small area.

In the control circuit 200, voltage is applied to the charge line 212 first. Then, the transistors 216 and 220 are turned on because the charge line 212 is connected to a gate and a drain of each of the transistors 216 and 220. The minimum voltage needed to operate the shutter of the support 206 (e.g., 15 V) is applied to the charge line 212. The charge line 212 is set to 0 V after charge of the actuator for bringing the light-blocking unit to the light-blocking state and the actuator for bringing the light-blocking unit to the transmission state, whereby the transistors 216 and 220 are turned off. The charge in the two actuators is stored.

When a writing voltage $V_w$ is supplied to the scan line 204, data is sequentially written to the pixels 210 in each row. During a period in which data is written to the pixels 210 in a certain row, the control circuit 200 applies a data voltage to one of the first signal line 208a and the second signal line 208b corresponding to the column of the pixels 210. When the voltage $V_w$ is applied to the scan line 204 in a row to which data is to be written, the transistors 217 and 227 in the corresponding row are turned on. When the transistors 217 and 227 are turned on, charge supplied from the first signal line 208a and the second signal line 208b is stored in the capacitors 219 and 229, respectively.

In the control circuit 200, the operation line 214 is connected to a source of each of the transistors 218 and 222. When the potential of the operation line 214 is much higher than that of the common power source line 215, the transistors 218 and 222 are not turned on regardless of the charge stored in the capacitors 219 and 229. In the control circuit 200, the transistors 218 and 222 are turned on/off depending on the charge of the data stored in the capacitors 219 and 229 when the potential of the operation line 214 is lower than or equal to that of the common power source line 215.

In the case where the transistor 218 or 222 is turned on, the charge of the actuator for bringing the light-blocking unit to the light-blocking state or the charge of the actuator for bringing the light-blocking unit to the transmission state flows through the transistor 218 or 222. For example, when only the transistor 218 is turned on, the charge of the actuator for bringing the light-blocking unit to the transmission state flows to the operation line 214 through the transistor 218. This causes a potential difference between the shutter of the support 206 and the actuator for bringing the light-blocking unit to the transmission state, so that the shutter is electrically attracted toward the actuator and the transmission state is obtained.

Figure 29A:
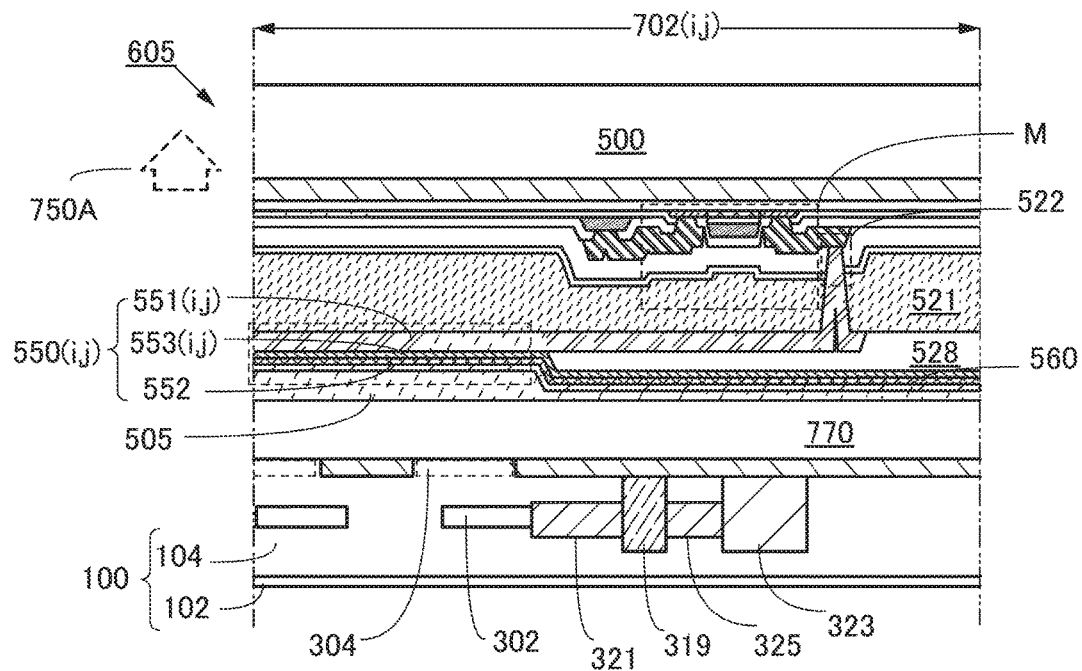
FIGS. 29A and 29B are cross-sectional views each illustrating the structure of a display panel that can be used in a display device of an embodiment.

FIG. 29A is a schematic cross-sectional view of a structure body 605, in which the display device 100 and the second self-luminous display element 550(i, j) are stacked. FIG. 29A only shows the positional relation and does not correctly show the thickness or the length of the components. For the coloring film CF, other embodiments may be referred to, and the coloring film is omitted in FIG. 29A. The display device 100 is formed on and in contact with the substrate 770. The second self-luminous display element 550(i, j) is formed over the substrate 500. The substrate 770 is attached and fixed to the substrate 500 with the bonding layer 505.

The opening 304 and the movable light-blocking layer 302 included in the display device 100 are arranged so that at least part of them overlap with the second self-luminous display element 550(i, j). That is, part of light emitted from the second self-luminous display element 550(i, j) passes through the opening 304 and is reflected by the display portion 102 in the direction indicated by the arrow 750A.

External light that reaches any of the structure body 319, the movable electrode 321, the structure body 323, and the movable electrode 325 cannot be perceived. Accordingly, these components do not desirably overlap with the display region of the second self-luminous display element 550(i, j).

Such a MEMS shutter display element including a metal oxide film can have a higher frame rate and thus can perform higher-quality display.

Embodiment 9

[Optical Interference Type MEMS Display Element]

Figure 27A:
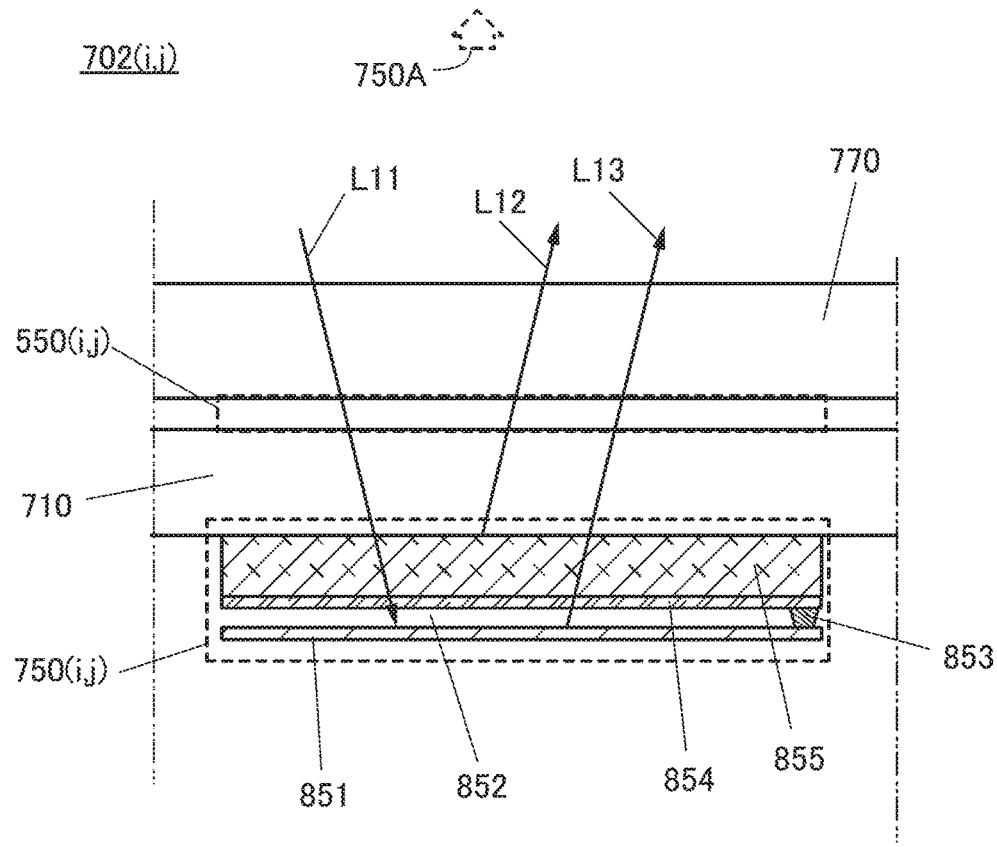
FIGS. 27A and 27B are a cross-sectional view and a perspective view, respectively, each illustrating an optical interference type MEMS display element of an embodiment.
Figure 27B:
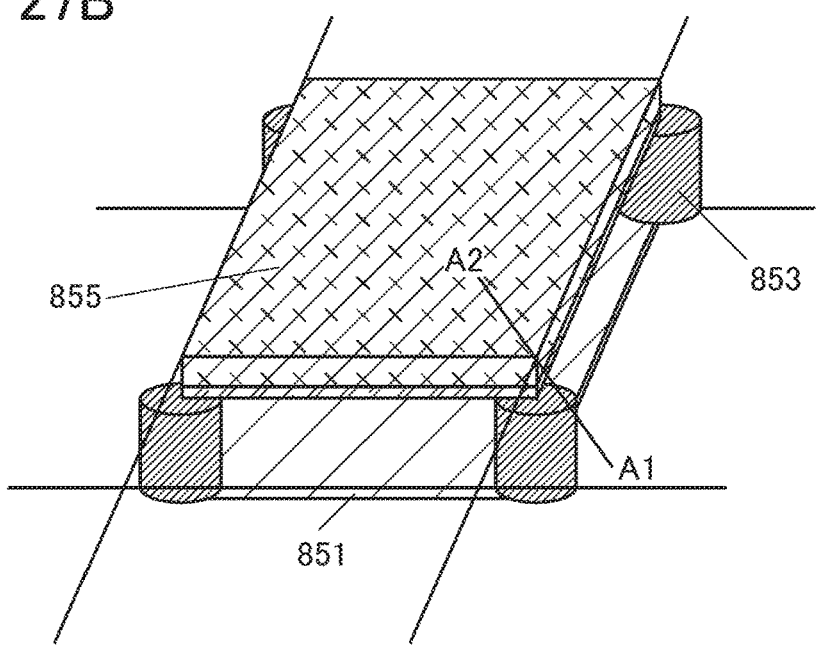

A structural example of the optical interference type MEMS display element which can be used as the first reflective display element 750(i, j) of one embodiment of the present invention is illustrated in FIGS. 27A and 27B. FIG. 27A is a schematic cross-sectional view, and FIG. 27B is a perspective view. The optical interference type MEMS display element of this embodiment is of a passive matrix type.

The second self-luminous display element 550(i, j) emits light in the direction indicated by the arrow 750A, and the first reflective display element 750(i, j) reflects light in the direction indicated by the arrow 750A.

The first reflective display element 750(i, j) includes a reflective electrode 851, a space 852, a support portion 853, an insulating film 854, and a semi-transmissive electrode 855.

The reflective electrode 851 extends in the column direction, and the semi-transmissive electrode 855 extends in the row direction.

The support portion 853 supports the reflective electrode 851 that is an electrode extending in the column direction at four corners. A voltage that is higher than or equal to a certain value is applied between the semi-transmissive electrode 855 and the reflective electrode 851; in that case, electrostatic force is generated therebetween. A portion around the reflective electrode 851 and a portion around the support portion 853 can be changed in shape by the electrostatic force, which can change the length of the space 852 in the direction indicated by the arrow 750A. In this manner, the semi-transmissive electrode 855 and the reflective electrode 851 can be used as a unit for adjusting the amount of light.

Light L11 that has entered the first display element 750(i, j) is reflected at the semi-transmissive electrode 855 to obtain light L12 and reflected at the reflective electrode 851 to obtain light L13. The light L12 and the light L13 interfere each other to intensify reflected light in a certain color.

FIG. 28 is a cross-sectional view illustrating a structural example of the optical interference type MEMS display element of one embodiment of the present invention. FIG. 28 illustrates an example of a cross section along line A1-A2 in FIG. 27B. FIG. 28 is an upside-down drawing of FIG. 27A, in which light can be reflected in the direction indicated by the arrow 750A. A pixel PI1 that performs display using red light is provided on the A1 side, and a pixel PI2 that performs display using green light is provided on the A2 side. A region SA where a support portion is formed is provided between the pixel PI1 and the pixel PI2.

In the structure illustrated in FIG. 28, an insulating film 861 is provided in contact with a substrate 860. The insulating film 861 is formed for planarization of the substrate and optical design and can be formed using an insulating material, such as silicon oxide or aluminum oxide. Insulating films described later can also be formed using these insulating materials.

A conductive film 862, an insulating film 863, and a conductive film 864 are formed in contact with the insulating film 861 to extend in the row direction. The conductive films 862 and 864 can be formed using a conductive material, such as Al, Mo, Cr, or a mixture thereof. The conductive film 862 reduces reflection of light, and a difference in optical path length between the conductive films 862 and 864 is set to an appropriate value; in this manner, light of a desired wavelength can be reflected.

An insulating film 865 is formed in contact with the insulating film 861 and the conductive film 864. A conductive film 866 and an insulating film 867 are formed over the insulating film 865 and the conductive film 864. For example, the insulating film 865 is formed using, as a material, silicon oxide to have a thickness of 470 nm.

The conductive films 862 and 866 transmit visible light. For example, a conductive film is used, whose reflectance of visible light (e.g., light in the wavelength range greater than or equal to 400 nm and less than 800 nm) is higher than or equal to 5% and lower than 100% and whose transmittance of visible light is higher than or equal to 10% and lower than 100%. For example, the conductive films 862 and 866 may be formed using a conductive material containing silver (Ag) or a conductive material containing aluminum (Al) having a thickness of 1 nm to 30 nm, preferably 1 nm to 15 nm. In this embodiment, the conductive films 862 and 866 are each formed using a Mo—Cr alloy film having a thickness of 7 nm. The thickness of the insulating film 867 is 40 nm, for example.

The conductive film 866 is too thin to deliver a signal without delay in the display surface and is thus electrically connected to the conductive film 864 to secure conductivity.

A space 868R and a space 868G are provided in contact with the insulating film 867. The pixel PI1 is provided in a region including the space 868R. The pixel PI2 is provided in a region including the space 868G. The pixel PI1 and the pixel PI2 display different colors from each other and thus the differences in optical path length therein are different from each other, so that the space 868R and the space 868G have different thicknesses in the direction indicated by the arrow 750A. For example, the thickness of the space 868R is 220 nm, and the thickness of the space 868G is 150 nm. Note that the thickness of the space in a blue pixel region may be 310 nm.

As described in Embodiment 8, the space 868R and the space 868G are formed by forming and removing a sacrifice layer.

An insulating film 869 is formed in contact with the insulating film 867. The insulating film 869 serves as part of the support portion 853 in FIGS. 27A and 27B.

A conductive film 870, a conductive film 871, an insulating film 872, and a conductive film 873 are formed in contact with the insulating film 869. For example, the conductive film 870 is formed of Mo to a thickness of 10 nm, and the conductive film 871 is formed of Al to a thickness of 30 nm. The conductive film 873 is formed of Al to a thickness of 30 nm. For example, the insulating film 872 is formed of silicon oxide to a thickness of 180 nm in the region including PI1 and to a thickness of 460 nm in the region including PI2. Note that the insulating film 872 is formed to a thickness of 75 nm in the blue pixel region.

A stacked structure of the conductive film 870, the conductive film 871, the insulating film 872, and the conductive film 873 can vary in shape; for example, part of the stacked structure which overlaps with the space 868R or 868G can be displaced. When electrostatic force is generated between the conductive film 866 and the conductive film 870, the thickness of the space 868R or 868G can be 0 to determine the intensity of reflected light.

The thickness of the insulating film 872 in the pixel PI1 is different from that in the pixel PI2. In that case, in addition to a light interference effect due to the thickness of the space, a light interference effect can be generated between the conductive film 870 and the conductive film 873.

Figure 29B:
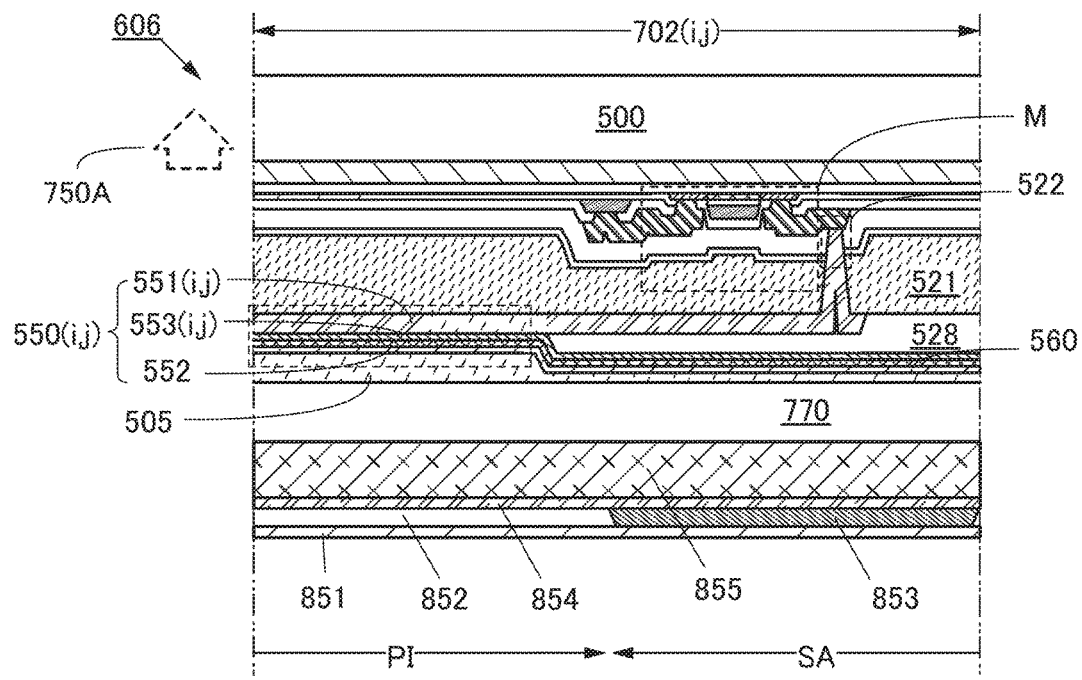

FIG. 29B is a schematic cross-sectional view of a structure body 606, in which the first reflective display element 750($i, j$) that is an optical interference type MEMS display element and the second self-luminous display element 550($i, j$) are stacked. FIG. 29B only shows the positional relation and does not correctly show the thickness or the length of the components. For the coloring film CF, other embodiments may be referred to, and the coloring film is omitted in FIG. 29B.

The pixels PI, such as the pixel PI1 and the pixel PI2, included in the first reflective display element 750($i, j$) that is an optical interference type MEMS display element are arranged so that at least part of them overlap with the second self-luminous display element 550($i, j$). That is, part of light emitted from the second self-luminous display element 550($i, j$) might be reflected in the pixel PI in the direction indicated by the arrow 750A.

External light that reaches the region SA where the support portion is formed cannot be perceived. Accordingly, this region does not desirably overlap with the display region of the second self-luminous display element 550($i, j$). The region SA where the support portion is formed preferably overlaps with the transistor M.

Note that this embodiment can be combined with any of the other embodiments in this specification as appropriate.

Embodiment 10

In this embodiment, a semiconductor material that can be used for the semiconductor device of one embodiment of the present invention will be described.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, CAC-OS or CAC-metal oxide can be called a matrix composite or a metal matrix composite.

<Composition of CAC-OS>

Described below is the composition of a cloud aligned composite OS (CAC-OS), which can be used for a semiconductor layer of the transistor disclosed in one embodiment of the present invention.

The CAC-OS refers to, for example, an oxide semiconductor material with a composition in which elements are unevenly distributed in regions each having a size greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The flow rate of an oxygen gas to the total flow rate of the deposition gas at the time of deposition is preferably as low as possible, and for example, the flow rate of an oxygen gas is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{X2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

By using such a semiconductor element having high field-effect mobility for a display device of one embodiment of the present invention, a novel display device that achieves both high visibility and high definition can be manufactured.

At least part of this embodiment can be implemented in combination with any of the other embodiments described in this specification as appropriate.

Embodiment 11

Figure 30A:
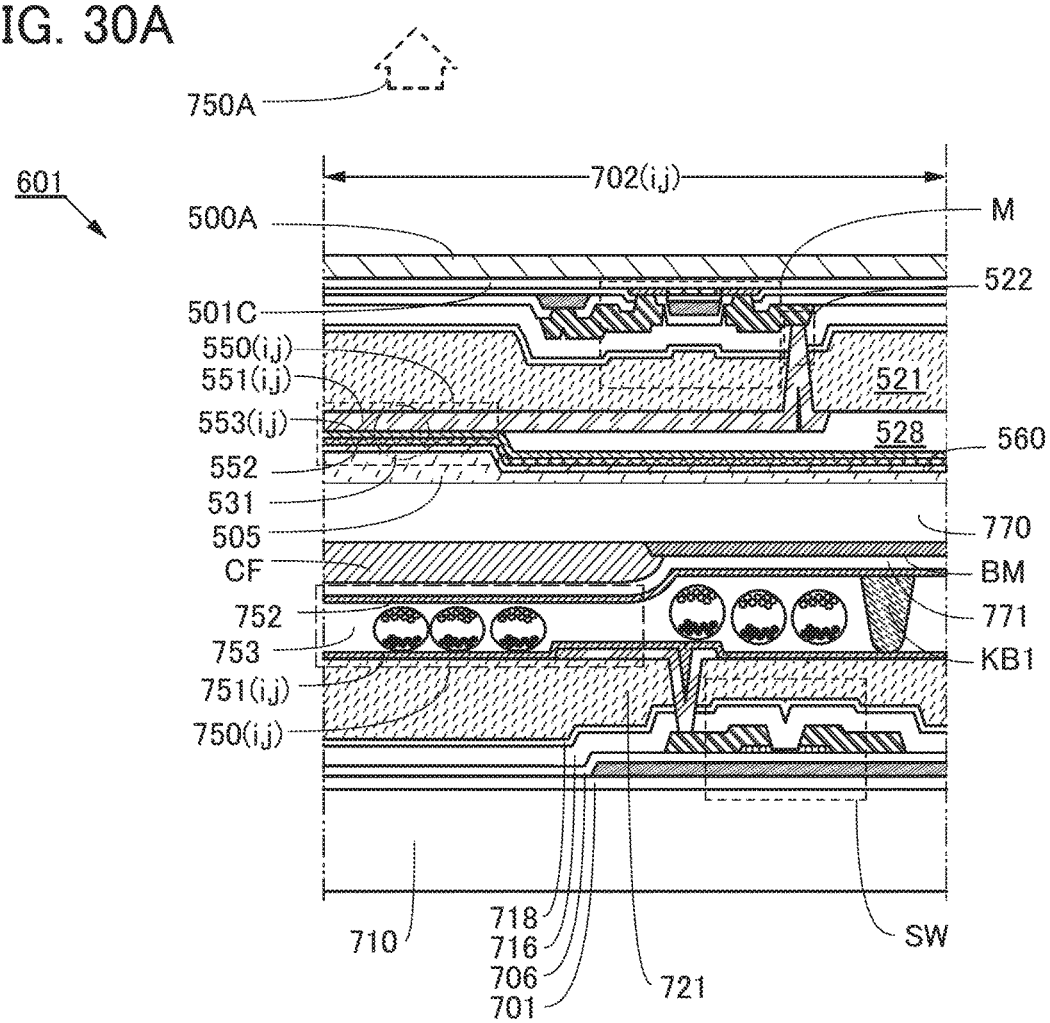
FIGS. 30A and 30B each illustrate a stacked structure of a conductive film or an insulating film of an embodiment.
Figure 30B:
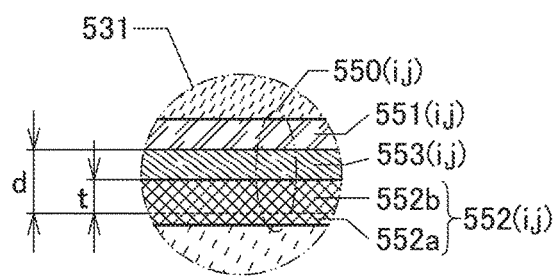

In this embodiment, with reference to FIGS. 30A and 30B, an example will be described in which a semi-transmissive layer with respect to visible light, a transmissive layer with respect to visible light, and a reflective layer with respect to visible light are used in a semiconductor device of one embodiment of the present invention to obtain a display device with high color purity and favorable color reproducibility. FIG. 30A illustrates the structure body 601 that is illustrated in FIGS. 2A and 2B. FIG. 30B is an enlarged view of a portion 531 in FIG. 30A.

In the case where a light-emitting element (self-luminous display element) has a microcavity structure, the third electrode 551(i, j) is formed using a conductive material (a semi-transmissive material) which transmits and reflects a certain amount of light of the incident light, and the fourth electrode 552 is formed using a stack of a conductive material having high reflectance (the reflectance of visible light is higher than or equal to 50% and lower than or equal to 100%, preferably higher than or equal to 70% and lower than or equal to 100%) and a conductive material having high transmittance (the transmittance of visible light is higher than or equal to 50% and lower than or equal to 100%, preferably higher than or equal to 70% and lower than or equal to 100%). Here, the fourth electrode 552 is formed using a stack of a fourth electrode 552a formed of a conductive material that reflects light and a fourth electrode 552b formed of a conductive material that transmits light. The fourth electrode 552b is provided between the layer 553(i, j) containing a light-emitting material and the fourth electrode 552a (see FIG. 30B). The third electrode 551(i, j) serves as a semi-reflective electrode, and the fourth electrode 552a serves as a reflective electrode.

For example, the third electrode 551(i, j) may be formed using a conductive material containing silver (Ag) or a conductive material containing aluminum (Al) having a thickness of 1 nm to 30 nm, preferably 1 nm to 15 nm. In this embodiment, as the third electrode 551(i, j), a 10-nm-thick conductive material containing silver and magnesium is used.

The fourth electrode 552a may be formed using a conductive material containing silver (Ag) or a conductive material containing aluminum (Al) having a thickness of 50 nm to 500 nm, preferably 50 nm to 200 nm. In this embodiment, the fourth electrode 552a is formed using a 100-nm-thick conductive material containing silver.

For the fourth electrode 552b, a conductive oxide containing indium (In) or a conductive oxide containing zinc (Zn) having a thickness of 1 nm to 200 nm, preferably 5 nm to 100 nm may be used. In this embodiment, indium tin oxide is used for the fourth electrode 552b. Furthermore, a conductive oxide may be provided under the fourth electrode 552a.

By changing the thickness t of the fourth electrode 552b, an optical distance d from the interface between the third electrode 551(i, j) and the layer 553(i, j) containing a light-emitting material to the interface between the fourth electrode 552a and the fourth electrode 552b can be set to a predetermined arbitral value. Light-emitting elements having different emission spectra for respective pixels can be provided by changing the thickness t of the fourth electrode 552b in each pixel even when one layer 553(i, j) containing a light-emitting material is used. Thus, the color purity of each emission color is improved and a display device having favorable color reproducibility can be achieved. It is not necessary to independently form the layer 553(i, j) containing a light-emitting material in the pixels depending on the emission color; therefore, the number of manufacturing steps of the display device can be reduced and thus the productivity can be improved. Furthermore, a high-definition display device can be achieved easily.

Note that a method for adjusting the optical distance d is not limited to the above method. For example, the optical distance d may be adjusted by changing the thickness of the layer 553(i, j) containing a light-emitting material.

A structure may be employed in which the coloring film CF is provided in a position overlapping with the second display element 550(i, j) and light from the second display element 550(i, j) passes through the coloring film CF and is emitted to the outside.

With such a structure, the visibility of the display device can be increased. According to one embodiment of the present invention, a display device having a higher color purity and a higher display quality can be achieved.

Embodiment 12

In this embodiment, the structure of a touch sensor applicable to the display device of one embodiment of the present invention will be described. When an electrode of a touch sensor is incorporated separately from a display device, the display device is called an out-cell touch panel (or a display device with an out-cell touch sensor) in some cases.

A touch panel refers to a display device (or a display module) provided with a touch sensor. In some cases, a touch panel is called a touch screen. Furthermore, a device which does not include a display device and includes only a touch sensor is called a touch panel in some cases. A display device that is provided with a touch sensor is also called a touch sensor equipped display device, a display device equipped touch panel, a display module, or the like in some cases.

A display device in which an electrode of a touch sensor is incorporated on the element substrate side is called a full in-cell touch panel (or a full in-cell touch sensor equipped display device) in some cases. In the full in-cell touch panel, for example, an electrode formed on the element substrate side is also used as an electrode of a touch sensor.

A display device in which an electrode of a touch sensor is incorporated on the counter substrate side as well as on the element substrate side is called a hybrid in-cell touch panel (or a hybrid in-cell touch sensor equipped display device) in some cases. The hybrid in-cell touch panel uses an electrode formed on the element substrate side and an electrode formed on the counter substrate side as electrodes of a touch sensor, for example.

A display device in which an electrode of a touch sensor is incorporated on the counter substrate side is called an on-cell touch panel (or an on-cell touch sensor equipped display device) in some cases. The on-cell touch panel uses an electrode formed on the counter substrate side as an electrode of a touch sensor, for example.

In a display module including a touch panel, a display device has a touch sensor function, like the above full in-cell, hybrid in-cell, or on-cell touch panel. In the display module, a touch panel connected to an FPC, a frame, a printed board, and a battery are provided in this order between an upper cover and a lower cover.

The display device described in any of the above embodiments can be used as the display device included in the display module. Accordingly, the frame of the display module can be narrower, and the image qualities thereof can be improved.

The shapes and sizes of the upper cover and the lower cover can be changed as appropriate in accordance with the size of the display device, the touch panel, or the like.

For the touch sensor and the touch panel, a resistive or capacitive touch sensor can be used.

The frame protects the display device, the touch panel, or the like and serves as an electromagnetic shield for blocking electromagnetic waves generated by the operation of the printed board. The frame may serve as a radiator plate.

The printed board includes circuits for outputting a variety of signals for driving the display device, the touch panel, or the like. As a power source for supplying power to each circuit on the printed board, an external commercial power source or a power source using a battery provided separately may be used. The battery can be omitted in the case of using a commercial power source.

The display module may additionally be provided with a component, such as a polarizing plate, a retardation plate, or a prism sheet.

Figure 16A:
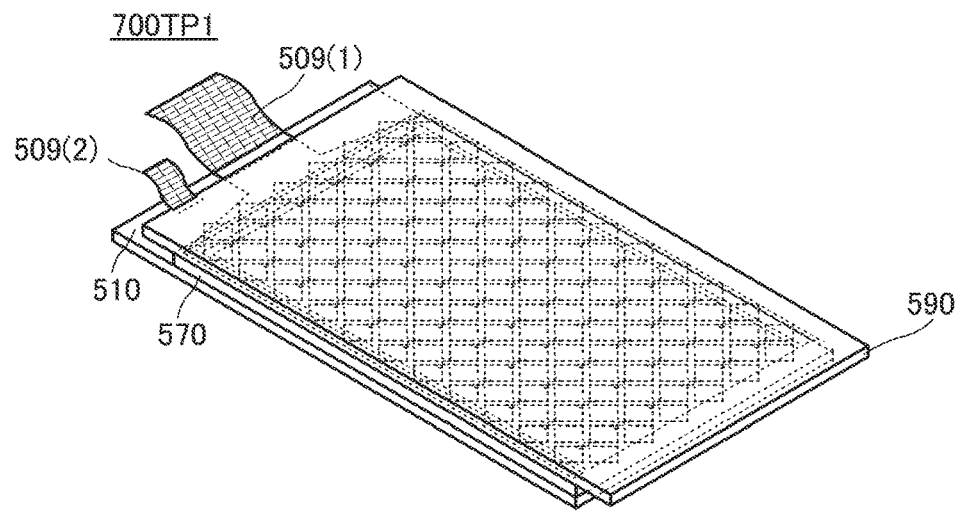
FIGS. 16A and 16B illustrate a projected capacitive touch sensor of an embodiment.
Figure 16B:
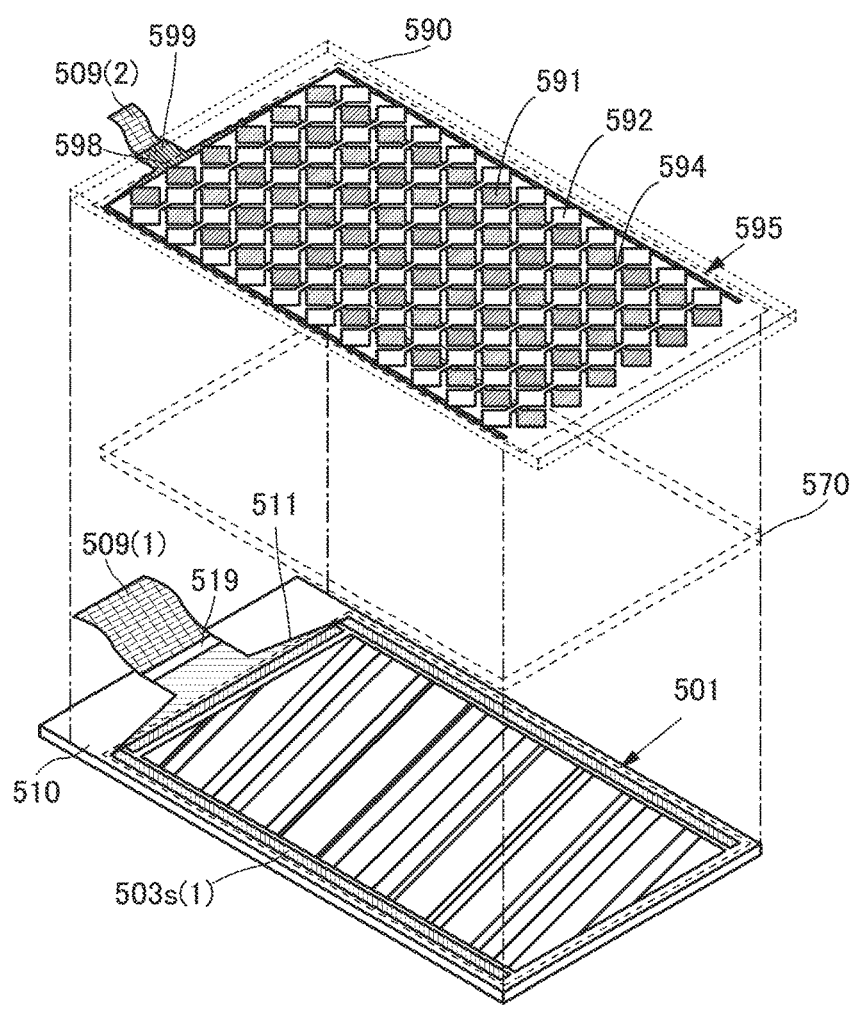

As illustrated in FIGS. 16A and 16B, a touch panel and the display device of one embodiment of the present invention may be attached to each other.

An input/output panel 700TP1 includes a display portion 501 and a touch sensor 595 (see FIG. 16B). Furthermore, the input/output panel 700TP1 includes a substrate 510, the substrate 570, and a substrate 590.

The substrates 510 and 570 are provided with pixel circuits and light-emitting elements (e.g., first light-emitting elements) and are bonded to each other by the manufacturing method described in Embodiment 3. The substrate 590 is provided with a touch sensor. In other words, the substrate 590 is bonded to the substrates 510 and 570 to manufacture the input/output panel 700TP1. After the bonding, by separating the touch sensor from the substrate 590 or reducing the thickness of the substrate 590 in such a structure, the thickness of the input/output panel 700TP1 can be reduced.

The display portion 501 includes the substrate 510, a plurality of pixels over the substrate 510, a plurality of wirings 511 through which signals are supplied to the pixels, and an image signal line driver circuit 503s(1). The plurality of wirings 511 are led to a peripheral portion of the substrate 510, and part of the plurality of wirings 511 forms a terminal 519. The terminal 519 is electrically connected to an FPC 509(1).

<Touch Sensor>

The substrate 590 includes the touch sensor 595 and a plurality of wirings 598 electrically connected to the touch sensor 595. The plurality of wirings 598 are led to a peripheral portion of the substrate 590, and part of the plurality of wirings 598 forms a terminal. The terminal is electrically connected to an FPC 509(2). Note that in FIG. 16B, electrodes, wirings, and the like of the touch sensor 595 provided on the back side of the substrate 590 (the side facing the substrate 510) are indicated by solid lines for clarity.

As the touch sensor 595, a capacitive touch sensor can be used, for example. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below with reference to FIG. 16B.

Note that a variety of sensors that can sense the closeness or the contact of an object, such as a finger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 16A and 16B.

The electrodes 591 each have a quadrangular shape and are arranged in the direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that the space between the electrodes 591 is reduced as much as possible, and a plurality of electrodes 592 may be provided with an insulating layer positioned between the electrodes 591 and the electrodes 592 and may be spaced apart from each other to form a region which does not overlap with the electrodes 591. In that case, between two adjacent electrodes 592, it is preferable to provide a dummy electrode which is electrically insulated from these electrodes, whereby the area of a region having a different transmittance can be reduced.

A connection layer 599 electrically connects the wiring 598 to the FPC 509(2). As the connection layer 599, any of various anisotropic conductive films (ACF), anisotropic conductive pastes (ACP), or the like can be used.

Note that this embodiment can be combined with any of the other embodiments in this specification as appropriate.

Embodiment 13

In this embodiment, electronic devices and lighting devices of one embodiment of the present invention will be described with reference to the drawings.

Electronic devices and lighting devices can be manufactured by using the display device of one embodiment of the present invention. Flexible electronic devices and flexible lighting devices can be manufactured by using a flexible substrate for the display device of one embodiment of the present invention.

Examples of electronic devices include a television set, a desktop or laptop personal computer, a monitor of a computer or the like, a camera, such as a digital camera or a digital video camera, a digital photo frame, a mobile phone, a portable game console, a portable information terminal, an audio reproducing device, and a large game machine, such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. It is preferable that the secondary battery be capable of being charged by contactless power transmission.

Examples of the secondary battery include a lithium ion secondary battery, such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and the secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions, such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

FIGS. 32A to 32E illustrate examples of electronic devices each including a curved display portion 7000. The display surface of the display portion 7000 is curved, and images can be displayed on the curved display surface. Note that the display portion 7000 may be flexible.

The display portion 7000 can be formed using the display device or the like of one embodiment of the present invention. One embodiment of the present invention makes it possible to provide a highly reliable electronic device having a curved display portion.

Figure 32A:
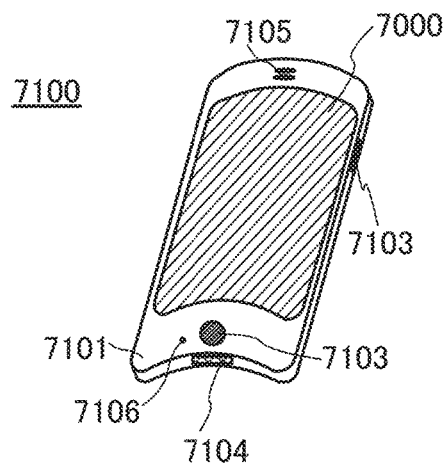
FIGS. 32A to 32F illustrate examples of an electronic device and a lighting device of an embodiment.
Figure 32B:
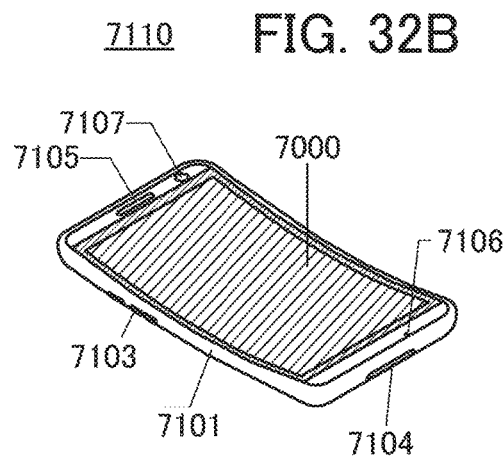

FIGS. 32A and 32B each illustrate an example of a mobile phone. A mobile phone 7100 illustrated in FIG. 32A and a mobile phone 7110 illustrated in FIG. 32B each include a housing 7101, the display portion 7000, operation buttons 7103, an external connection port 7104, a speaker 7105, a microphone 7106, and the like. The mobile phone 7110 illustrated in FIG. 32B also includes a camera 7107.

Each mobile phone includes a touch sensor in the display portion 7000. Operations, such as making a call and inputting a character, can be performed by touch on the display portion 7000 with a finger, a stylus, or the like.

The power can be turned on or off with the operation button 7103. In addition, types of images displayed on the display portion 7000 can be switched; for example, switching images from a mail creation screen to a main menu screen is performed with the operation button 7103.

When a detection device, such as a gyroscope or acceleration sensor, is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 32C:
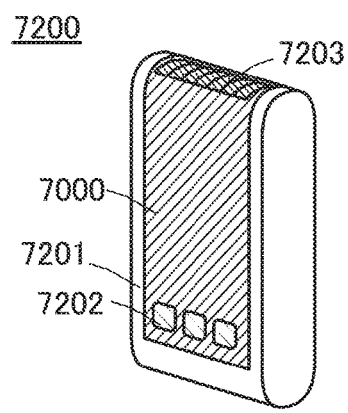
Figure 32D:
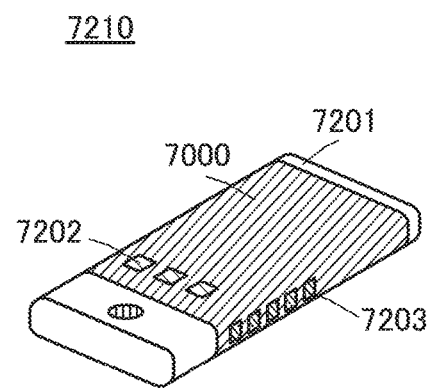

FIGS. 32C and 32D each illustrate an example of a portable information terminal. A portable information terminal 7200 illustrated in FIG. 32C and a portable information terminal 7210 illustrated in FIG. 32D each include a housing 7201 and the display portion 7000. Each of the portable information terminals may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

Each of the portable information terminals described in this embodiment serves as, for example, one or more of a telephone set, a notebook, and an information browsing system. Specifically, each of the portable information terminals can be used as a smartphone. Each of the portable information terminals described in this embodiment is capable of executing a variety of applications, such as mobile phone calls, e-mailing, reading and editing texts, music reproduction, Internet communication, and a computer game, for example.

The portable information terminals 7200 and 7210 can display characters, image information, and the like on their plurality of surfaces. For example, as illustrated in FIGS. 32C and 32D, three operation buttons 7202 can be displayed on one surface, and information 7203 indicated by a rectangle can be displayed on another surface. FIG. 32C illustrates an example in which information is displayed at the top of the portable information terminal. FIG. 32D illustrates an example in which information is displayed on the side of the portable information terminal. Information may also be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 32E:
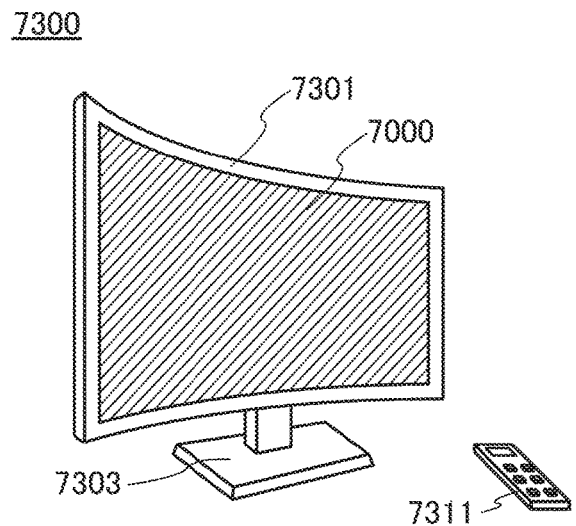

FIG. 32E illustrates an example of a television set. In a television set 7300, the display portion 7000 is incorporated in a housing 7301. Here, the housing 7301 is supported by a stand 7303.

The television set 7300 illustrated in FIG. 32E can be operated with an operation switch of the housing 7301 or a separate remote controller 7311. Furthermore, the display portion 7000 may include a touch sensor. The display portion 7000 can be operated by touching the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. With the use of the receiver, general television broadcasting can be received. When the television set is connected to a communication network with or without wires via the modem, one-way (from a transmitter to a receiver) or two-way (between a transmitter and a receiver or between receivers) data communication can be performed.

Figure 32F:
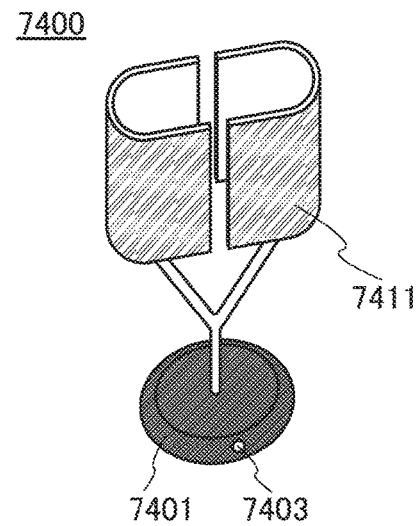

FIG. 32F illustrates an example of a lighting device having a curved light-emitting portion.

The light-emitting portion included in the lighting device illustrated in FIG. 32F can be manufactured using the display device or the like of one embodiment of the present invention. One embodiment of the present invention makes it possible to provide a highly reliable lighting device having a curved light-emitting portion.

A light-emitting portion 7411 included in a lighting device 7400 illustrated in FIG. 32F has two convex-curved light-emitting portions symmetrically placed. Thus, all directions can be illuminated with the lighting device 7400 as a center.

The light-emitting portion included in the lighting device 7400 may have flexibility. The light-emitting portion may be fixed on a plastic member, a movable frame, or the like so that a light-emitting surface of the light-emitting portion can be curved freely depending on the intended use.

The lighting device 7400 includes a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface can be curved to have a concave shape, whereby a particular area can be brightly illuminated, or the light-emitting surface can be curved to have a convex shape, whereby a whole room can be brightly illuminated.

FIGS. 33A to 33I illustrate examples of portable information terminals each including a flexible and bendable display portion 7001.

The display portion 7001 is manufactured using the display device or the like of one embodiment of the present invention. For example, a display device or the like that can be bent with a radius of curvature greater than or equal to 0.01 mm and less than or equal to 150 mm can be used. The display portion 7001 may include a touch sensor so that the portable information terminal can be operated by touching the display portion 7001 with a finger or the like. One embodiment of the present invention makes it possible to provide a highly reliable electronic device including a display portion having flexibility.

Figure 33A:
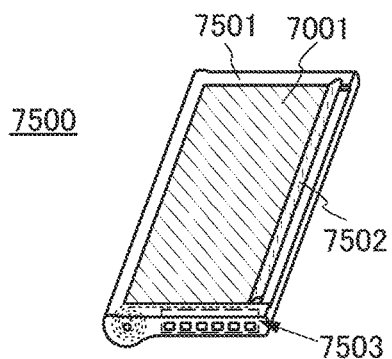
FIGS. 33A to 33I illustrate examples of an electronic device of an embodiment.
Figure 33B:
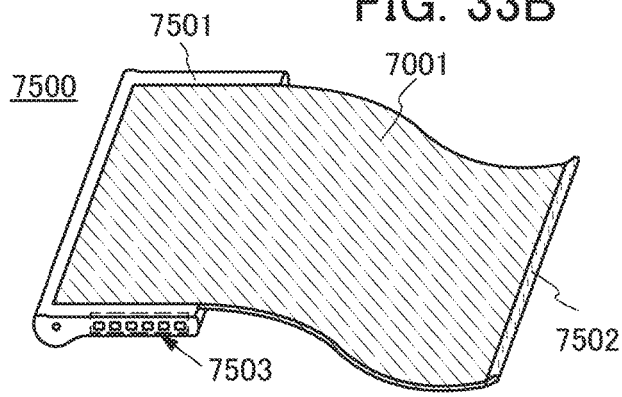

FIGS. 33A and 33B are perspective views illustrating an example of the portable information terminal. A portable information terminal 7500 includes a housing 7501, the display portion 7001, a display portion tab 7502, operation buttons 7503, and the like.

The portable information terminal 7500 includes the display portion 7001 that is flexible and rolled in the housing 7501. The display portion 7001 can be pulled out by using the display portion tab 7502.

The portable information terminal 7500 can receive a video signal with a control portion incorporated therein and can display the received video on the display portion 7001. Furthermore, the portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed videos, and the like can be performed. Although FIGS. 33A and 33B illustrate an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 33B illustrates the portable information terminal 7500 in the state where the display portion 7001 is pulled out. Videos can be displayed on the display portion 7001 in this state. In addition, the portable information terminal 7500 may perform different display in the state where part of the display portion 7001 is rolled as illustrated in FIG. 33A and in the state where the display portion 7001 is pulled out as illustrated in FIG. 33B. For example, in the state illustrated in FIG. 33A, the rolled portion of the display portion 7001 is put in a non-display state, which results in a reduction in power consumption of the portable information terminal 7500.

Note that a reinforcement frame may be provided for a side portion of the display portion 7001 so that the display portion 7001 maintains a flat display surface when pulled out.

Note that in addition to this structure, a speaker may be provided in the housing so that sound is output in accordance with an audio signal received together with a video signal.

Figure 33C:
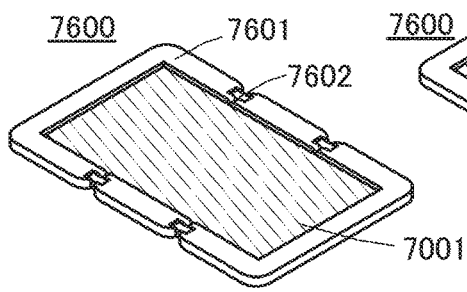
Figure 33D:
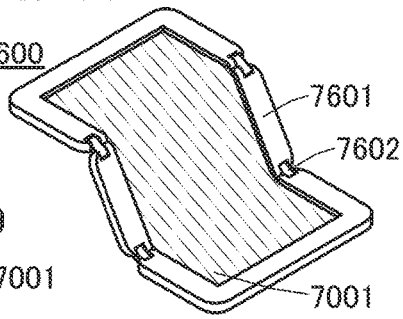
Figure 33E:
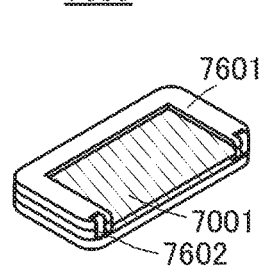

FIGS. 33C to 33E illustrate an example of a foldable portable information terminal. FIG. 33C illustrates a portable information terminal 7600 that is opened. FIG. 33D illustrates the portable information terminal 7600 that is being opened or being folded. FIG. 33E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from the opened state to the folded state.

Figure 33F:
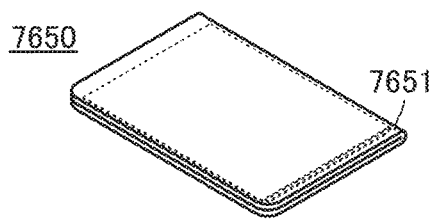
Figure 33G:
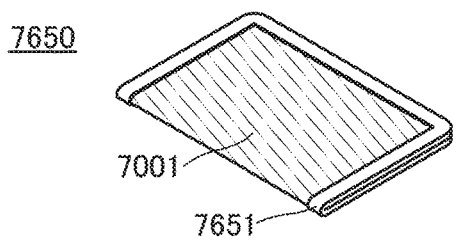

FIGS. 33F and 33G illustrate an example of a foldable portable information terminal. FIG. 33F illustrates a portable information terminal 7650 that is folded so that the display portion 7001 is on the inside. FIG. 33G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

Figure 33H:
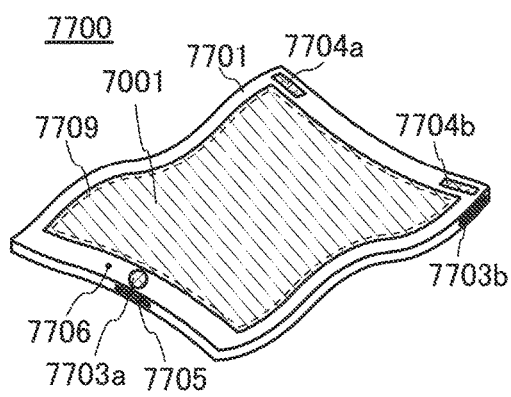

FIG. 33H illustrates an example of a flexible portable information terminal. A portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in the rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

Figure 33I:
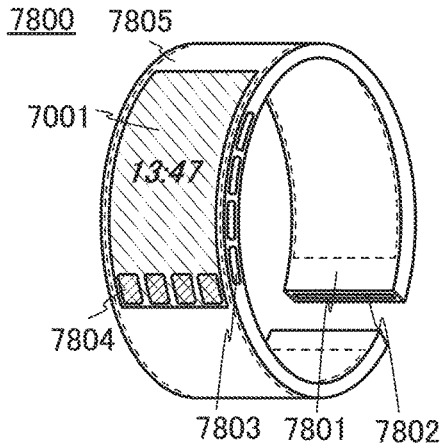

FIG. 33I illustrates an example of a wrist-watch-type portable information terminal. A portable information terminal 7800 includes a band 7801, the display portion 7001, an input/output terminal 7802, operation buttons 7803, and the like. The band 7801 has a function of a housing. In addition, a flexible battery 7805 can be mounted on the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions, such as time setting, ON/OFF of the power, ON/OFF of wireless communication, setting and cancellation of silent mode, and setting and cancellation of power saving mode, can be performed. For example, the functions of the operation buttons 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input/output terminal 7802. In the case where the input/output terminal 7802 is included, data can be directly transmitted to and received from another information terminal via a connector. Charging through the input/output terminal 7802 is also possible. Note that charging of the portable information terminal described as an example in this embodiment can also be performed by contactless power transmission without using the input/output terminal.

Figure 31A:
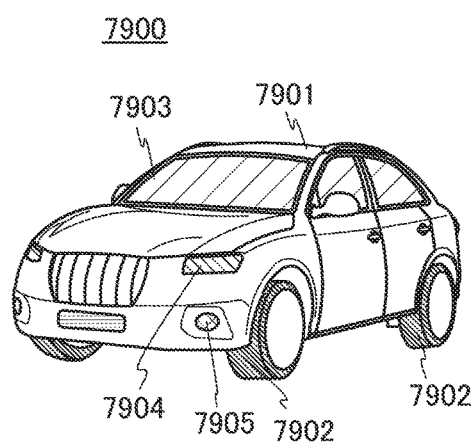
FIGS. 31A to 31F illustrate examples of an electronic device of an embodiment.
Figure 31B:
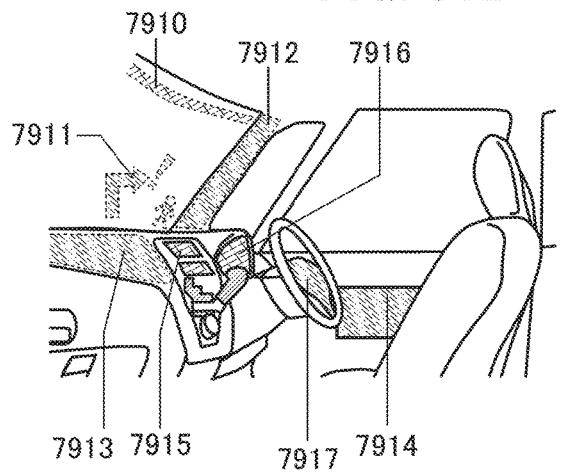

FIG. 31A is an external view of an automobile 7900. FIG. 31B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion or the like of the automobile 7900. For example, the display device of one embodiment of the present invention can be used in display portions 7910 to 7917 illustrated in FIG. 31B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor including an organic semiconductor material or a transistor including a metal oxide, is preferably used.

A display portion 7912 is provided on a pillar portion. A display portion 7913 is provided on a dashboard. For example, the display portion 7912 can compensate for the view hindered by the pillar portion by showing an image taken by an imaging unit provided on the car body. Similarly, the display portion 7913 can compensate for the view hindered by the dashboard and a display portion 7914 can compensate for the view hindered by the door. That is, showing an image taken by an imaging unit provided on the outside of the car body leads to elimination of blind areas and enhancement of safety. In addition, showing an image so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information, such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 31C:
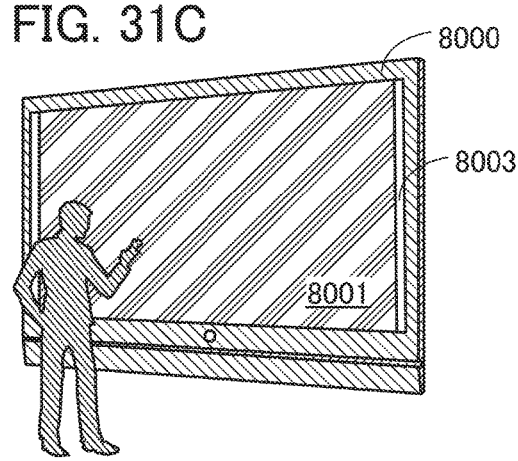
Figure 31D:
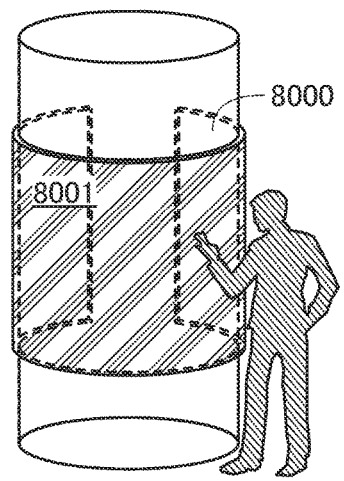

FIGS. 31C and 31D illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 31D illustrates a digital signage mounted on a cylindrical pillar.

A larger display portion 8001 can provide more information at a time. In addition, a larger display portion 8001 attracts more attention, so that the effectiveness of the advertisement can be increased, for example.

It is preferable to use a touch panel in the display portion 8001 because a device with such a structure does not just display a still or moving image, but can be operated by users intuitively. Alternatively, in the case where the display device of one embodiment of the present invention is used for providing information, such as route information or traffic information, usability can be enhanced by intuitive operation.

Figure 31E:
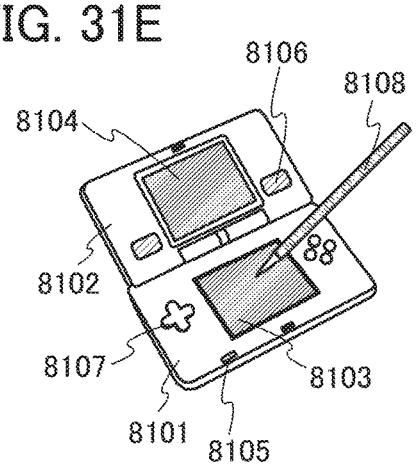

FIG. 31E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 31E includes two display portions 8103 and 8104. Note that the number of display portions of an electronic device of one embodiment of the present invention is not limited to two and can be one or three or more as long as at least one display portion includes the display device of one embodiment of the present invention.

Figure 31F:
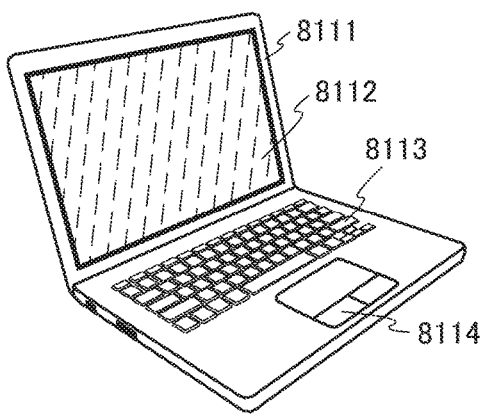

FIG. 31F illustrates a laptop personal computer, which includes a housing 8111, a display portion 8112, a keyboard 8113, a pointing device 8114, and the like.

The display device of one embodiment of the present invention can be used in the display portion 8112.

At least part of this embodiment can be implemented in combination with any of the other embodiments described in this specification as appropriate.

EXPLANATION OF REFERENCE

ACF2: conductive material, BM: light-blocking film, BM1: light-blocking film, BM2: light-blocking film, BR(g, h): conductive film, C(g): electrode, C2: arrow, CF: coloring film, CFI: coloring film, CF2: coloring film, CP: conductive material, DC: sensor circuit, GD: driver circuit, GDA: driver circuit, GDB: driver circuit, FPC2: flexible printed circuit, KB1: insulator, L1: light, L2: light, L3: light, L4: light, L5: light, L12: light, L13: light, M: transistor, MD: transistor, M(h): electrode, ML(h): sensor signal line, P1: positional data, PI1: pixel, PI2: pixel, R1: arrow, R2: arrow, S1: signal line, S2: signal line, SA: region, SD: driver circuit, SD1: driver circuit, SD2: driver circuit, SW: transistor, SW1: switch, SW2: switch, V11: information, V12: information, VCOM1: wiring, 100: display device, 102: display portion, 104: unit for adjusting the amount of light, 110: pixel, 116: signal line, 138: conductive film, 144:

conductive film, 208*a*: signal line, 208*b*: signal line, 210: pixel, 216: transistor, 217: transistor, 218: transistor, 220: transistor, 222: transistor, 227: transistor, 230: display portion, 231: display region, 240: input portion, 241: sensor region, 311: driving part, 319: structure body, 321: movable electrode, 323: structure body, 325: movable electrode, 327: structure body, 401: microcapsule, 402: binder, 500: substrate, 500A: resin layer, 500B: resin layer, 501: display portion, 501A: insulating film, 501C: insulating film, 501D: insulating layer, 503*s*: driver circuit, 504: conductive film, 505: bonding layer, 505B: bonding layer, 506: insulating layer, 508: semiconductor film, 508A: region, 508B: region, 508C: region, 509: FPC, 510: substrate, 511: wiring, 511B: conductive film, 511C: conductive film, 511D: conductive film, 512A: conductive film, 512B: conductive film, 516: insulating layer, 518: insulating layer, 519: terminal, 519B: terminal, 519C: terminal, 519D: terminal, 520: functional layer, 521: insulating layer, 522: connection portion, 528: insulating film, 550: second display element, 551: electrode, 552: electrode, 552*a*: electrode, 552*b*: electrode, 553(*i, j*): layer containing a light-emitting material, 553(*j*): layer containing a light-emitting material, 560: protective layer, 590: substrate, 591: electrode, 592: electrode, 594: wiring, 595: touch sensor, 598: wiring, 599: connection layer, 570: substrate, 601: structure body, 601A: structure body, 601B: structure body, 601C: structure body, 601D: structure body, 601E: structure body, 601F: structure body, 602: structure body, 602A: structure body, 602B: structure body, 603: structure body, 604: structure body, 605: structure body, 606: structure body, 611: laser light, 700: display panel, 700TP1: input/output panel, 700TP2: input/output panel, 701: insulating film, 702: pixel, 704: conductive film, 705: sealing material, 706: insulating film, 708: semiconductor film, 710: substrate, 712A: conductive film, 712B: conductive film, 716: insulating film, 718: insulating film, 720: functional layer, 721: insulating film, 750: first display element, 750A: arrow, 751: electrode, 752: electrode, 753: layer including electrophoretic particles, 754B: intermediate film, 754C: intermediate film, 754D: intermediate film, 770: substrate, 771: insulating film, 772: insulating film, 775: sensing element, 780: substrate, 851: reflective electrode, 854: insulating film, 855: electrode, 860: substrate, 861: insulating film, 862: conductive film, 863: insulating film, 864: conductive film, 865: insulating film, 866: conductive film, 867: insulating film, 869: insulating film, 870: conductive film, 871: conductive film, 872: insulating film, 873: conductive film, 7000: display portion, 7001: display portion, 7100: mobile phone, 7101: housing, 7103: operation button, 7104: external connection port, 7105: speaker, 7106: microphone, 7107: camera, 7110: mobile phone, 7200: portable information terminal, 7201: housing, 7202: operation button, 7203: information, 7210: portable information terminal, 7300: television set, 7301: housing, 7303: stand, 7311: remote controller, 7400: lighting device, 7401: stage, 7403: operation switch, 7411: light-emitting portion, 7500: portable information terminal, 7501: housing, 7502: display portion tab, 7503: operation button, 7600: portable information terminal, 7601: housing, 7602: hinge, 7650: portable information terminal, 7651: non-display portion, 7700: portable information terminal, 7701: housing, 7703*a*: button, 7703*b*: button, 7704*a*: speaker, 7704*b*: speaker, 7705: external connection port, 7706: microphone, 7709: battery, 7800: portable information terminal, 7801: band, 7802: input/output terminal, 7803: operation button, 7804: icon, 7805: battery, 7900: automobile, 7901: car body, 7902: wheel, 7903: windshield, 7904: light, 7905: fog lamp, 7910: display portion, 7911: display portion, 7912: display portion, 7913: display portion, 7914: display portion, 7915: display portion, 7916: display portion, 7917: display portion, 8000: housing, 8001: display portion, 8003: speaker, 8101: housing, 8102: housing, 8103: display portion, 8104: display portion, 8105: microphone, 8106: speaker, 8107: operation key, 8108: stylus, 8111: housing, 8112: display portion, 8113: keyboard, 8114: pointing device.

This application is based on Japanese Patent Application serial no. 2016-149291 filed with Japan Patent Office on Jul. 29, 2016, the entire contents of which are hereby incorporated by reference.

The invention claimed is:

1. A display device comprising a plurality of pixels, each pixel comprising:
   a reflective display element;
   a light-emitting element over the reflective display element;
   a first transistor electrically connected to the reflective display element; and
   a second transistor electrically connected to the light-emitting element,
   wherein the light-emitting element is provided closer to a display surface of the display device than the reflective display element,
   wherein a part of the first transistor is overlapped with a part of the second transistor,
   wherein the reflective display element comprises a unit configured to adjust an amount of light, the unit changing its arrangement based on electric power supplied from an electrode, and
   wherein the reflective display element is configured to change an intensity of reflected light by partially blocking the light with the unit.

2. The display device according to claim 1,
   wherein the plurality of pixels includes at least a first pixel, a second pixel, and a third pixel,
   wherein the first pixel comprises an electrophoretic particle colored in a first color,
   wherein the second pixel comprises an electrophoretic particle colored in a second color,
   wherein the third pixel comprises an electrophoretic particle colored in a third color,
   wherein the second color is different from the first color, and
   wherein the third color is different from the first color and the second color.

3. The display device according to claim 1,
   wherein the plurality of pixels includes at least a first pixel, a second pixel, and a third pixel,
   wherein the first pixel comprises a solution colored in a first color,
   wherein the second pixel comprises a solution colored in a second color,
   wherein the third pixel comprises a solution colored in a third color,
   wherein the second color is different from the first color, and
   wherein the third color is different from the first color and the second color.

4. The display device according to claim 1,
wherein the unit comprises:
a light-reflective layer; and
a semi-transmissive layer over the light-reflective layer,
wherein a distance between the semi-transmissive layer and the light-reflective layer is changed by an electrical or magnetic effect, and
wherein the semi-transmissive layer comprises a region between the light-reflective layer and the light-emitting element.

5. The display device according to claim 1,
wherein the light-emitting element is capable of transmitting visible light, and
wherein the reflective display element is configured to reflect light that has passed through the light-emitting element.

6. The display device according to claim 1,
wherein the unit comprises:
a light-reflective layer; and
a shutter over the light-reflective layer, and
wherein the shutter and the light-reflective layer overlap with each other.

7. The display device according to claim 6,
wherein the light-emitting element is capable of transmitting visible light, and
wherein the light-reflective layer is configured to reflect light that has passed through the light-emitting element.

8. The display device according to claim 1, further comprising:
at least one coloring film,
wherein the coloring film comprises at least a region provided between the reflective display element and the light-emitting element.

9. The display device according to claim 1, further comprising:
at least one coloring film,
wherein the light-emitting element comprises at least a region provided between the coloring film and the reflective display element.

10. A semiconductor device comprising:
at least one of a keyboard, a hardware button, a pointing device, a touch sensor, an illuminance sensor, an imaging device, an audio input device, a viewpoint input device, and a pose detection device, and
the display device according to claim 1.

11. The display device according to claim 1, wherein the light-emitting element includes an organic light-emitting material.

12. The display device according to claim 1,
wherein the unit includes a plurality of microcapsules, and
wherein each of the plurality of microcapsules comprises a plurality of electrophoretic particles.

13. A display device comprising a plurality of pixels, each pixel comprising:
a reflective display element;
a light-emitting element over the reflective display element;
a first transistor electrically connected to the reflective display element; and
a second transistor electrically connected to the light-emitting element,
wherein the light-emitting element is provided closer to a display surface of the display device than the reflective display element,
wherein the first transistor and the second transistor are provided between the reflective display element and the light-emitting element,
wherein the reflective display element comprises a unit configured to adjust an amount of light, the unit changing its arrangement based on electric power supplied from an electrode, and
wherein the reflective display element is configured to change an intensity of reflected light by partially blocking the light with the unit.

14. A display device comprising a plurality of pixels, each pixel comprising:
a reflective display element;
a light-emitting element overlapping with the reflective display element;
a first transistor electrically connected to the reflective display element; and
a second transistor electrically connected to the light-emitting element,
wherein the light-emitting element is provided closer to a display surface of the display device than the reflective display element,
wherein the first transistor and the second transistor are provided between the reflective display element and the light-emitting element,
wherein the reflective display element comprises:
a light-reflective layer; and
a layer configured to adjust an amount of light, the layer being provided over the light-reflective layer, and
wherein the reflective display element is configured to change an intensity of light reflected by the light-reflective layer using the layer.

15. The display device according to claim 14,
wherein the layer includes a plurality of microcapsules, and
wherein each of the plurality of microcapsules comprises a plurality of electrophoretic particles.

16. The display device according to claim 14,
wherein the plurality of pixels includes at least a first pixel, a second pixel, and a third pixel,
wherein the first pixel comprises an electrophoretic particle colored in a first color,
wherein the second pixel comprises an electrophoretic particle colored in a second color,
wherein the third pixel comprises an electrophoretic particle colored in a third color,
wherein the second color is different from the first color, and
wherein the third color is different from the first color and the second color.

17. The display device according to claim 14,
wherein the plurality of pixels includes at least a first pixel, a second pixel, and a third pixel,
wherein the first pixel comprises a solution colored in a first color,
wherein the second pixel comprises a solution colored in a second color,
wherein the third pixel comprises a solution colored in a third color,
wherein the second color is different from the first color, and
wherein the third color is different from the first color and the second color.

18. The display device according to claim 14, wherein the layer comprises a semi-transmissive layer over the light-reflective layer, wherein a distance between the semi-transmissive layer and the light-reflective layer is changed by an electrical or magnetic effect, and wherein the semi-transmissive layer comprises a region between the light-reflective layer and the light-emitting element.

19. The display device according to claim 14, wherein the light-emitting element is capable of transmitting visible light, and wherein the light-reflective layer is configured to reflect light that has passed through the light-emitting element.

20. The display device according to claim 14, wherein the layer comprises a shutter, and wherein the shutter and the light-reflective layer overlap with each other.

21. The display device according to claim 14, further comprising:

at least one coloring film, wherein the coloring film comprises at least a region provided between the reflective display element and the light-emitting element.

22. The display device according to claim 14, further comprising:

at least one coloring film, wherein the light-emitting element comprises at least a region provided between the coloring film and the reflective display element.

23. The display device according to claim 14, wherein the light-emitting element includes an organic light-emitting material.

24. A semiconductor device comprising:

at least one of a keyboard, a hardware button, a pointing device, a touch sensor, an illuminance sensor, an imaging device, an audio input device, a viewpoint input device, and a pose detection device, and the display device according to claim 14.

25. A display device comprising a plurality of pixels, each pixel comprising:

a reflective display element;

a light-emitting element overlapping with the reflective display element;

a first transistor electrically connected to the reflective display element; and a second transistor electrically connected to the light-emitting element, wherein the light-emitting element is provided closer to a display surface of the display device than the reflective display element, wherein a part of the first transistor is overlapped with a part of the second transistor, wherein the reflective display element comprises:

a light-reflective layer; and a layer configured to adjust an amount of light, the layer being provided over the light-reflective layer, and wherein the reflective display element is configured to change an intensity of light reflected by the light-reflective layer using the layer.

* * * * *